US011174197B2

(12) United States Patent
Dejneka et al.

(10) Patent No.: US 11,174,197 B2
(45) Date of Patent: *Nov. 16, 2021

(54) GLASS-BASED ARTICLES INCLUDING A METAL OXIDE CONCENTRATION GRADIENT

(71) Applicant: CORNING INCORPORATED, Corning, NY (US)

(72) Inventors: Matthew John Dejneka, Corning, NY (US); Sinue Gomez, Corning, NY (US); Guangli Hu, Berkeley Heights, NJ (US); Charlene Marie Smith, Corning, NY (US); Zhongzhi Tang, Shenzhen (CN); Steven Alvin Tietje, Lindley, NY (US)

(73) Assignee: Corning Incorporated, Corning, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/025,592

(22) Filed: Sep. 18, 2020

(65) Prior Publication Data

US 2021/0002168 A1 Jan. 7, 2021

Related U.S. Application Data

(60) Continuation of application No. 16/797,638, filed on Feb. 21, 2020, which is a division of application No.
(Continued)

(51) Int. Cl.
*B32B 17/00* (2006.01)
*C03C 21/00* (2006.01)
(Continued)

(52) U.S. Cl.
CPC ............ *C03C 21/002* (2013.01); *C03C 3/091* (2013.01); *C03C 3/093* (2013.01); *C03C 3/097* (2013.01);
(Continued)

(58) Field of Classification Search
CPC ......... C03C 3/076; C03C 3/091; C03C 3/097; C03C 21/002; H05K 5/0017; H05K 5/03
See application file for complete search history.

(56) References Cited

U.S. PATENT DOCUMENTS 1,960,121 A 5/1934 Moulton
3,107,196 A 10/1963 Acloque
(Continued)

FOREIGN PATENT DOCUMENTS

AU 6452265 A 10/1965
AU 2011212982 A1 8/2012
(Continued)

OTHER PUBLICATIONS

European Patent Application No. 15784527.2 Summons to attend oral proceedings pursuant to Rule 115(1) EPC dated Dec. 8, 2020; 22 Pages; European Patent Office.
(Continued)

*Primary Examiner* — Elizabeth E Mulvaney
(74) *Attorney, Agent, or Firm* — Jeffrey A. Schmidt

(57) ABSTRACT

A glass-based article includes an amorphous phase and a crystalline phase, and a first surface and a second surface opposing the first surface thereby defining a thickness (t) of the glass-based article. The glass-based article has a stress profile with a surface compressive stress (CS) and a maximum central tension (CT). The maximum CT is greater than or equal to 80 MPa and less than or equal to 95 MPa, and the maximum CT is positioned within the glass-based article at a range from greater than or equal to 0.4·t and less than or equal to 0.6·t. The surface CS of the glass-based article is greater than or equal to 200 MPa; and a depth of compression (DOC) is from greater than or equal to 0.14·t and less than or equal to 0.25·t.

20 Claims, 41 Drawing Sheets

Related U.S. Application Data

16/027,741, filed on Jul. 5, 2018, now Pat. No. 10,570,059, which is a division of application No. 15/482,213, filed on Apr. 7, 2017, now Pat. No. 10,017,417.

(60) Provisional application No. 62/366,338, filed on Jul. 25, 2016, provisional application No. 62/320,077, filed on Apr. 8, 2016.

(51) Int. Cl.
*C03C 3/091* (2006.01)
*C03C 3/093* (2006.01)
*C03C 3/097* (2006.01)
*C03C 10/00* (2006.01)
*H05K 5/00* (2006.01)
*H05K 5/03* (2006.01)

(52) U.S. Cl.
CPC ....... *C03C 10/0027* (2013.01); *H05K 5/0017* (2013.01); *H05K 5/03* (2013.01)

(56) References Cited

U.S. PATENT DOCUMENTS

| | | |
|---|---|---|
| 3,357,876 A | 12/1967 | Rinehart |
| 3,380,818 A | 4/1968 | Smith |
| 3,404,015 A | 10/1968 | Dumbaugh, Jr. |
| 3,410,673 A | 11/1968 | Marusak |
| 3,433,611 A | 3/1969 | Saunders et al. |
| 3,464,880 A | 9/1969 | Rinehart |
| 3,489,097 A | 1/1970 | Gemeinhardt |
| 3,490,984 A | 1/1970 | Petticrew et al. |
| 3,625,718 A | 12/1971 | Petticrew |
| 3,639,198 A | 2/1972 | Plumat et al. |
| 3,656,923 A | 4/1972 | Garfinkel et al. |
| 3,660,060 A | 5/1972 | Spanoudis |
| 3,673,049 A | 6/1972 | Giffen et al. |
| 3,737,294 A | 6/1973 | Dumbaugh et al. |
| 3,746,526 A | 7/1973 | Giffon |
| 3,765,855 A | 10/1973 | Larrick |
| 3,798,013 A | 3/1974 | Hasegawa et al. |
| 3,811,855 A | 5/1974 | Stockdale et al. |
| 3,844,754 A | 10/1974 | Grubb et al. |
| 3,879,183 A | 4/1975 | Carlson |
| 3,907,577 A | 9/1975 | Kiefer et al. |
| 3,931,438 A | 1/1976 | Beall et al. |
| 3,936,287 A | 2/1976 | Beall et al. |
| 3,958,052 A | 5/1976 | Galusha et al. |
| 3,959,000 A | 5/1976 | Nakagawa et al. |
| 4,042,405 A | 8/1977 | Krohn et al. |
| 4,053,679 A | 10/1977 | Rinehart |
| 4,055,703 A | 10/1977 | Rinehart |
| 4,102,664 A | 7/1978 | Dumbaugh, Jr. |
| 4,130,437 A | 12/1978 | Mazeau et al. |
| 4,148,661 A | 4/1979 | Kerko et al. |
| 4,156,755 A | 5/1979 | Rinehart |
| 4,190,451 A | 2/1980 | Hares et al. |
| 4,192,688 A | 3/1980 | Babcock |
| 4,214,886 A | 7/1980 | Shay et al. |
| 4,240,836 A | 12/1980 | Borrelli et al. |
| 4,242,117 A | 12/1980 | Van Ass |
| 4,358,542 A | 11/1982 | Hares et al. |
| 4,407,966 A | 10/1983 | Kerko et al. |
| 4,468,534 A | 8/1984 | Boddicker |
| 4,471,024 A | 9/1984 | Pargamin et al. |
| 4,483,700 A | 11/1984 | Forker et al. |
| 4,537,612 A | 8/1985 | Borrelli et al. |
| 4,608,349 A | 8/1986 | Kerko et al. |
| 4,702,042 A | 10/1987 | Herrington et al. |
| 4,726,981 A | 2/1988 | Pierson et al. |
| 4,757,162 A | 7/1988 | Dumora et al. |
| 4,857,485 A | 8/1989 | Brennan et al. |
| 5,270,269 A | 12/1993 | Hares et al. |
| 5,273,827 A | 12/1993 | Francis |
| 5,322,819 A | 6/1994 | Araujo et al. |
| 5,342,426 A | 8/1994 | Dumbaugh, Jr. |
| 5,350,607 A | 9/1994 | Tyson et al. |
| 5,559,060 A | 9/1996 | Dumbaugh et al. |
| 5,763,343 A | 6/1998 | Brix et al. |
| 5,773,148 A | 6/1998 | Charrue et al. |
| 5,804,317 A | 9/1998 | Charrue |
| 5,895,768 A | 4/1999 | Speit |
| 5,972,460 A | 10/1999 | Tachiwana |
| 6,111,821 A | 8/2000 | Bach |
| 6,187,441 B1 | 2/2001 | Takeuchi et al. |
| 6,333,286 B1 | 12/2001 | Kurachi et al. |
| 6,376,402 B1 | 4/2002 | Pannhorst et al. |
| 6,413,892 B1 | 7/2002 | Koyama et al. |
| 6,440,531 B1 | 8/2002 | Kurachi et al. |
| 6,472,068 B1 | 10/2002 | Glass et al. |
| 6,514,149 B2 | 2/2003 | Yoon |
| 6,516,634 B1 | 2/2003 | Green et al. |
| 6,518,211 B1 | 2/2003 | Bradshaw et al. |
| 6,528,440 B1 | 3/2003 | Vilato et al. |
| 6,537,938 B1 | 3/2003 | Miyazaki |
| 6,607,999 B2 | 8/2003 | Hachitani |
| 6,689,704 B2 | 2/2004 | Ota et al. |
| 6,846,760 B2 | 1/2005 | Siebers et al. |
| 7,007,512 B2 | 3/2006 | Kamada et al. |
| 7,091,141 B2 | 8/2006 | Horsfall et al. |
| 7,176,528 B2 | 2/2007 | Couillard et al. |
| 7,476,633 B2 | 1/2009 | Comte et al. |
| 7,514,149 B2 | 4/2009 | Bocko et al. |
| 7,531,475 B2 | 5/2009 | Kishimoto et al. |
| 7,619,283 B2 | 11/2009 | Gadkaree |
| 7,666,511 B2 | 2/2010 | Ellison et al. |
| 7,687,419 B2 | 3/2010 | Kawai |
| 7,727,917 B2 | 6/2010 | Shelestak et al. |
| 7,838,136 B2 | 11/2010 | Nakashima et al. |
| 7,891,212 B2 | 2/2011 | Isono |
| 8,007,913 B2 | 8/2011 | Coppola et al. |
| 8,075,999 B2 | 12/2011 | Barefoot et al. |
| 8,099,982 B2 | 1/2012 | Takagi et al. |
| 8,143,179 B2 | 3/2012 | Aitken et al. |
| 8,158,543 B2 | 4/2012 | Dejneka et al. |
| 8,193,128 B2 | 6/2012 | Hellmann et al. |
| 8,232,218 B2 | 7/2012 | Dejneka et al. |
| 8,252,708 B2 | 8/2012 | Morena et al. |
| 8,312,739 B2 | 11/2012 | Lee et al. |
| 8,312,789 B2 | 11/2012 | Beck |
| 8,327,666 B2 | 12/2012 | Harvey et al. |
| 8,347,651 B2 | 1/2013 | Abramov et al. |
| 8,349,455 B2 | 1/2013 | Kondo et al. |
| 8,415,013 B2 | 4/2013 | Barefoot et al. |
| 8,431,502 B2 | 4/2013 | Dejneka et al. |
| 8,561,429 B2 | 10/2013 | Allan et al. |
| 8,580,411 B2 | 11/2013 | Endo et al. |
| 8,586,492 B2 | 11/2013 | Barefoot et al. |
| 8,623,776 B2 | 1/2014 | Dejneka et al. |
| 8,652,978 B2 | 2/2014 | Dejneka et al. |
| 8,656,734 B2 | 2/2014 | Zou et al. |
| 8,691,711 B2 | 4/2014 | Nakashima et al. |
| 8,697,592 B2 | 4/2014 | Ikenishi et al. |
| 8,713,972 B2 | 5/2014 | Lakota et al. |
| 8,756,262 B2 | 6/2014 | Zhang |
| 8,759,238 B2 | 6/2014 | Chapman et al. |
| 8,765,262 B2 | 7/2014 | Gross |
| 8,778,820 B2 | 7/2014 | Gomez et al. |
| 8,783,063 B2 | 7/2014 | Osakabe et al. |
| 8,802,581 B2 | 8/2014 | Dejneka et al. |
| 8,854,623 B2 | 10/2014 | Fontaine et al. |
| 8,932,510 B2 | 1/2015 | Li et al. |
| 8,943,855 B2 | 2/2015 | Gomez et al. |
| 8,946,103 B2 | 2/2015 | Dejneka et al. |
| 8,950,215 B2 | 2/2015 | Rappoport et al. |
| 8,951,927 B2 | 2/2015 | Dejneka et al. |
| 8,957,374 B2 | 2/2015 | Liu et al. |
| 8,969,226 B2 | 3/2015 | Dejneka et al. |
| 8,975,374 B2 | 3/2015 | Kimura |
| 9,003,835 B2 | 4/2015 | Lock |
| 9,007,878 B2 | 4/2015 | Matsumoto et al. |
| 9,139,469 B2 | 9/2015 | Comte et al. |
| 9,140,543 B1 | 9/2015 | Allan et al. |

(56) References Cited

U.S. PATENT DOCUMENTS

| | | |
|---|---|---|
| 9,145,329 B2 | 9/2015 | Drake et al. |
| 9,156,724 B2 | 10/2015 | Gross |
| 9,193,625 B2 | 11/2015 | Bookbinder et al. |
| 9,212,288 B2 | 12/2015 | Fujiwara et al. |
| 9,272,945 B2 | 3/2016 | Smith |
| 9,290,407 B2 | 3/2016 | Barefoot et al. |
| 9,290,413 B2 | 3/2016 | Dejneka et al. |
| 9,346,703 B2 | 5/2016 | Bookbinder et al. |
| 9,359,251 B2 | 6/2016 | Bookbinder et al. |
| 9,487,434 B2 | 11/2016 | Amin et al. |
| 9,498,822 B2 | 11/2016 | Brandt et al. |
| 9,499,431 B2 | 11/2016 | Barefoot et al. |
| 9,593,042 B2 | 3/2017 | Hu et al. |
| 9,604,876 B2 | 3/2017 | Gy et al. |
| 9,701,569 B2 | 7/2017 | Demartino et al. |
| 9,751,802 B2 | 9/2017 | Allan et al. |
| 9,908,811 B2 | 3/2018 | Gross et al. |
| 9,977,470 B2 | 5/2018 | Demartino et al. |
| 10,017,417 B2 | 7/2018 | Dejneka et al. |
| 10,144,670 B2 | 12/2018 | Akatsuka et al. |
| 10,160,688 B2 | 12/2018 | Amin et al. |
| 10,239,784 B2 | 3/2019 | Oram et al. |
| 10,570,059 B2 * | 2/2020 | Dejneka .................. C03C 3/091 |
| 10,579,106 B2 | 3/2020 | Demartino et al. |
| 2002/0023463 A1 | 2/2002 | Siebers et al. |
| 2005/0090377 A1 | 4/2005 | Shelestak et al. |
| 2005/0099618 A1 | 5/2005 | Difoggio et al. |
| 2005/0221044 A1 | 10/2005 | Gaume et al. |
| 2005/0250639 A1 | 11/2005 | Siebers et al. |
| 2006/0127679 A1 | 6/2006 | Gulati et al. |
| 2006/0279217 A1 | 12/2006 | Peuchert et al. |
| 2007/0060465 A1 | 3/2007 | Varshneya et al. |
| 2007/0122580 A1 | 5/2007 | Krall et al. |
| 2007/0123410 A1 | 5/2007 | Morena et al. |
| 2007/0218262 A1 | 9/2007 | Degand et al. |
| 2008/0026927 A1 | 1/2008 | Monique Comte |
| 2008/0128953 A1 | 6/2008 | Nagai et al. |
| 2008/0241603 A1 | 10/2008 | Isono |
| 2008/0286548 A1 | 11/2008 | Ellison et al. |
| 2009/0142568 A1 | 6/2009 | Dejneka et al. |
| 2009/0197088 A1 | 8/2009 | Murata |
| 2009/0215607 A1 | 8/2009 | Dejneka et al. |
| 2009/0220761 A1 | 9/2009 | Dejneka et al. |
| 2009/0286091 A1 | 11/2009 | Danielson et al. |
| 2010/0009154 A1 | 1/2010 | Allan et al. |
| 2010/0028607 A1 | 2/2010 | Lee et al. |
| 2010/0029460 A1 | 2/2010 | Shojiya et al. |
| 2010/0035038 A1 | 2/2010 | Barefoot et al. |
| 2010/0035745 A1 | 2/2010 | Murata |
| 2010/0087307 A1 | 4/2010 | Murata et al. |
| 2010/0112341 A1 | 5/2010 | Takagi et al. |
| 2010/0119846 A1 | 5/2010 | Sawada |
| 2010/0190038 A1 | 7/2010 | Osakabe et al. |
| 2010/0200804 A1 | 8/2010 | Woodruff et al. |
| 2010/0210442 A1 | 8/2010 | Abramov et al. |
| 2010/0215996 A1 | 8/2010 | Wendling et al. |
| 2010/0291353 A1 | 11/2010 | Dejneka et al. |
| 2010/0326657 A1 | 12/2010 | Hellmann et al. |
| 2011/0014475 A1 | 1/2011 | Murata |
| 2011/0064951 A1 | 3/2011 | Fujiwara et al. |
| 2011/0067447 A1 | 3/2011 | Zadesky et al. |
| 2011/0092353 A1 | 4/2011 | Amin et al. |
| 2011/0165393 A1 | 7/2011 | Bayne et al. |
| 2011/0201490 A1 | 8/2011 | Barefoot et al. |
| 2011/0226832 A1 | 9/2011 | Bayne et al. |
| 2011/0281093 A1 | 11/2011 | Gulati et al. |
| 2011/0293942 A1 | 12/2011 | Cornejo et al. |
| 2011/0294648 A1 | 12/2011 | Chapman et al. |
| 2011/0294649 A1 | 12/2011 | Gomez et al. |
| 2011/0312483 A1 | 12/2011 | Nakashima et al. |
| 2012/0015150 A1 | 1/2012 | Suzuki |
| 2012/0021898 A1 | 1/2012 | Elam et al. |
| 2012/0040146 A1 | 2/2012 | Garner et al. |
| 2012/0048604 A1 | 3/2012 | Cornejo et al. |
| 2012/0052271 A1 | 3/2012 | Gomez et al. |
| 2012/0052275 A1 | 3/2012 | Hashimoto et al. |
| 2012/0083401 A1 | 4/2012 | Koyama et al. |
| 2012/0114955 A1 | 5/2012 | Almoric et al. |
| 2012/0135153 A1 | 5/2012 | Osakabe et al. |
| 2012/0135226 A1 | 5/2012 | Bookbinder et al. |
| 2012/0135848 A1 | 5/2012 | Beall et al. |
| 2012/0171497 A1 | 7/2012 | Koyama et al. |
| 2012/0189843 A1 | 7/2012 | Chang et al. |
| 2012/0194974 A1 | 8/2012 | Weber et al. |
| 2012/0196110 A1 | 8/2012 | Murata et al. |
| 2012/0216565 A1 | 8/2012 | Allan et al. |
| 2012/0216569 A1 | 8/2012 | Allan et al. |
| 2012/0219792 A1 | 8/2012 | Yamamoto et al. |
| 2012/0236526 A1 | 9/2012 | Weber |
| 2012/0264585 A1 | 10/2012 | Ohara et al. |
| 2012/0297829 A1 | 11/2012 | Endo et al. |
| 2012/0308827 A1 | 12/2012 | Boek et al. |
| 2012/0321898 A1 | 12/2012 | Meinhardt et al. |
| 2013/0004758 A1 | 1/2013 | Dejneka et al. |
| 2013/0007458 A1 | 1/2013 | Wakita et al. |
| 2013/0017380 A1 | 1/2013 | Murata et al. |
| 2013/0045375 A1 | 2/2013 | Gross |
| 2013/0050992 A1 | 2/2013 | Schneider et al. |
| 2013/0101596 A1 | 4/2013 | Demartino et al. |
| 2013/0101798 A1 | 4/2013 | Hashimoto |
| 2013/0122260 A1 | 5/2013 | Liang |
| 2013/0122284 A1 | 5/2013 | Gross |
| 2013/0183512 A1 | 7/2013 | Gy et al. |
| 2013/0186139 A1 | 7/2013 | Tanii |
| 2013/0189486 A1 | 7/2013 | Wang et al. |
| 2013/0202868 A1 | 8/2013 | Barefoot et al. |
| 2013/0203583 A1 | 8/2013 | Zhang et al. |
| 2013/0219966 A1 | 8/2013 | Hasegawa et al. |
| 2013/0224492 A1 | 8/2013 | Bookbinder et al. |
| 2013/0236666 A1 | 9/2013 | Bookbinder et al. |
| 2013/0236699 A1 | 9/2013 | Prest et al. |
| 2013/0240025 A1 | 9/2013 | Bersano et al. |
| 2013/0260154 A1 | 10/2013 | Allan et al. |
| 2013/0274085 A1 | 10/2013 | Beall et al. |
| 2013/0288001 A1 | 10/2013 | Murata et al. |
| 2013/0288010 A1 | 10/2013 | Akarapu et al. |
| 2013/0309613 A1 | 11/2013 | O'Malley et al. |
| 2013/0323444 A1 | 12/2013 | Ehemann et al. |
| 2014/0050911 A1 | 2/2014 | Mauro et al. |
| 2014/0063393 A1 | 3/2014 | Zhong et al. |
| 2014/0087159 A1 | 3/2014 | Cleary et al. |
| 2014/0087193 A1 | 3/2014 | Cites et al. |
| 2014/0087194 A1 | 3/2014 | Dejneka et al. |
| 2014/0090864 A1 | 4/2014 | Paulson |
| 2014/0092377 A1 | 4/2014 | Liu et al. |
| 2014/0093702 A1 | 4/2014 | Kitajima |
| 2014/0106141 A1 | 4/2014 | Bellman et al. |
| 2014/0106172 A1 | 4/2014 | Dejneka et al. |
| 2014/0109616 A1 | 4/2014 | Varshneya |
| 2014/0113141 A1 | 4/2014 | Yamamoto et al. |
| 2014/0134397 A1 | 5/2014 | Amin et al. |
| 2014/0139978 A1 | 5/2014 | Kwong |
| 2014/0141226 A1 | 5/2014 | Bookbinder et al. |
| 2014/0147576 A1 | 5/2014 | Lewis et al. |
| 2014/0150525 A1 | 6/2014 | Okawa et al. |
| 2014/0151370 A1 | 6/2014 | Chang et al. |
| 2014/0154661 A1 | 6/2014 | Bookbinder et al. |
| 2014/0170380 A1 | 6/2014 | Murata et al. |
| 2014/0193606 A1 | 7/2014 | Kwong |
| 2014/0220327 A1 | 8/2014 | Adib et al. |
| 2014/0227523 A1 | 8/2014 | Dejneka et al. |
| 2014/0227524 A1 | 8/2014 | Ellison et al. |
| 2014/0227525 A1 | 8/2014 | Matsuda et al. |
| 2014/0248495 A1 | 9/2014 | Matsuda et al. |
| 2014/0308526 A1 | 10/2014 | Chapman et al. |
| 2014/0321124 A1 | 10/2014 | Schneider et al. |
| 2014/0329660 A1 | 11/2014 | Barefoot et al. |
| 2014/0335330 A1 | 11/2014 | Bellman et al. |
| 2014/0356576 A1 | 12/2014 | Dejneka et al. |
| 2014/0356605 A1 | 12/2014 | Adib et al. |
| 2014/0364298 A1 | 12/2014 | Ohara et al. |
| 2014/0370264 A1 | 12/2014 | Ohara et al. |
| 2014/0370302 A1 | 12/2014 | Amin et al. |
| 2015/0004390 A1 | 1/2015 | Kawamoto et al. |

(56) References Cited

U.S. PATENT DOCUMENTS

| | | | |
|---|---|---|---|
| 2015/0011811 A1 | 1/2015 | Pavone et al. |
| 2015/0027169 A1 | 1/2015 | Fredholm |
| 2015/0030834 A1 | 1/2015 | Morey et al. |
| 2015/0030838 A1 | 1/2015 | Sellier et al. |
| 2015/0037543 A1 | 2/2015 | Keegan et al. |
| 2015/0037586 A1 | 2/2015 | Gross |
| 2015/0044473 A1 | 2/2015 | Murata et al. |
| 2015/0052949 A1 | 2/2015 | Bayne et al. |
| 2015/0060401 A1 | 3/2015 | Chang et al. |
| 2015/0064472 A1 | 3/2015 | Gross et al. |
| 2015/0064474 A1 | 3/2015 | Dejneka et al. |
| 2015/0074974 A1 | 3/2015 | Pesansky et al. |
| 2015/0079398 A1 | 3/2015 | Amin et al. |
| 2015/0093581 A1 | 4/2015 | Murata et al. |
| 2015/0111030 A1 | 4/2015 | Miyasaka et al. |
| 2015/0132563 A1 | 5/2015 | O'Malley et al. |
| 2015/0140325 A1 | 5/2015 | Gross et al. |
| 2015/0144291 A1 | 5/2015 | Brandt et al. |
| 2015/0147574 A1 | 5/2015 | Allan et al. |
| 2015/0147575 A1 | 5/2015 | Dejneka et al. |
| 2015/0147576 A1 | 5/2015 | Bookbinder et al. |
| 2015/0152003 A1 | 6/2015 | Kawamoto et al. |
| 2015/0157533 A1 | 6/2015 | Demartino et al. |
| 2015/0166401 A1 | 6/2015 | Yamamoto |
| 2015/0166407 A1 | 6/2015 | Varshneya et al. |
| 2015/0175469 A1 | 6/2015 | Tabe |
| 2015/0183680 A1 | 7/2015 | Barefoot et al. |
| 2015/0239775 A1 | 8/2015 | Amin et al. |
| 2015/0239776 A1 | 8/2015 | Amin et al. |
| 2015/0251947 A1 | 9/2015 | Lestrigant et al. |
| 2015/0259244 A1 | 9/2015 | Amin et al. |
| 2015/0261363 A1 | 9/2015 | Shah et al. |
| 2015/0274585 A1 | 10/2015 | Rogers et al. |
| 2015/0329413 A1 | 11/2015 | Beall et al. |
| 2015/0329418 A1 | 11/2015 | Murata et al. |
| 2015/0368148 A1 | 12/2015 | Duffy et al. |
| 2015/0368153 A1 | 12/2015 | Pesansky et al. |
| 2016/0083291 A1 | 3/2016 | Dogimont et al. |
| 2016/0102011 A1 | 4/2016 | Hu et al. |
| 2016/0102014 A1 | 4/2016 | Hu et al. |
| 2016/0107924 A1 | 4/2016 | Yamamoto et al. |
| 2016/0122239 A1 | 5/2016 | Amin et al. |
| 2016/0122240 A1 | 5/2016 | Oram et al. |
| 2016/0187994 A1 | 6/2016 | La et al. |
| 2016/0318796 A1 | 11/2016 | Masuda |
| 2017/0022093 A1 | 1/2017 | Demartino et al. |
| 2017/0158556 A1 | 6/2017 | Dejneka et al. |
| 2017/0166478 A1 | 6/2017 | Gross et al. |
| 2017/0197869 A1 | 7/2017 | Beall et al. |
| 2017/0197870 A1 | 7/2017 | Finkeldey et al. |
| 2017/0291849 A1 | 10/2017 | Dejneka et al. |
| 2017/0295657 A1 | 10/2017 | Gross et al. |
| 2017/0305786 A1 | 10/2017 | Roussev et al. |
| 2019/0208652 A1 | 7/2019 | Gross et al. |

FOREIGN PATENT DOCUMENTS

| | | |
|---|---|---|
| CN | 1312582 A | 9/2001 |
| CN | 1693247 A | 11/2005 |
| CN | 1759074 A | 4/2006 |
| CN | 1886348 A | 12/2006 |
| CN | 101316799 A | 12/2008 |
| CN | 101578240 A | 11/2009 |
| CN | 101583576 A | 11/2009 |
| CN | 101679106 A | 3/2010 |
| CN | 101689376 A | 3/2010 |
| CN | 102026929 A | 4/2011 |
| CN | 102089252 A | 6/2011 |
| CN | 102131740 A | 7/2011 |
| CN | 102149649 A | 8/2011 |
| CN | 102363567 A | 2/2012 |
| CN | 102393289 A | 3/2012 |
| CN | 102531384 A | 7/2012 |
| CN | 102690059 A | 9/2012 |
| CN | 102791646 A | 11/2012 |
| CN | 102815860 A | 12/2012 |
| CN | 102887650 A | 1/2013 |
| CN | 102898022 A | 1/2013 |
| CN | 102958855 A | 3/2013 |
| CN | 103058506 A | 4/2013 |
| CN | 103058507 A | 4/2013 |
| CN | 103068759 A | 4/2013 |
| CN | 103097319 A | 5/2013 |
| CN | 103282318 A | 9/2013 |
| CN | 103338926 A | 10/2013 |
| CN | 103569015 A | 2/2014 |
| CN | 103648996 A | 3/2014 |
| CN | 103946166 A | 7/2014 |
| CN | 104379522 A | 2/2015 |
| CN | 104736496 A | 6/2015 |
| CN | 105753314 A | 7/2016 |
| CN | 108046589 A | 5/2018 |
| EP | 0132751 A1 | 2/1985 |
| EP | 0163873 A1 | 12/1985 |
| EP | 0700879 A1 | 3/1996 |
| EP | 0931028 A1 | 7/1999 |
| EP | 1291631 A1 | 3/2003 |
| EP | 1314704 A1 | 5/2003 |
| EP | 1593658 A1 | 11/2005 |
| EP | 2263979 A1 | 12/2010 |
| EP | 2397449 A1 | 12/2011 |
| EP | 2415724 A1 | 2/2012 |
| EP | 2531459 A2 | 12/2012 |
| EP | 2540682 A1 | 1/2013 |
| EP | 2594536 A1 | 5/2013 |
| EP | 2609047 A1 | 7/2013 |
| EP | 2646243 A1 | 10/2013 |
| EP | 2666756 A1 | 11/2013 |
| EP | 2695734 A1 | 2/2014 |
| EP | 2736855 | 6/2014 |
| EP | 2762459 A1 | 8/2014 |
| EP | 2762460 A1 | 8/2014 |
| EP | 3204338 A2 | 8/2017 |
| GB | 1012367 A | 12/1965 |
| GB | 1026770 A | 4/1966 |
| GB | 1089912 A | 11/1967 |
| GB | 1334828 A | 10/1973 |
| JP | 47-004192 U | 9/1972 |
| JP | 54-083923 A | 7/1979 |
| JP | 62-187140 A | 8/1987 |
| JP | 02-293345 A | 12/1990 |
| JP | 07-263318 A | 10/1995 |
| JP | 11-328601 A | 11/1999 |
| JP | 2000-203872 A | 7/2000 |
| JP | 2000-327365 A | 11/2000 |
| JP | 2001-076336 A | 3/2001 |
| JP | 2001-354446 A | 12/2001 |
| JP | 2002-115071 A | 4/2002 |
| JP | 2002-174810 A | 6/2002 |
| JP | 2002-358626 A | 12/2002 |
| JP | 2003-505327 A | 2/2003 |
| JP | 2003-283028 A | 10/2003 |
| JP | 2004-099370 A | 4/2004 |
| JP | 2004-259402 A | 9/2004 |
| JP | 2005-062592 A | 3/2005 |
| JP | 2005-139031 A | 6/2005 |
| JP | 2005-519997 A | 7/2005 |
| JP | 2005-206406 A | 8/2005 |
| JP | 2005-289683 A | 10/2005 |
| JP | 2005-289685 A | 10/2005 |
| JP | 2005-320234 A | 11/2005 |
| JP | 2006-228431 A | 8/2006 |
| JP | 2007-527354 A | 9/2007 |
| JP | 2007-252589 A | 10/2007 |
| JP | 2007-255139 A | 10/2007 |
| JP | 2007-255319 A | 10/2007 |
| JP | 2007-314521 A | 12/2007 |
| JP | 2008-007384 A | 1/2008 |
| JP | 2008-094713 A | 4/2008 |
| JP | 2008-115071 A | 5/2008 |
| JP | 2009-084076 A | 4/2009 |
| JP | 2009-099239 A | 5/2009 |
| JP | 2009-107878 A | 5/2009 |
| JP | 2009-274902 A | 11/2009 |

(56) References Cited

FOREIGN PATENT DOCUMENTS

| | | |
|---|---|---|
| JP | 2010-202514 A | 9/2010 |
| JP | 2011-057504 A | 3/2011 |
| JP | 2011-213576 A | 10/2011 |
| JP | 2011-527661 | 11/2011 |
| JP | 2011-530470 A | 12/2011 |
| JP | 2012-066995 A | 4/2012 |
| JP | 2012-232882 A | 11/2012 |
| JP | 2013-502371 A | 1/2013 |
| JP | 2013-028512 A | 2/2013 |
| JP | 2013-518800 A | 5/2013 |
| JP | 2013-529172 A | 7/2013 |
| JP | 2013-536155 A | 9/2013 |
| JP | 2013-542159 A | 11/2013 |
| JP | 2014-501214 A | 1/2014 |
| JP | 2014-073953 A | 4/2014 |
| JP | 5483923 B2 | 5/2014 |
| JP | 2014-136751 A | 7/2014 |
| JP | 2014-141363 A | 8/2014 |
| JP | 2014-522798 A | 9/2014 |
| JP | 2015-511537 A | 4/2015 |
| KR | 10-2012-0128657 A | 11/2012 |
| KR | 10-1302664 B1 | 9/2013 |
| KR | 10-2013-0135840 A | 12/2013 |
| KR | 10-2014-0131558 A | 11/2014 |
| KR | 10-1506378 B1 | 3/2015 |
| KR | 10-2016-0080048 | 7/2016 |
| RU | 2127711 C1 | 3/1999 |
| SG | 187326 | 2/2013 |
| SU | 1677028 A1 | 9/1991 |
| TW | 200911718 A | 3/2009 |
| TW | 201040118 A | 11/2010 |
| TW | 201313635 A | 4/2013 |
| TW | 201331148 A | 8/2013 |
| TW | 201335092 A | 9/2013 |
| TW | 201350449 A | 12/2013 |
| TW | 201402490 A | 1/2014 |
| TW | 201520178 A | 6/2015 |
| WO | 99/06334 A1 | 2/1999 |
| WO | 2000/047529 A1 | 8/2000 |
| WO | 01/07374 A1 | 2/2001 |
| WO | 2005/042423 A1 | 5/2005 |
| WO | 2005/091021 A1 | 9/2005 |
| WO | 2005/093720 A1 | 10/2005 |
| WO | 2009/041348 A1 | 4/2009 |
| WO | 2009/041618 A1 | 4/2009 |
| WO | 2010/002477 A1 | 1/2010 |
| WO | 2010/005578 A1 | 1/2010 |
| WO | 2010/016928 A2 | 2/2010 |
| WO | 2010/147650 A2 | 12/2010 |
| WO | 2011/022661 A2 | 2/2011 |
| WO | 2011/041484 A1 | 4/2011 |
| WO | 2011/069338 A1 | 6/2011 |
| WO | 2011/077756 A1 | 6/2011 |
| WO | 2011/085190 A1 | 7/2011 |
| WO | 2011/097314 A2 | 8/2011 |
| WO | 2011/103798 A1 | 9/2011 |
| WO | 2011/103799 A1 | 9/2011 |
| WO | 2011/104035 A2 | 9/2011 |
| WO | 2011/149740 A1 | 12/2011 |
| WO | 2011/149811 A1 | 12/2011 |
| WO | 2011/149812 A1 | 12/2011 |
| WO | 2012/027660 A1 | 3/2012 |
| WO | 2012/074983 A1 | 6/2012 |
| WO | 2012/126394 A1 | 9/2012 |
| WO | 2013/016157 A1 | 1/2013 |
| WO | 2013/018774 A1 | 2/2013 |
| WO | 2013/027651 A1 | 2/2013 |
| WO | 2013/032890 A1 | 3/2013 |
| WO | 2013/047679 A1 | 4/2013 |
| WO | 2013/082246 A1 | 6/2013 |
| WO | 2013/088856 A1 | 6/2013 |
| WO | 2013/110721 A1 | 8/2013 |
| WO | 2013/116420 A1 | 8/2013 |
| WO | 2013/120721 A1 | 8/2013 |
| WO | 2013/130653 A2 | 9/2013 |
| WO | 2013/130665 A2 | 9/2013 |
| WO | 2013/130721 A1 | 9/2013 |
| WO | 2013/136013 A2 | 9/2013 |
| WO | 2013/184205 A1 | 12/2013 |
| WO | 2014/042244 A1 | 3/2014 |
| WO | 2014/097623 A1 | 6/2014 |
| WO | 2014/100432 A1 | 6/2014 |
| WO | 2014/175144 A1 | 10/2014 |
| WO | 2014/180679 A1 | 11/2014 |
| WO | 2015/057552 A2 | 4/2015 |
| WO | 2015/057555 A1 | 4/2015 |
| WO | 2015/077179 A1 | 5/2015 |
| WO | 2015/080043 A1 | 6/2015 |
| WO | 2015/127483 A2 | 8/2015 |
| WO | 2015/175595 A1 | 11/2015 |
| WO | 2015/195419 A2 | 12/2015 |
| WO | 2015/195465 A1 | 12/2015 |
| WO | 2016/014937 A1 | 1/2016 |
| WO | 2016/028554 A1 | 2/2016 |
| WO | 2016/057787 A2 | 4/2016 |
| WO | 2016/070048 A1 | 5/2016 |
| WO | 2016/174825 A1 | 11/2016 |
| WO | 2016/185934 A1 | 11/2016 |
| WO | 2017/030736 A1 | 2/2017 |
| WO | 2017/100646 A1 | 6/2017 |
| WO | 2017/177109 A1 | 10/2017 |
| WO | 2017/177114 A1 | 10/2017 |

OTHER PUBLICATIONS

Sglavo et al. "procedure for residual stress profile determination by curvature measurements" Mechanics of Materias, 2005, 37(8) pp. 887-898.

Oram et al; U.S. Appl. No. 14/932,411, filed Nov. 4, 2015, Titled "Deep Non-Frangible Stress Profiles and Methods of Making".

Patent Cooperation Treaty International Notification of Invitation to pay additional fees; international application No. PCT/US2015/054681: dated Dec. 14, 2015, 7 pages.

Patent Cooperation Treaty, Partial International Search Report for International Application No. PCT/US2015/054681, dated Nov. 11, 2015, 7 pages.

Peitl et al; "Thermal Shock Properties of Chemically Toughened Borosilicate Glass"; Journal of Non-Crystallin Solids, 247, (1999) pp. 39-49.

Pflitsch et al; "Sol-gel deposition of chromium doped aluminum oxide films (Ruby) for surface temperature sensor application", Chem. Mater., vol. 20, pp. 2773-2778, 2008.

Poumellec et al; "Surface topography change induced by poling in Ge doped silica glass films" ; 2003 OSA/BGPP 2003 MD 38.

Reddy et al. "Fracture Toughness Measurement of Glass and Ceramic Materials Using Chevron-Notched Specimens" J. Am. Ceram. Soc. 71 (6) C-310-C313 (1988).

Reddy, K.P.R. et al, "Fracture Toughness Measurement of Glass and Ceramic Materials Using Chevron-Notched Specimens," J. Am. Ceram. Soc., 71 [6], C-310-C-313 (1988).

Rusan et al; "A New Method for Recording Phase Optical Structures in Glasses" ; Glass Physics and Chemistry, 2010, vol. 36, No. 4, pp. 513-516.

Russian Patent Application No. 2018105921; Russian Office Action and Search Report dated Sep. 19, 2019; Russia Patent Office; 4 Pgs.

Sglavo & Green, "Flaw-insensitive ion-exchanged glass: 11, Production and mechanical performance" J. Am. Ceram. Soc. 84(8) pp. 1832-1838 (2001).

Sglavo et al. "procedure for residual stress profile determination by vurbature measurements" Mechanics of Materias, 2005, 37(8) pp. 887-898.

Shen et al; "Control of concentration profiles in two step ion exchanged glasses"; Phys. Chem. Glasses, 2003 44 (4), 284-92.

Shen et al; "Variable-temperature ion-exchanged engineered stress profile (ESP) glasses"; J. Am. Ceram. Soc., 86 [11] 1979-81 (2003).

Smedskjaer "Effect of thermal history and chemical composition on hardness of silicate glasses"; Journal of Non-Crystalline Solids 356 (2010); pp. 893-897.

(56) References Cited

OTHER PUBLICATIONS

Stosser et al "Magnetic Resonance investigation of the process of corundum formation starting from sol-gel precursors", J. Am. Ceram. Soc, vol. 88, No. 10, pp. 2913-2922, 2005.
Taiwan First Office Action and Search Report TW100143769 Tsai, Lee and Chen. dated Apr. 29, 2016, 3 Pgs.
Takagi et al; "Electrostatic Imprint Process for Glass"; Applied Physics Express 1 (20008) 024003.
Tang et al. "Methods for measurement and statistical analysis of the frangibility of strengthened glass" Frontiers in Materials, 2015 vol. 2, article 50. 8 pgs.
Tang, et al., "Automated Apparatus for Measuring the Frangibility and Fragmentation of Strengthened Glass", Experimental Mechanics (Jun. 2014) vol. 54 pp. 903-912.
Varshneya; "Fundamentals of Inorganic Glasses"; 2nd edition, Society of Glass Technology, 2006, pp. 513-521, XP002563094.
Varshneya; "Microhardness vs. Glass Composition"; Fundamentals of Inorganic Glasses; 2006; p. 208, paragraph 7.
Yong-Hwan; "Chemical Tempered Glass for Mobile Displays"; Korea Institute of Science and Technology; Date Unknown; 6 Pages.
Zheng et al; "Effect of Y2O3 addition on viscosity and crystallization of the lithium aluminosilicate glasses"; Thermochimica Acta 456 (2007) 69-74.
Zheng et al; "Structure and Properties of the Lithium Aluminosilicate Glasses with Yttria Addition"; vol. 22, No. 2 Wuhan University of Technology—(Abstract).
Zimmer, "Thin Glasses for Touch Display Technologies" Schott: glass made of ideas. Emerging Display Technologies Conference, Aug. 16-17, 2011. 17 slides.
European Patent Application No. 13709022.1 Observations by third parties dated Dec. 16, 2020; 4 Pages; European Patent Office.
Abrams et al; "Fracture behavior of engineered stress profile soda lime silicate glass"; Journal of Non-Crystalline Solids; 321, (2003) 10-19.
Aegerter et al "Sol-gel technologies for glass producers and users—Chapter 4.1.8—Scratch resistant coatings (G. Helsch and G. H. Frischat)", pp. 217-221, Kluwer Academic Publishers, 2004.
Amin et al; U.S. Appl. No. 14/926,425, filed Oct. 29, 2015, titled "Strengthened Glass With Ultra-Deep Depth of Compression".
ASTM C1279-13 "Standard Test Method for Non-Destructive Photoelastic Measurement of Edge and Surface Stresses in Annealed, Heat-Strengthened, and Fully Tempered Flat Glass".
ASTM C1422/C1422M—10 "Standard Specification for Chemically Strengthened Flat Glass".
ASTM C158-02(2012), Standard Test Methods for Strength of Glass by Flexure (Determination of Modulus of Rupture), ASTM International, West Conshohocken, PA, 2012, 9 pages.
Bahlawane "Novel sol-gel process depositing a-Al2O3 for the improvement of graphite oxidation-resistance"—Thin Solid Films, vol. 396, pp. 126-130, 2001.
Bansal et al; "Chapter 10: Elastic Properties" Handbook of Glass Properties; Elsevier; (1986) pp. 306-336.
Bansal et al; "Handbook of Glass Properties" ; Elsevier; (1986) 2 pages.
Bouyne et al; "Fragmentation of thin chemically tempered glass plates" ; Glass Technol., 2002, 43C, 300-2.
Brandt et al; "Mechanics of Ceramics, Active Materials, Nanoscale Materials, Composites, Glass, and Fundamentals"; Proceedings of the 8th International Symposium on Fracture Mechanics of Ceramics, (2003); 11 Pages.
Brunkov et al; "Submicron-Resolved Relief Formation in Poled Glasses and Glass-Metal Nanocomposites" ; Technical Physics Letters, 2008, vol. 34, No. 12 pp. 1030-1033.
Bubsey, R.T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

Chinese First Office Action CN201180057659.5 dated Dec. 24, 2014, Shanghai Patent and Trademark Office, 9 Pgs.
Chinese Patent Application No. 201611141439.1 Second Office Action dated Jun. 28, 2020; 30 Pages; Chinese Patent Office.
Chinese Patent Application No. 201810008016.5, Office Action dated Oct. 19, 2020; 20 pages (12 pages of English Translation and 8 pages of Original Document); Chinese Patent Office.
Chinese Patent Application No. 201811009613 First Office Action dated Sep. 3, 2020; 19 Pages; Chinese Patent Office.
Chinese Search Report; 201710228902.4; dated Jun. 10, 2020; 4 Page; Chinese Patent Office.
Chinese Search Report; 201810008010.8; dated Jun. 1, 2020; 5 Pages; Chinese Patent Office.
Chinese Search Report; 201811009613.6; dated Aug. 25, 2020; 4 Page; Chinese Patent Office.
CN201510895444.0 Second Office Action dated Apr. 10, 2018, China Patent Office.
Corning Incorporated, "What Makes ChemCor Glass Work?" ChemCor Product Specification, Feb. 1990, 2 pgs.
Corning leads $62M Investment in 'smart' glass maker view, Jun. 19, 2013; http://optics.org/news/4/6/27.
Corning, "Nook—Stress Profile Measurement", Corning Incorporated, 2019, 4 slides.
Declaration of Rostislav v. Roussev; 9 Pages; Aug. 11, 2019.
Dessler et al; "Differences between films and monoliths of sol-gel derived aluminas", Thin Solid Films, vol. 519, pp. 42-51, 2010.
Donald "Review Methods for Improving the Mechanical Properties of Oxide Glasses" ; Journal of Materials Science 24 (1989) 4177-4208.
English Translation of CN201510895444.0 Notice of First Office Action dated Dec. 11, 2017; 6 Pages; Chinese Patent Office.
English Translation of CN201580044744.6 Office Action dated Jan. 22, 2019; 19 Pages; Chinese Patent Office.
English Translation of CN201611141439.1 Notice of Second Office Action dated Oct. 19, 2018; 10 Pages; Chinese Patent Office.
English Translation of CN2018100080625 Search Report dated May 9, 2020; 2 Pages; Chinese Patent Office.
English Translation of CN201810903093.7 Office Action dated Apr. 25, 2019; 14 Pages; Chinese Patent Office.
English translation of Japanese Patent Publication No. H11-328601, titled "Glass Substrate for Recording Medium, Recording Medium utilizing Glass Substrate, and Method for Manufacturing Glass Substrate for Recording Medium" Published Nov. 30, 1999. 11 pgs.
English translation of Japanese Patent Publication No. S47-004192, titled "Inorganic Glass for Watch" Published Feb. 4, 1972. 4 pgs.
English Translation of JP2014559996 Office Action dated Feb. 7, 2017, Japan Patent Office.
English Translation of JP2017157071 Office Action dated Nov. 21, 2017, Japan Patent Office, 6 Pgs.
English Translation of KR1020177012502 Office Action dated Jun. 28, 2018, Korean Intellectual Property Office, 3 Pgs.
English Translation of KR1020197037663 Office Action dated May 2, 2020; 3 Pages; Korean Patent Office.
English Translation of TW105123002 Search Report dated May 14, 2018, Taiwan Patent Office, 1 Pg.
English Translation of TW106111688 Search Report dated Apr. 26, 2019; 1 Page; Taiwan Patent Office.
English Translation of TW107106081 Search Report dated Jun. 22, 2018, Taiwan Patent Office.
English Translation of TW107106082 Search Report dated Jun. 21, 2018, Taiwan Patent Office.
English Translation of TW108142075 Office Action dated Apr. 6, 2020; 2 Pages; Taiwan Patent Office.
European Patent Application No. 13709022.1 Office Action dated Apr. 12, 2016; 5 Pages; European Patent Office.
European Patent Application No. 15784527.2 Observations by third parties dated Feb. 18, 2020; 21 Pages; European Patent Office.
European Patent Application No. 15784527.2 Observations by third parties dated Jan. 9, 2020; 1 Pages; European Patent Office.
European Patent Application No. 15784527.2 Office Action dated May 10, 2019; 5 Pages; European Patent Office.
European Patent Application No. 16823100.9 Observations by third parties dated Mar. 17, 2020; 10 Pages; European Patent Office.

(56) References Cited

OTHER PUBLICATIONS

European Patent Application No. 16823100.9 Observations by third parties dated May 5, 2020; 10 Pages; European Patent Office.
European Patent Application No. 16823100.9 Office Action dated Jul. 23, 2020; 9 Pages; European Patent Office.
European Patent Application No. 16823100.9 Office Action dated Mar. 29, 2019; 6 Pages; European Patent Office.
European Patent Application No. 17719103.8 Observations by third parties dated Aug. 26, 2020; 10 Pages; European Patent Office.
European Patent Office First Office Action EP11799531.6-1355 dated May 2, 2014, 2 Pgs.
European Patent Office First Office Action EP11802990.9 dated Mar. 6, 2014, 6 Pgs.
European Patent Office; International Search Report; dated Aug. 27, 2013; pp. 1-3.
Extended European Search Report and Search Opinion; 19217082.7; dated Aug. 12, 2020; 14 pages; European Patent Office.
F.V. Tooley; "The Handbook of Glass Manufacture, vol. II"; China Architecture & Building Press, First Edition, Feb. 1983, pp. 304-305.
Fu, et al, "Preparation of alumina films from a new sol-gel route" Thin Solid films 348, pp. 99-102 (1999).
Glover et al; "The interactive whiteboard: a literature survey"; Technology, Pedagogy and Education (14) 2: 155-170.
Glover, D., Miller, D., Averis, D., Door, V. (2005) "The interactive whiteboard: a literature survey". Technology, Pedagogy and Education (vol. 14) 2005, Issue 2: 155-170.
Greaves et al; "Inorganic Glasses, glass-forming liquids and amorphizing solids" Advances in Physics; vol. 56, No. 1; 2007 pp. 1-166.
Greaves et al; "Inorganic Glasses, Glass-Forming Liquids and Amorphizing Solids", Advances in Physics; vol. 56, No. 1, Jan.-Feb. 2007, 1166.
Green; "Section 2. Residual stress, brittle fracture and damage; Critical parameters in the processing of engineered stress profile glasses"; Journal of Non-Crystalline Solids, 316 (2003) 35-41.
Gulati, "Frangibility of tempered soda-lime glass sheet" Glass Processing Days, Sep. 13-15, 1997. pp. 72-76.
Gulati, Frangibility of Tempered Soda-Lime Glass Sheet, Glass Processing Days, the Fifth International Conference on Architectural and Automotive Glass, Sep. 13-15, 1997.
Hampshire; "Oxynitride glasses, their properties and crystallization—a review"; Journal of Non-Crystalline Solids; vol. 316, 2003; pp. 64-73.
Hampshire; "Section 3. Oxynitride Glasses; Oxynitride Glasses, Their Properties and Crystallisation—A Review", Journal of Non-Crystalline Solids 316 (2003) p. 64-73.
Hauk "Sol-gel preparation of scratch-resistant Al2O3 coatings on float glass", Glass Science and Technology: Glastechnische Berichte, 72(12), pp. 386, 1999.
Indian Patent Application No. 202018006461 office Action dated Sep. 22, 2020; 6 Pages; Indian Patent Office.
Indian Patent Application No. 201817021369; First Examination Report dated Dec. 24, 2019; India Patent Office; 7 Pgs.
International Search Report and the Written Opinoin of the International Searching Authority; PCT/US2015/035448; dated Sep. 18, 2015; 11 Pages.
International Search Report and Written Opinion of the International Searching Authority; PCT/US2015/023507; dated Oct. 19, 2015; 19 Pages.
International Search Report and Written Opinion of the International Searching Authority; PCT/US2015/034996 dated Jan. 4, 2016; 13 Pages.
International Search Report and Written Opinion of the International Searching Authority; PCT/US2015/054681; dated Apr. 6, 2016; 16 Pages; European Patent Office.
International Search Report and Written Opinion of the International Searching Authority; PCT/US2015/058322 dated Jan. 8, 2016; 14 Pages.
International Search Report and Written Opinion of the International Searching Authority; PCT/US2015/058919;dated Jan. 11, 2016; 11 Pages.
International Search Report and Written Opinion of the International Searching Authority; PCTUS2015041976; dated Oct. 29, 2015; 11 Pages.
International Search Report and Written Opinion PCT/US2011/062288 dated Feb. 28, 2012.
International Search Report and Written Opinion PCT/US2011/062354 dated Mar. 15, 2012.
International Search Report and Written Opinion PCT/US2013/028079 dated Aug. 27, 2013.
International Search Report and Written Opinion PCT/US2016/034634 dated Nov. 2, 2016.
International Search Report and Written Opinion PCT/US2016/043610 dated Feb. 1, 2017.
International Search Report and Written Opinion PCT/US2016/085932 dated Apr. 5, 2017.
International Search Report and Written Opinion PCT/US2017/026554 dated Jul. 10, 2017.
International Search Report and Written Opinion PCT/US2017/026561 dated Jun. 19, 2017; 13 Pages; European Patent Office.
International Searching Authority Invitation to Pay Additional Fees PCT/US2016/043610 dated Dec. 8, 2016.
Japanese Patent Application No. 2018-073075 Decision to Grant dated Sep. 2, 2020; 5 Pages; Japanese Patent Office.
Japanese Patent Application No. 2018529948; Machine Translation of the Office Action dated Dec. 18, 2019; Japan Patent Office; 8 Pgs.
Japanese Patent Application No. 2018540470; Machine Translation of the Office Action dated Feb. 12, 2020; Japan Patent Office; 7 PGS.
Japanese Patent Application No. 2019-005651 Notice of Reasons for Refusal dated Sep. 30, 2020; 18 Pages; Japanese Patent Office.
Japanese Patent Application No. 2019-005651; Office Action dated Nov. 8, 2019; Japan Patent Office; 4 PGS.
Japanese Patent Application No. 2019-184641 Notice of Reasons for Refusal dated Oct. 7, 2020; 7 Pages; Japanese Patent Office.
JP2017518941 Notice of Allowance dated Feb. 20, 2019, Japan Patent Office, 3 Pgs.
Kim; "Glass Engineering" ; Glass Technology 3rd Edition; (2009) 8 Pages.
Kitaigorodskii et al, In: Sb.Nauchn.Rabot Belor.Politekhn.Inst.,Khimiya, Tekhnologiya i Istoriya Stekla i Keramiki, 1960, No. 86, p. 38. (The Synthesis of Thermo-stable glasses) Abstract Only.
Kitaigorodskii I.I.' 'Sentyurin G.G.' 'Egorova L.S.', In: Sb.Nauchn. Rabot Belor.Politekhn.Inst.,Khimiya, Tekhnologiya Istoriya Stekla i Keramiki, 1960, No. 86, p. 38. (The Synthesis of Thermo-stable glasses) Abstract Only.
Le Bourhis; "Glass Mechanics and Technology"; Wiley-VCH, Second Edition; (2014) 8 Pages.
Le Bourhis; "Hardness"; Glass Mechanics and Technology; 2008; pp. 170-174.
Liu et al, "Common Knowledge Evidence: Inorganic Non-Metallic Materials Technology", China University of Science and Technology Press, Sep. 2015, 1st edition.
Nagashima; "Chemical Strengthening of Glass"; Surface Technology; vol. 64, No. 8; (2013) pp. 434-438.
Chinese Patent Application No. 201710230496.5, Office Action dated Feb. 3, 2021, 25 pages (15 pages of English Translation and 10 pages of Original Document); Chinese Patent Office.
"Building Materials", Co-edited by Xi'an University of Architecture and Technology, China Construction Industry Press, Edition 3, Apr. 30, 2004, 5 pages.
Rukmani et al., "Effects of V and Mn Colorants on the Crystallization Behavior and Optical Properties of Ce—Doped Li-Disilicate Glass", In Journal Of American Ceramic Society, vol. 90, 2007, pp. 706-711.

\* cited by examiner

GLASS-BASED ARTICLES INCLUDING A METAL OXIDE CONCENTRATION GRADIENT

CROSS-REFERENCE TO RELATED APPLICATIONS

This application is a continuation application and claims the benefit of priority under 35 U.S.C. § 120 of U.S. Ser. No. 16/797,638 filed on Feb. 21, 2020, which is a divisional application and claims benefit of priority under 35 U.S.C. § 120 of U.S. Ser. No. 16/027,741 filed on Jul. 5, 2018, now patent Ser. No. 10/570,059 granted Feb. 25, 2020, which is a divisional application and claims the benefit of priority under 35 U.S.C. § 120 of U.S. patent Ser. No. 15/482,213 filed on Apr. 7, 2017, now patent Ser. No. 10/017,417 granted Jul. 10, 2018, which in turn, claims the benefit of priority under 35 U.S.C. § 119 of U.S. Provisional Application Ser. No. 62/366,338 filed on Jul. 25, 2016 and U.S. Provisional Application Ser. No. 62/320,077 filed on Apr. 8, 2016, the contents of each of which are relied upon and incorporated herein by reference in their entireties.

BACKGROUND

This disclosure relates to glass-based articles exhibiting improved damage resistance, including improved fracture resistance, and more particularly to glass and glass ceramic articles exhibiting a non-zero metal oxide concentration gradient or concentration that varies along a substantial portion of the thickness.

Glass-based articles often experience severe impacts that can introduce large flaws into a surface of such articles. Such flaws can extend to depths of up to about 200 micrometers (microns, or μm) from the surface. Traditionally, thermally tempered glass has been used to prevent failures caused by the introduction of such flaws into the glass because thermally tempered glass often exhibits large compressive stress (CS) layers (e.g., approximately 21% of the total thickness of the glass), which can prevent the flaws from propagating further into the glass and thus, can prevent failure. An example of a stress profile generated by thermal tempering is shown in FIG. 1. In FIG. 1, the thermally treated glass article 100 includes a first surface 101, a thickness $t_1$, and a surface CS 110. The thermally treated glass article 100 exhibits a CS that decreases from the first surface 101 to a depth of compression (DOC) 130, as defined herein, at which depth the stress changes from compressive to tensile stress and reaches a maximum central tension (CT) 120.

Thermal tempering is currently limited to thick glass-based articles (i.e., glass-based articles having a thickness $t_1$ of about 3 millimeters or greater) because, to achieve the thermal strengthening and the desired residual stresses, a sufficient thermal gradient must be formed between the core of such articles and the surface. Such thick articles are undesirable or not practical in many applications such as display (e.g., consumer electronics, including mobile phones, tablets, computers, navigation systems, and the like), architecture (e.g., windows, shower panels, countertops etc.), transportation (e.g., automotive, trains, aircraft, sea craft, etc.), appliance, or any application that requires superior fracture resistance but thin and light-weight articles.

Although chemical strengthening is not limited by the thickness of the glass-based article in the same manner as thermally tempering, known chemically strengthened glass-based articles do not exhibit the stress profile of thermally tempered glass-based articles. An example of a stress profile generated by chemical strengthening (e.g., by an ion exchange process), is shown in FIG. 2. In FIG. 2, the chemically strengthened glass-based article 200 includes a first surface 201, a thickness t2 and a surface CS 210. The glass-based article 200 exhibits a CS that decreases from the first surface 201 to a DOC 230, as defined herein, at which depth the stress changes from compressive to tensile stress and reaches a maximum CT 220. As shown in FIG. 2, such profiles exhibit a substantially flat CT region or CT region with a constant or near constant tensile stress along at least a portion of the CT region. Often, known chemically strengthened glass-based articles exhibit a lower maximum CT value, as compared to the maximum central value shown in FIG. 1.

Accordingly, there is a need for thin glass-based articles that exhibit improved fracture resistance.

SUMMARY

A first aspect of the present disclosure pertains to a glass-based article including a first surface and a second surface opposing the first surface defining a thickness (t); a concentration of a metal oxide that is both non-zero and varies along a thickness range from about 0·t to about 0.3·t; and a central tension (CT) region comprising a maximum CT greater than or equal to $71.5/\sqrt{(t)}$, wherein, when the glass-based article is fractured, the glass-based article fractures into at least 2 fragments/inch² (fragments per square inch), wherein the sample size used was a 5.08 cm by 5.08 cm (2 inch by 2 inch) square, as measured by the "Frangibility Test", as described Z. Tang, et al. *Automated Apparatus for Measuring the Frangibility and Fragmentation of Strengthened Glass*. Experimental Mechanics (2014) 54:903-912. The number of fragments is divided by the area of the sample being tested (in square inches). As used herein, the variation in metal oxide concentration may be referred to herein as a metal oxide concentration gradient. In one or more embodiments, the concentration of the metal oxide is non-zero and varies along the entire thickness. In one or more embodiments, the CT region may include the metal oxide that is both non-zero and that varies along a thickness range from about 0·t to about 0.3·t. The glass-based article of one or more embodiments may include a thickness t of about 3 millimeters (mm) or less, 2 mm or less, or about 1 mm or less.

A second aspect of this disclosure pertains to a glass-based article including a first surface and a second surface opposing the first surface defining a thickness (t) of about 3 millimeters or less, and a stress profile extending along the thickness, wherein all points of the stress profile between a thickness range from about 0·t up to 0.3·t and from greater than 0.7·t to t, comprise a tangent having a slope with an absolute value that is greater than about 0.1 MPa/micrometers, wherein the stress profile comprises a maximum CS, a DOC and a maximum CT greater than or equal to $71.5/\sqrt{(t)}$, wherein the ratio of maximum CT to absolute value of maximum CS is in the range from about 0.01 to about 0.2 and wherein the DOC is about 0.1·t or greater.

A third aspect of this disclosure pertains to a glass-based article including a first surface and a second surface opposing the first surface defining a thickness (t); and a concentration of a metal oxide that is both non-zero and varies along a thickness range from about 0·t to about 0.3·t (or from about 0·t to about 0.4·t or from about 0·t to about 0.45·t), a surface compressive stress of greater than about 200 MPa or greater; and a CT region having a maximum CT greater than or equal to 71.5/√(t).

A fourth aspect of this disclosure pertains to a glass-based article comprising: a first surface and a second surface opposing the first surface defining a thickness (t); and a metal oxide that forms a concentration gradient, wherein the concentration of the metal oxide decreases from the first surface to a value at a point between the first surface and the second surface and increases from the value to the second surface, wherein the concentration of the metal oxide at the point is non-zero, and wherein the glass-based article comprises a stored tensile energy of about greater than 0 J/m$^2$ to less than 20 J/m$^2$ and a Young's modulus of about 70 GPa or greater.

A fifth aspect of this disclosure pertains to a glass-based article comprising: a first surface and a second surface opposing the first surface defining a thickness (t) of about 3 millimeters or less; and a stress profile extending along the thickness, wherein the stress profile at all points between a thickness range from about 0t up to 0.3t and from greater than 0.7t, comprise a tangent having a slope with an absolute value of greater than about 0.1 MPa/micrometer, wherein the stress profile comprises a maximum CS, a DOC and a maximum CT, wherein the ratio of maximum CT to absolute value of maximum CS is in the range from about 0.01 to about 0.2 and wherein the DOC is about 0.1·t or greater, and wherein the glass-based article comprises a stored tensile energy of about greater than 0 J/m$^2$ to less than 20 J/m$^2$ and a Young's modulus of about 70 GPa or greater. In one or more embodiments, the glass-based article includes a non-zero concentration of a metal oxide that continuously varies along the entire thickness. In some instances, the non-zero concentration of a metal oxide that continuously varies along thickness segments of less than about 10 micrometers.

A sixth aspect of this disclosure pertains to a glass-based article including a stress profile including a CS region and a CT region, wherein the CT region is approximated by the equation Stress(x)=MaxT−(((CT$_n$·(n+1))/0.5n)·|(x/t)−0.5|n), wherein MaxT is a maximum tension value, CT$_n$ is less than or equal to MaxT and is a positive value in units of MPa, x is position along the thickness (t) in micrometers, and n is between 1.5 and 5. In some embodiments, the maximum CT value in the range from about 50 MPa to about 250 MPa and the maximum CT value is at a depth in the range from about 0.4t to about 0.6t. In one or more embodiments, from a thickness in the range from about 0t to about 0.1t, the stress profile comprises a slope in the range from about 20 MPa/micrometer to about 200 MPa/micrometer. In one or more embodiments, the stress profile is approximated by a plurality of error functions as measured from 0.5t to the surface.

In accordance with one or more embodiments of the glass-based articles described herein, a monovalent ion of the metal oxide generates a stress along the thickness range (i.e., from about 0·t to about 0.3·t, from about 0·t to about 0.4·t, or from about 0·t to about 0.45·t). The concentration of the metal oxide of one or more embodiments decreases from the first surface to a value at a point between the first surface and the second surface and increases from the value to the second surface.

In one or more embodiments, the concentration of the metal oxide is about 0.05 mol % or greater throughout the thickness. For example, in one or more embodiments, the concentration of the metal oxide at the first surface is about 1.5 times (or more) greater than the concentration of the metal oxides at a depth equal to about 0.5·t. In exemplary embodiments, the glass-based article comprises a total concentration of the metal oxide in the range from about 1 mol % to about 15 mol %. In one or more embodiments, examples of the metal oxide include any one or more of Li$_2$O, Na$_2$O, K$_2$O, Rb$_2$O, and Cs$_2$O. In one or more embodiments, the monovalent ion of the metal oxide has a largest ionic diameter of all of the total metal oxides in the glass-based substrate or article.

In one or more embodiments, the CT region comprises the metal oxide that is both non-zero and that varies along a thickness range from about 0·t to about 0.3·t. In one or more embodiments of the glass-based articles described herein, the maximum CT is greater than or equal to 71.5/√(t) (MPa), wherein "71.5" is in units of MPa·(mm)^0.5, and "t" is in millimeters (mm).

The glass-based article of some embodiments includes a first metal oxide concentration and a second metal oxide concentration. In some embodiments, the first metal oxide concentration is in the range from about 0 mol % to about 15 mol % from a first thickness range from about 0·t to about 0.5·t. In some embodiments, the second metal oxide concentration is in the range from about 0 mol % to about 10 mol % from a second thickness range from about 0 micrometers to about 25 micrometers. The glass-based article may include an optional third metal oxide.

In one or more embodiments, the glass-based articles described herein may exhibit a surface compressive stress (CS) that is greater than the maximum CT. One or more embodiments of the glass-based articles described herein may include a surface CS of about 300 MPa or greater. In some instances, this surface CS is exhibited when the glass-based article has a thickness of about 2 mm or less. In one or more embodiments, the glass-based article exhibits a combination of a surface CS of about 200 MPa or greater and a chemical depth of layer of about 0.4·t or greater. In one or more embodiments, the glass-based article includes a CS extending from the first surface to a DOC, wherein the DOC is about 0.1·t or greater. In some instances, the ratio of maximum CT to absolute value of surface CS is in the range from about 0.1 to about 0.8.

In one or more embodiments, the glass-based article has an amorphous structure. In some embodiments, the glass-based article may include a crystalline structure.

In one or more embodiments, the glass-based articles described herein may exhibit a transmittance of about 88% or greater over a wavelength in the range from about 380 nm to about 780 nm. In some instances, the glass-based articles described herein may exhibit CIELAB color space coordinates, under a CIE illuminant F02, of L* values of about 88 and greater, a* values in the range from about −3 to about +3, and b* values in the range from about −6 to about +6.

In one or more embodiments, the glass-based articles described herein may include a Young's modulus of about 70 GPa or greater. In some embodiments, the glass-based articles described herein include a liquidus viscosity of less than about 100 kilopoise (kP). In one or more embodiments, the glass-based articles described herein exhibit a fracture toughness (K$_{1C}$) of about 0.65 MPa·m$^{1/2}$ or greater. In one or more embodiments, the glass-based articles described herein include any one or more of: a composition comprising a combined amount of Al$_2$O$_3$ and Na$_2$O of about 15 mol % or less, a composition comprising about 4 mol % or greater Na$_2$O, a composition comprising any one or more of B$_2$O$_3$ and ZnO, and a composition substantially free of P$_2$O$_5$. In one or more embodiments, glass-based article comprises a monovalent ion (e.g., sodium ion or potassium ion) diffusivity of about 450 μm$^2$/hour (square micrometers per hour) or greater at about 460° C. In some embodiments, this monovalent ion diffusivity is exhibited in combination with a DOC greater than about 0.15·t, and a surface CS that is 1.5 times the maximum CT or greater.

In one or more embodiments, the glass-based articles described herein exhibit certain fracture behavior. For example, in one or more embodiments, when the glass-based article is fractured by a single event (i.e., a single impact such as being dropped or being impacted once with an implement), the glass-based article fractures into at least 2 fragments/inch$^{2-}$ (fragments per square inch), wherein the sample size used was a 5.08 cm by 5.08 cm (2 inch by 2 inch) square, as measured by the "Frangibility Test", as described Z. Tang, et al. *Automated Apparatus for Measuring the Frangibility and Fragmentation of Strengthened Glass.* Experimental Mechanics (2014) 54:903-912. The number of fragments is divided by the area of the sample being tested (in square inches). In some embodiments, when the glass-based article is fractured, the glass-based article fractures into at least 1 fragment/inch$^2$ up to 40 fragments/inch$^2$ (fragments per square inch), wherein the sample size used was a 5.08 cm by 5.08 cm (2 inch by 2 inch) square.

A seventh aspect of this disclosure pertains to a use of a glass substrate in a strengthened glass-based article. In one or more embodiments, the glass substrate comprises (in mol %): SiO2 in an amount in the range from about 68 to about 75; $Al_2O_3$ in an amount in the range from about 12 to about 15; $B_2O_3$ in an amount in the range from about 0.5 to about 5; $Li_2O$ in an amount in the range from about 2 to about 10; $Na_2O$ in an amount in the range from about 0 to about 6; MgO in an amount in the range from about 1 to about 4; ZnO in an amount in the range from about 0 to about 3; and CaO in an amount in the range from about 0 to about 5, wherein the glass substrate is ion-exchangeable and is amorphous. In one or embodiments, the glass substrate exhibits any one or more of: a ratio of $Li_2O$ to $R_2O$ in the range from about 0.45 to about 1; a difference between a total amount of $R_2O$ to the amount of $Al_2O_3$ in the range from about −5 to about 0; a difference between a total amount of RxO (in mol %) and the amount of $Al_2O_3$ in the range from about 0 to about 3; and a ratio of the amount of MgO (in mol %) to a total amount of RO (in mol %) in the range from about 0 to about 1, and wherein the glass substrate is substantially free of nucleating agents.

A eighth aspect of this disclosure pertains to a glass substrate comprising a composition including, in mol %, $SiO_2$ in an amount in the range from about 68 to about 75; $Al_2O_3$ in an amount in the range from about 12 to about 15; $B_2O_3$ in an amount in the range from about 0.5 to about 5; $Li_2O$ in an amount in the range from about 2 to about 10; $Na_2O$ in an amount in the range from about 0 to about 6; MgO in an amount in the range from about 1 to about 4; ZnO in an amount in the range from about 0 to about 3; and CaO in an amount in the range from about 0 to about 5, wherein the glass substrate is ion-exchangeable and is amorphous. In one or more embodiments, the glass substrate exhibits any one or more of: a ratio of $Li_2O$ to $R_2O$ in the range from about 0.45 to about 1; a difference between a total amount of $R_2O$ to the amount of $Al_2O_3$ in the range from about −5 to about 0; a difference between a total amount of $R_xO$ (in mol %) and the amount of $Al_2O_3$ in the range from about 0 to about 3; and a ratio of the amount of MgO (in mol %) to a total amount of RO (in mol %) in the range from about 0 to about 1. In one or more embodiments, the glass substrate is substantially free of nucleating agents.

An ninth aspect of this disclosure pertains to a glass substrate that includes in mol %, $SiO_2$ in an amount in the range from about 68 to about 75; $Al_2O_3$ in an amount in the range from about 12 to about 15; $B_2O_3$ in an amount in the range from about 0.5 to about 5; $Li_2O$ in an amount in the range from about 2 to about 10; $Na_2O$ in an amount in the range from about 0 to about 6; MgO in an amount in the range from about 1 to about 4; ZnO in an amount in the range from about 0 to about 3; and CaO in an amount in the range from about 0 to about 5, wherein the glass substrate is amorphous and is strengthened. In one or more embodiments, the $Na_2O$ concentration varies in the glass substrate. In one or more embodiments, the glass substrate is substantially free of nucleating agents. In accordance with one or more embodiments, the strengthened glass substrate exhibits any one or more of the following compositional relationships: a ratio of $Li_2O$ to $R_2O$ in the range from about 0.45 to about 1; a difference between a total amount of $R_2O$ to the amount of $Al_2O_3$ in the range from about −5 to about 0; a difference between a total amount of $R_xO$ (in mol %) and the amount of $Al_2O_3$ in the range from about 0 to about 3; and a ratio of the amount of MgO (in mol %) to a total amount of RO (in mol %) in the range from about 0 to about 1.

A tenth aspect of this disclosure pertains to a device comprising: a housing having front, back, and side surfaces; electrical components that are at least partially inside the housing; a display at or adjacent to the front surface of the housing; and a cover substrate disposed over the display, wherein the cover substrate comprises a glass-based article according the embodiments described herein.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
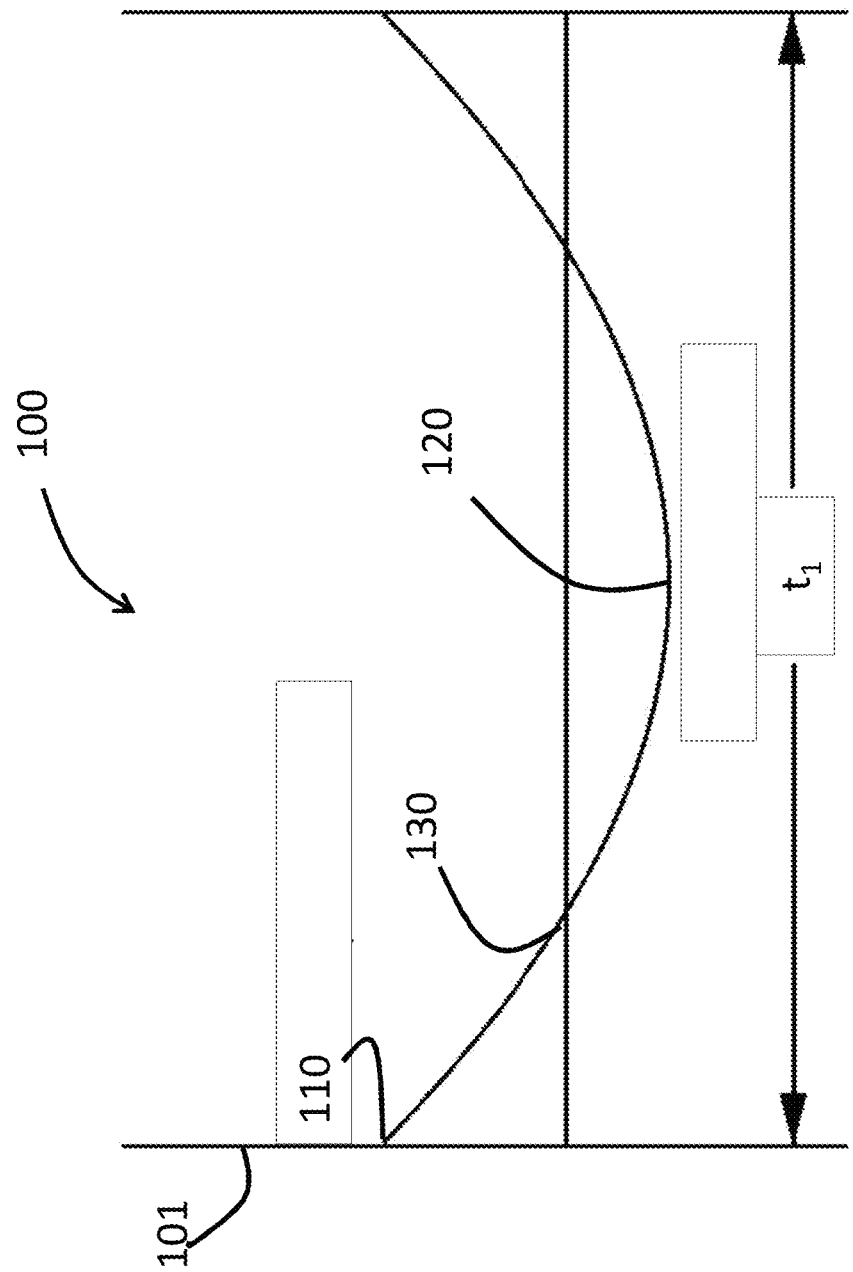
FIG. 1 is a cross-sectional view across a thickness of a known, thermally tempered glass article.

Reference will now be made in detail to various embodiments, examples of which are illustrated in the accompanying examples and drawings.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass-based article" and "glass-based substrates" are used in their broadest sense to include any object made wholly or partly of glass. Glass-based articles include laminates of glass and non-glass materials, laminates of glass and crystalline materials, and glass-ceramics (including an amorphous phase and a crystalline phase). Unless otherwise specified, all compositions are expressed in terms of mole percent (mol %).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

Unless otherwise specified, all temperatures are expressed in terms of degrees Celsius (° C.). As used herein the term "softening point" refers to the temperature at which the viscosity of a glass is approximately $10^{7.6}$ poise (P), the term "anneal point" refers to the temperature at which the viscosity of a glass is approximately $10^{13.2}$ poise, the term "200 poise temperature ($T^{200P}$)" refers to the temperature at which the viscosity of a glass is approximately 200 poise, the term "$10^{11}$ poise temperature" refers to the temperature at which the viscosity of a glass is approximately $10^{11}$ poise, the term "35 kP temperature ($T^{35kP}$)" refers to the temperature at which the viscosity of a glass is approximately 35 kilopoise (kP), and the term "160 kP temperature ($T^{160P}$)" refers to the temperature at which the viscosity of a glass is approximately 160 kP.

Figure 2:
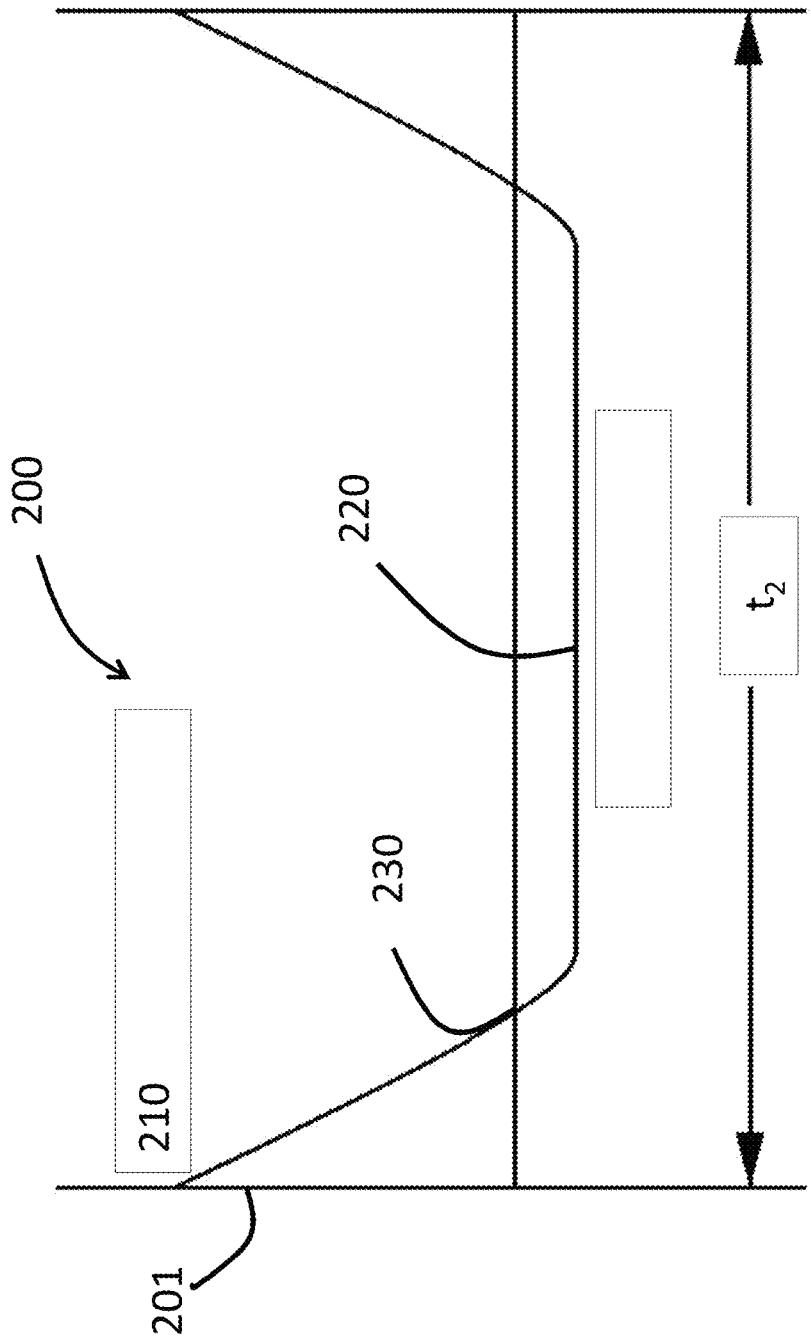
FIG. 2 is a cross-sectional view across a thickness of a known, chemically strengthened glass article.
Figure 3:
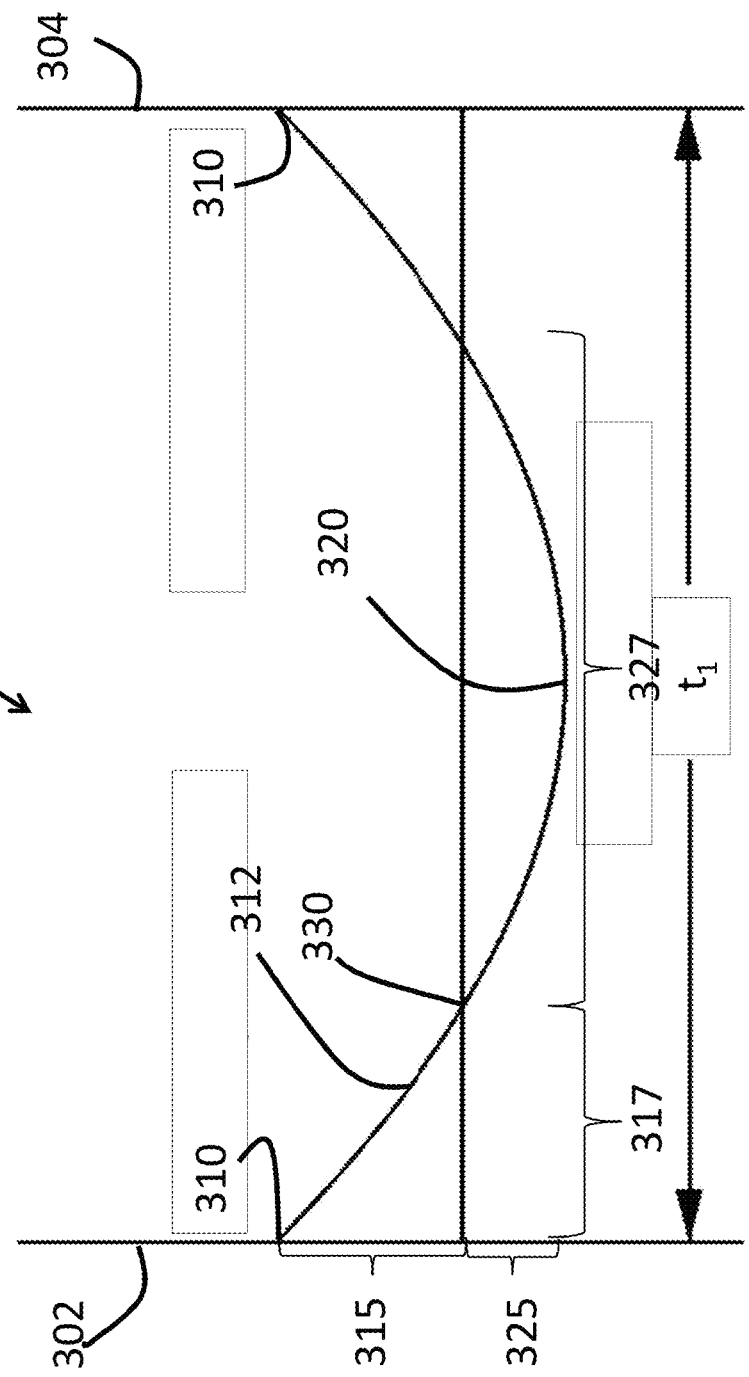
FIG. 3 is a cross-sectional view across a thickness of a chemically strengthened glass-based article according to one or more embodiments of this disclosure.

Referring to the drawings in general and to FIGS. 1-3 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

As used herein, DOC refers to the depth at which the stress within the glass-based article changes compressive to tensile stress. At the DOC, the stress crosses from a positive (compressive) stress to a negative (tensile) stress (e.g., 130 in FIG. 1) and thus exhibits a stress value of zero.

As used herein, the terms "chemical depth", "chemical depth of layer" and "depth of chemical layer" may be used interchangeably and refer to the depth at which an ion of the metal oxide or alkali metal oxide (e.g., the metal ion or alkali metal ion) diffuses into the glass-based article and the depth at which the concentration of the ion reaches a minimum value, as determined by Electron Probe Micro-Analysis (EPMA) or Glow Discharge—Optical Emission Spectroscopy (GD-OES)). In particular, to assess the depth of $Na_2O$ diffusion or $Na+$ ion concentration may be determined using EPMA and a surface stress meter (described in more detail below).

According to the convention normally used in the art, compression is expressed as a negative (<0) stress and tension is expressed as a positive (>0) stress, unless specifically noted otherwise. Throughout this description, however, when speaking in terms of compressive stress CS, such is given without regard to positive or negative values—i.e., as recited herein, CS=|CS|.

Described herein are thin, chemically strengthened glass-based articles that include glasses, such as silicate glasses including alkali-containing glass, and glass-ceramics that may be used as a cover glass for mobile electronic devices and touch-enabled displays. The glass-based articles may also be used in displays (or as display articles) (e.g., billboards, point of sale systems, computers, navigation systems, and the like), architectural articles (walls, fixtures, panels, windows, etc.), transportation articles (e.g., in automotive applications, trains, aircraft, sea craft, etc.), appliances (e.g., washers, dryers, dishwashers, refrigerators and the like), or any article that requires some fracture resistance.

In particular, the glass-based articles described herein are thin and exhibit stress profiles that are typically only achievable through tempering thick glass articles (e.g., having a thickness of about 2 mm or 3 mm or greater). The glass-based articles exhibit unique stress profiles along the thickness thereof. In some cases, the glass-based articles described herein exhibit a greater surface CS than tempered glass articles. In one or more embodiments, the glass-based articles have a compressive stress layer that extends deeper into the glass-based article (in which the CS decreases and increases more gradually than known chemically strengthened glass-based articles) such the glass-based article exhibits substantially improved fracture resistance, even when the glass-based article or a device including the same is dropped on a hard surface (e.g., granite) or a hard and rough surface (e.g., asphalt). The glass-based articles of one or more embodiments exhibit a greater maximum CT value than some known chemically strengthened glass substrates.

CS and depth of penetration of potassium ions ("Potassium DOL") are measured using those means known in the art. Potassium DOL is distinguished from DOC because it represents the depth of potassium penetration as a result of an ion exchange process. Potassium DOL is typically less than the DOC for the articles described herein. CS and Potassium DOL are measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to a modified version of Procedure C described in ASTM standard C770-98 (2013), entitled "Standard Test Method for Measurement of Glass Stress-Optical Coefficient," the contents of which are incorporated herein by reference in their entirety. The modification includes using a glass disc as the specimen with a thickness of 5 to 10 mm and a diameter of 12.7 mm, wherein the disc is isotropic and homogeneous and core drilled with both faces polished and parallel. The modification also includes calculating the maximum force, Fmax to be applied. The force should be sufficient to produce 20 MPa or more compression stress. Fmax is calculated as follows:

$$F\ max = 7.854 * D * h$$

Where:
Fmax=Force in Newtons
D=the diameter of the disc
h=the thickness of the light path
For each force applied, the stress is computed as follows:

$$\sigma_{MPa} = 8F/(\pi * D * h)$$

Where:

F=Force in Newtons

D=the diameter of the disc h=the thickness of the light path.

DOC and maximum CT values are measured using a scattered light polariscope (SCALP) techniques known in the art. Refracted near-field (RNF) method or SCALP may be used to measure the stress profile. When the RNF method is utilized, the maximum CT value provided by SCALP is utilized. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass-based article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal. The RNF profile is then smoothed, and used for the CT region. As noted above, the FSM technique is used for the surface CS and slope of the stress profile in the CS region near the surface.

As stated above, the glass-based articles described herein are chemically strengthened by ion exchange and exhibit stress profiles that are distinguished from those exhibited by known strengthened glass articles. In this disclosure glass-based substrates are generally unstrengthened and glass-based articles generally refer to glass-based substrates that have been strengthened (by, for example, ion exchange). In this process, ions at or near the surface of the glass-based article are replaced by—or exchanged with—larger ions having the same valence or oxidation state. In those embodiments in which the glass-based article comprises an alkali aluminosilicate glass, ions in the surface layer of the glass and the larger ions are monovalent alkali metal cations, such as Li$^+$ (when present in the glass-based article), Na$^+$, K$^+$, Rb$^+$, and Cs$^+$. Alternatively, monovalent cations in the surface layer may be replaced with monovalent cations other than alkali metal cations, such as Ag$^+$ or the like. In such embodiments, the monovalent ions (or cations) exchanged into the glass-based substrate generate a stress in the resulting glass-based article.

Ion exchange processes are typically carried out by immersing a glass-based substrate in a molten salt bath (or two or more molten salt baths) containing the larger ions to be exchanged with the smaller ions in the glass-based substrate. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass-based article in a salt bath (or baths), use of multiple salt baths, additional steps such as annealing, washing, and the like, are generally determined by the composition of the glass-based article (including the structure of the article and any crystalline phases present) and the desired DOC and CS of the glass-based article that results from strengthening. By way of example, ion exchange of glass-based substrates may be achieved by immersion of the glass-based substrates in at least one molten bath containing a salt such as, but not limited to, nitrates, sulfates, and chlorides of the larger alkali metal ion. Typical nitrates include KNO$_3$, NaNO$_3$, LiNO$_3$, NaSO$_4$ and combinations thereof. The temperature of the molten salt bath typically is in a range from about 380° C. up to about 450° C., while immersion times range from about 15 minutes up to about 100 hours depending on glass thickness, bath temperature and glass (or monovalent ion) diffusivity. However, temperatures and immersion times different from those described above may also be used.

In one or more embodiments, the glass-based substrates may be immersed in a molten salt bath of 100% NaNO$_3$ having a temperature from about 370° C. to about 480° C. In some embodiments, the glass-based substrate may be immersed in a molten mixed salt bath including from about 5% to about 90% KNO$_3$ and from about 10% to about 95% NaNO$_3$. In some embodiments, the glass-based substrate may be immersed in a molten mixed salt bath including Na$_2$SO$_4$ and NaNO$_3$ and have a wider temperature range (e.g., up to about 500° C.). In one or more embodiments, the glass-based article may be immersed in a second bath, after immersion in a first bath. Immersion in a second bath may include immersion in a molten salt bath including 100% KNO$_3$ for 15 minutes to 8 hours.

In one or more embodiments, the glass-based substrate may be immersed in a molten, mixed salt bath including NaNO$_3$ and KNO$_3$ (e.g., 49%/51%, 50%/50%, 51%/49%) having a temperature less than about 420° C. (e.g., about 400° C. or about 380° C.). for less than about 5 hours, or even about 4 hours or less.

Ion exchange conditions can be tailored to provide a "spike" or to increase the slope of the stress profile at or near the surface of the resulting glass-based article. This spike can be achieved by single bath or multiple baths, with the bath(s) having a single composition or mixed composition, due to the unique properties of the glass compositions used in the glass-based articles described herein.

As illustrated in FIG. 3, the glass-based article 300 of one or more embodiments includes a first surface 302 and a second surface 304 opposing the first surface, defining a thickness t. In one or more embodiments, the thickness t may be about 3 millimeters or less (e.g., in the range from about 0.01 millimeter to about 3 millimeters, from about 0.1 millimeter to about 3 millimeters, from about 0.2 millimeter to about 3 millimeters, from about 0.3 millimeter to about 3 millimeters, from about 0.4 millimeter to about 3 millimeters, from about 0.01 millimeter to about 2.5 millimeters, from about 0.01 millimeter to about 2 millimeters, from about 0.01 millimeter to about 1.5 millimeters, from about 0.01 millimeter to about 1 millimeter, from about 0.01 millimeter to about 0.9 millimeter, from about 0.01 millimeter to about 0.8 millimeter, from about 0.01 millimeter to about 0.7 millimeter, from about 0.01 millimeter to about 0.6 millimeter, from about 0.01 millimeter to about 0.5 millimeter, from about 0.1 millimeter to about 0.5 millimeter, or from about 0.3 millimeter to about 0.5 millimeter.)

The glass-based article includes a stress profile that extends from the first surface 302 to the second surface 304

(or along the entire length of the thickness t). In the embodiment shown in FIG. 3, the stress profile 312. The y-axis represents the stress magnitude value and the x-axis represents the thickness or depth within the glass-based article.

As illustrated in FIG. 3, the stress profile 312 includes a CS layer 315 (with a surface CS 310), a CT layer 325 (with a maximum CT 320) and a DOC 330 at which the stress profile 312 turns from compressive to tensile. The CS layer has an associated depth or length 317 extending from a surface 302, 304 to the DOC 330. The CT layer 325 also has an associated depth or length 327 (CT region or layer).

The surface CS 310 may be about 150 MPa or greater or about 200 MPa or greater (e.g., about 250 MPa or greater, about 300 MPa or greater, about 400 MPa or greater, about 450 MPa or greater, about 500 MPa or greater, or about 550 MPa or greater). The surface CS 310 may be up to about 900 MPa, up to about 1000 MPa, up to about 1100 MPa, or up to about 1200 MPa. The surface CS values herein may also comprise the maximum CS. In some embodiments, the surface CS is less than the maximum CS.

The maximum CT 320 may be greater than or equal to about $71.5/\sqrt{(t)}$. In some embodiments, the maximum CT 320 is about 80 MPa or greater, about 85 MPa or greater or about 90 MPa or greater. In some embodiments, the maximum CT 320 may be in the range from greater than about 80 MPa to about 100 MPa (e.g., from about 85 MPa to about 100 MPa, from about 90 MPa to about 100 MPa, from about 80 MPa to about 95 MPa, from about 80 MPa to about 90 MPa, from about 85 MPa to about 95 MPa, or from about 88 MPa to about 92 MP). The maximum CT 320 may be positioned at a range from about 0.3·t to about 0.7·t, from about 0.4·t to about 0.6·t or from about 0.45·t to about 0.55·t. It should be noted that any one or more of surface CS 310 and maximum CT 320 may be dependent on the thickness of the glass-based article. For example, glass-based articles having at thickness of about 0.8 mm may have a maximum CT in the range from about 85 MPa to about 100 MPa. When the thickness of the glass-based article decreases, the maximum CT may increase. In other words, the maximum CT increases with decreasing thickness (or as the glass-based article becomes thinner).

In some embodiments, the ratio of the maximum CT 320 to the surface CS 310 in the range from about 0.1 to about 0.8 (e.g., in the range from about 0.1 to about 0.7, from about 0.1 to about 0.6, from about 0.1 to about 0.5, from about 0.1 to about 0.4, from about 0.1 to about 0.3, from about 0.1 to about 0.25, from about 0.1 to about 0.2, from about 0.15 to about 0.8, from about 0.2 to about 0.8, from about 0.3 to about 0.8, from about 0.4 to about 0.8, from about 0.5 to about 0.8, or from about 0.6 to about 0.8). In known chemically strengthened glass-based articles, the ratio of the maximum CT 320 to the surface CS 310 is 0.1 or less. In some embodiments, surface CS may be 4 times (e.g., 5 times, 6 times or 6.5 times) the maximum CT or greater. In some embodiments, the surface CS may be up to about 47.5 times the maximum CT. The surface CS may be in the range from about 4 times up to about 7.5 times the maximum CT.

In one or more embodiments, the stress profile 312 comprises a maximum CS, which is typically the surface CS 310 and can be found at one or both of the first surface 302 and the second surface 304. In one or more embodiments, the CS layer or region 315 extends along a portion of the thickness 317 to the DOC 330 and a maximum CT 320. In one or more embodiments, the DOC 330 may be about 0.1·t or greater. For example, the DOC 330 may be about 0.12·t or greater, about 0.14·t or greater, about 0.15·t or greater, about 0.16·t or greater, 0.17·t or greater, 0.18·t or greater, 0.19·t or greater, 0.20·t or greater, about 0.21·t or greater, or up to about 0.25·t. In some embodiments, the DOC 330 is less than the chemical depth. The chemical depth may be about 0.4·t or greater, 0.5·t or greater, about 55·t or greater, or about 0.6·t or greater.

In one or more embodiments, the glass-based article comprises a potassium DOL in the range from about 6 micrometers to about 20 micrometers. In some embodiments, the potassium DOL may be expressed as a function of the thickness t of the glass-based article. In one or more embodiments, potassium DOL may be in the range from about 0.005t to about 0.05t. In some embodiments, the potassium DOL may be in the range from about 0.005t to about 0.05t, from about 0.005t to about 0.045t, from about 0.005t to about 0.04t, from about 0.005t to about 0.035t, from about 0.005t to about 0.03t, from about 0.005t to about 0.025t, from about 0.005t to about 0.02t, from about 0.005t to about 0.015t, from about 0.005t to about 0.01t, from about 0.006t to about 0.05t, from about 0.008t to about 0.05t, from about 0.01t to about 0.05t, from about 0.015t to about 0.05t, from about 0.02t to about 0.05t, from about 0.025t to about 0.05t, from about 0.03t to about 0.05t, or from about 0.01t to about 0.02t.

In one or more embodiments, the compressive stress value at the potassium DOL depth may be in the range from about 50 MPa to about 300 MPa. In some embodiments, the compressive stress value at the potassium DOL depth may be in the range from about 50 MPa to about 280 MPa, from about 50 MPa to about 260 MPa, from about 50 MPa to about 250 MPa, from about 50 MPa to about 240 MPa, from about 50 MPa to about 220 MPa, from about 50 MPa to about 200 MPa, from about 60 MPa to about 300 MPa, from about 70 MPa to about 300 MPa, from about 75 MPa to about 300 MPa, from about 80 MPa to about 300 MPa, from about 90 MPa to about 300 MPa, from about 100 MPa to about 300 MPa, from about 1100 MPa to about 300 MPa, from about 120 MPa to about 300 MPa, from about 130 MPa to about 300 MPa, or from about 150 MPa to about 300 MPa.

In one or more embodiments, the stress profile 312 may be described as parabolic-like in shape. In some embodiments, the stress profile along the region or depth of the glass-based article exhibiting tensile stress exhibits a parabolic-like shape. In one or more specific embodiments, the stress profile 312 is free of a flat stress (either compressive or tensile) portion or a portion that exhibits a substantially constant stress (either compressive or tensile). In some embodiments, the CT region exhibits a stress profile that is substantially free of a flat stress or free of a substantially constant stress. In one or more embodiments, all points of the stress profile 312 between a thickness range from about 0t up to about 0.2·t and greater than 0.8·t (or from about 0·t to about 0.3·t and greater than 0.7·t up to t) comprise a tangent having a slope with an absolute value that is greater than about 0.1 MPa/micrometer. In some embodiments, the slope of the tangent may have an absolute value of greater than about 0.2 MPa/micrometer. In some more specific embodiments, the slope of the tangent may have an absolute value of greater than 0.3 MPa/micrometer. In even more specific embodiments, the slope of the tangent may have an absolute value of greater than 0.5 MPa/micrometer. In other words, the stress profile of one or more embodiments along these thickness ranges (i.e., 0·t up to about 0.2·t and greater than 0.8t, or from about 0t to about 0.3·t and about 0.7·t or greater) exclude points having a tangent with zero slope, or slope approximating zero, or flat slope.

Without being bound by theory, known error function or quasi-linear stress profiles have points along these thickness ranges (i.e., from about 0·t up to about 0.2·t and greater than 0.8·t, or from about 0·t to about 0.3·t and about 0.7·t or greater) that have a tangent with a slope of zero or of a value that is close to zero, i.e., that may have an absolute value of less than about 0.1 MPa/micrometer (indicating a flat or zero slope stress profile along such thickness ranges, as shown in FIG. 2, 220). The glass-based articles of one or more embodiments of this disclosure do not exhibit such a stress profile having a flat or zero slope stress profile along these thickness ranges, as shown in FIG. 3.

In one or more embodiments, the glass-based article exhibits a stress profile in a thickness range from about 0.1·t to 0.3·t and from about 0.7·t to 0.9·t that comprises a tangent with a maximum slope and a minimum slope. In some instances, the difference between the maximum slope and the minimum slope is about 3.5 MPa/micrometers or less, about 3 MPa/micrometers or less, about 2.5 MPa/micrometers or less, or about 2 MPa/micrometers or less.

In one or more embodiments, the glass-based article includes a stress profile 312 that is substantially free of any flat segments that extend in a depth direction or along at least a portion of the thickness t of the glass-based article. In other words, the stress profile 312 is substantially continuously increasing or decreasing along the thickness t. In some embodiments, the stress profile is substantially free of any flat segments in a depth direction having a length of about 10 micrometers or more, about 50 micrometers or more, or about 100 micrometers or more, or about 200 micrometers or more. As used herein, the term "flat" refers to a slope having a magnitude of less than about 0.5 MPa/micrometer, or less than about 0.2 MPa/micrometer along the flat segment. In some embodiments, one or more portions of the stress profile that are substantially free of any flat segments in a depth direction are present at depths within the glass-based article of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of flat segments. As used herein "linear" includes line segments having flat slope as well as line segments not having flat slopes; for example of the latter, see FIG. 33 within a depth of about 12 microns from the surface.

In some embodiments, the stress profile may include linear segments at depths from about 0t up to about 0.1t and may be substantially free of flat segments at depths of about 0.1t to about 0.4t. In some embodiments, the stress profile for a thickness in the range from about 0t to about 0.1t may have a slope whose magnitude (in absolute value) is in the range from about 20 MPa/micron to about 200 MPa/micron. As will be described herein, such embodiments may be formed using a single ion-exchange process by which the bath includes two or more alkali salts or is a mixed alkali salt bath or multiple (e.g., 2 or more) ion exchange processes.

In one or more embodiments, the glass-based article may be described in terms of the shape of the stress profile along the CT region (327 in FIG. 3). For example, in some embodiments, the stress profile along the CT region (where stress is in tension) may be approximated by equation. In some embodiments, the stress profile along the CT region may be approximated by Equation (1):

$$\text{Stress}(x) = \text{Max}T - (((CT_n \cdot (n+1))/0.5^n) \cdot |(x/t) - 0.5|^n) \quad (1)$$

Figure 4:
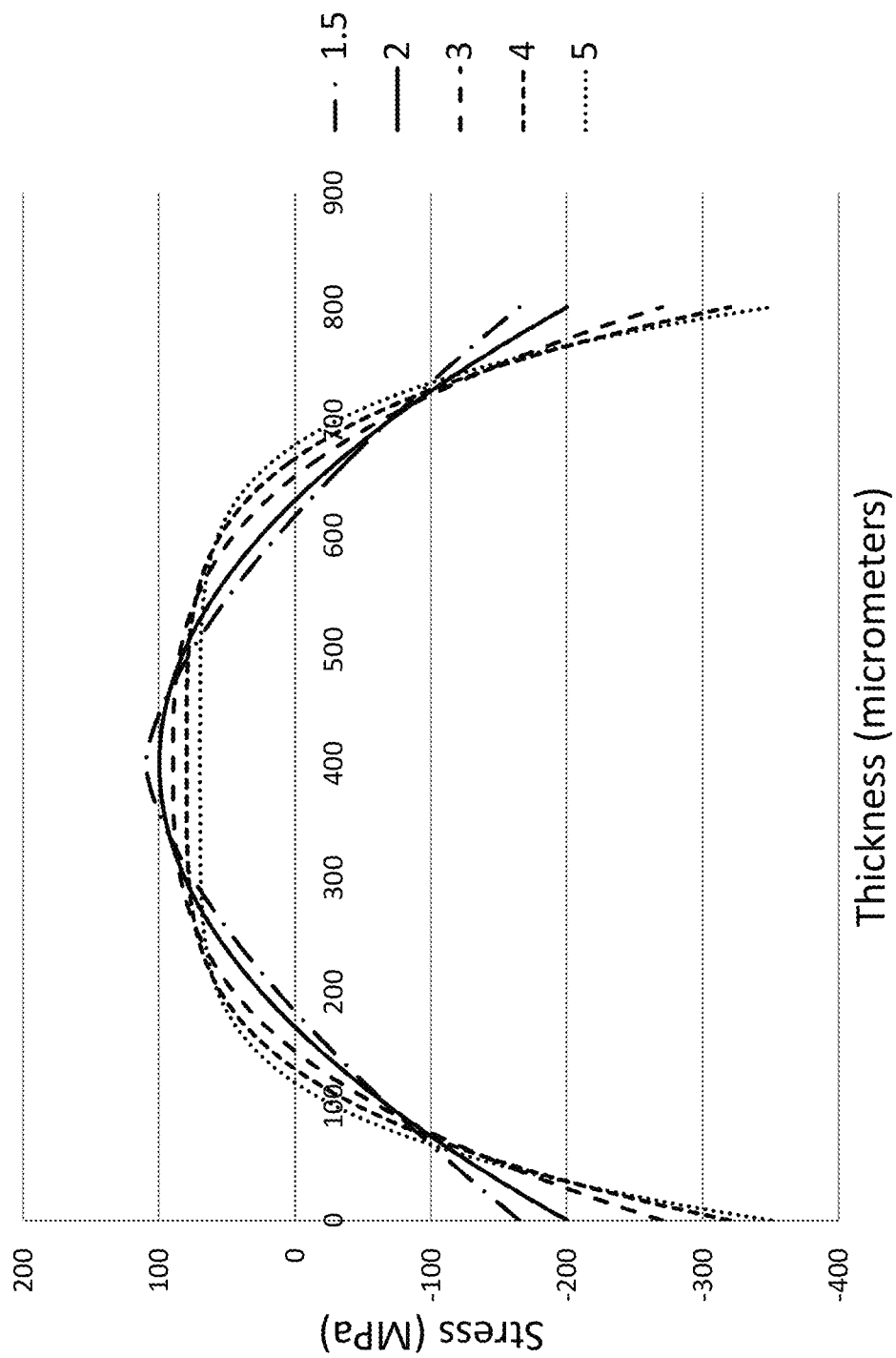
FIG. 4 is a graph illustrating various stress profiles according to one or more embodiments of this disclosure

In Equation (1), the stress (x) is the stress value at position x. Here the stress is positive (tension). In Equation (1), MaxT is the maximum tension value and $CT_n$ is the tension value at n and is less than or equal to MaxT. Both MaxT and $CT_n$ are positive values in units of MPa. The value x is position along the thickness (t) in micrometers, with a range from 0 to t; x=0 is one surface (302, in FIG. 3), x=0.5t is the center of the glass-based article (at which position, stress (x)=MaxT), and x=t is the opposite surface (304, in FIG. 3). MaxT used in Equation (1) is equivalent to the maximum CT, which may be greater than or equal to about $71.5/\sqrt{(t)}$. In some embodiments, the MaxT used in Equation (1) may be in the range from greater than about 80 MPa to about 100 MPa (e.g., from about 85 MPa to about 100 MPa, from about 90 MPa to about 100 MPa, from greater than about 80 MPa to about 95 MPa, from greater than about 80 to about 90 MPa, or from about 85 MPa to about 95 MPa), and n is a fitting parameter from 1.5 to 5 (e.g., 2 to 4, 2 to 3 or 1.8 to 2.2) or from about 1.5 to about 2. In one or more embodiments, n=2 can provide a parabolic stress profile, exponents that deviate from n=2 provide stress profiles with near parabolic stress profiles. FIG. 4 is a graph illustrating various stress profiles according to one or more embodiments of this disclosure, based on changes in the fitting parameter n.

In one or more embodiments, CTn may be less than MaxT where there is a compressive stress spike on one or both major surfaces of the glass-based article. In one or more embodiments, CTn is equal to MaxT when there is no compressive stress spike on one or both major surfaces of the glass-based article.

In some embodiments, the stress profile may be modified by heat treatment. In such embodiments, the heat treatment may occur before any ion-exchange processes, between ion-exchange processes, or after all ion-exchange processes. In some embodiments, the heat treatment may reduce the absolute value of the magnitude of the slope of the stress profile at or near the surface. In some embodiments, where a steeper or greater slope is desired at the surface, an ion-exchange process after the heat treatment may be utilized to provide a "spike" or to increase the slope of the stress profile at or near the surface.

In one or more embodiments, the stress profile 312 is generated due to a non-zero concentration of a metal oxide(s) that varies along a portion of the thickness. As mentioned above, the variation in metal oxide concentration may be referred to herein as a metal oxide concentration gradient. In some embodiments, the concentration of a metal oxide is non-zero and varies, both along a thickness range from about 0·t to about 0.3·t. In some embodiments, the concentration of the metal oxide is non-zero and varies along a thickness range from about 0·t to about 0.35·t, from about 0·t to about 0.4·t, from about 0·t to about 0.45·t or from about 0·t to about 0.48·t. The metal oxide may be described as generating a stress in the glass-based article. The variation in concentration may be continuous along the above-referenced thickness ranges. Variation in concentration may include a change in metal oxide concentration of about 0.2 mol % along a thickness segment of about 100 micrometers. This change may be measured by known methods in the art including microprobe, as shown in Example 1. The metal oxide that is non-zero in concentration and varies along a portion of the thickness may be described as generating a stress in the glass-based article.

The variation in concentration may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a value at a point between the first surface and the second surface and increases from the value to the second surface.

The concentration of metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while the at deeper depths, the concentration of ions having a smaller radius is greater than the concentration of ions having larger radius. For example, where a single Na− and K− containing bath is used in the ion exchange process, the concentration of K+ ions in the glass-based article is greater than the concentration of Na+ ions at shallower depths, while the concentration of Na+ is greater than the concentration of K+ ions at deeper depths. This is due, in part, due to the size of the monovalent ions that are exchanged into the glass for smaller monovalent ions. In such glass-based articles, the area at or near the surface comprises a greater CS due to the greater amount of larger ions (i.e., K+ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius of the first alkali metal ion. The second metal ion is present in the glass-based substrate as an oxide thereof (e.g., $Na_2O$, $K_2O$, $Rb_2O$, $Cs_2O$ or a combination thereof).

In one or more embodiments, the metal oxide concentration gradient extends through a substantial portion of the thickness t or the entire thickness t of the glass-based article, including the CT layer 327. In one or more embodiments, the concentration of the metal oxide is about 0.5 mol % or greater in the CT layer 327. In some embodiments, the concentration of the metal oxide may be about 0.5 mol % or greater (e.g., about 1 mol % or greater) along the entire thickness of the glass-based article, and is greatest at the first surface 302 and/or the second surface 304 and decreases substantially constantly to a value at a point between the first surface 302 and the second surface 304. At that point, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. In some embodiments, the lowest concentration in the particular metal oxide is in the CT layer 327. The total concentration of the particular metal oxide in the glass-based article may be in the range from about 1 mol % to about 20 mol %.

In one or more embodiments, the glass-based article includes a first metal oxide concentration and a second metal oxide concentration, such that the first metal oxide concentration is in the range from about 0 mol % to about 15 mol % along a first thickness range from about 0t to about 0.5t, and the second metal oxide concentration is in the range from about 0 mol % to about 10 mol % from a second thickness range from about 0 micrometers to about 25 micrometers (or from about 0 micrometers to about 12 micrometers); however, the concentration of one or both the first metal oxide and the second metal oxide is non-zero along a substantial portion or the entire thickness of the glass-based article. The glass-based article may include an optional third metal oxide concentration. The first metal oxide may include $Na_2O$ while the second metal oxide may include $K_2O$.

The concentration of the metal oxide may be determined from a baseline amount of the metal oxide in the glass-based article prior to being modified to include the concentration gradient of such metal oxide.

In one or more embodiments, the glass-based articles may be described in terms of how they fracture and the fragments that result from such fracture, as measured by the "Frangibility Test", as described Z. Tang, et al. *Automated Apparatus for Measuring the Frangibility and Fragmentation of Strengthened Glass*. Experimental Mechanics (2014) 54:903-912. In one or more embodiments, when fractured, the glass-based articles fracture into 2 or more fragments per square inch (or per 6.4516 square centimeters) of the glass-based article (prior to fracture). In some cases, the glass-based articles fracture into 3 or more, 4 or more, 5 or more, or 10 or more fragments per square inch (or per 6.4516 square centimeters) of the glass-based article (prior to fracture). In some instances, when fractured, the glass-based articles fracture into fragments such that 50% or more of the fragments have a surface area that is less than 5%, less than 2%, or less than 1% of the surface area of the glass-based article (prior to fracture), and the sample size used was 5.08 cm by 5.08 cm (2 inch by 2 inch) square. In some embodiments, when fractured, the glass-based articles fracture into fragments such that 90% or more or even 100% of the fragments have a surface area that is less than 5%, less than 2%, or less than 1% of the surface area of the glass-based article (prior to fracture).

In one or more embodiments, after chemically strengthening the glass-based article, the resulting stress profile 312 of the glass-based article provides improved fracture resistance. For example, in some embodiments, upon fracture, the glass-based article comprises fragments having an average longest cross-sectional dimension of less than or equal to about 2·t (e.g., 1.8·t, 1.6·t, 1.5·t, 1.4·t, 1.2·t or 1.·t or less) as measured by the "Frangibility Test", as described Z. Tang, et al. *Automated Apparatus for Measuring the Frangibility and Fragmentation of Strengthened Glass*. Experimental Mechanics (2014) 54:903-912. The number of fragments is divided by the area of the sample being tested (in square inches), and the sample size used was 5.08 cm by 5.08 cm (2 inch by 2 inch) square.

In one or more embodiments, the glass-based articles may exhibit a fracture toughness ($K_{1C}$) of about 0.65 MPa·m$^{1/2}$ or greater. In some cases, the fracture toughness may be about 0.69 MPa·m$^{1/2}$ or greater, about 0.7 MPa·m$^{1/2}$ or greater, about 0.8 MPa·m"2 or greater, or about 0.9 MPa·m$^{1/2}$ or greater. In some embodiments the fracture toughness may be in the range from about 0.65 MPa·m$^{1/2}$ to about 1 MPa·m$^{1/2}$. The fracture toughness value ($K_{1C}$) recited in this disclosure refers to a value as measured by chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992).

In some embodiments, the substrate may also be characterized as having a hardness from about 500 HVN to about 800 HVN (kgf/mm2), as measured by Vicker's hardness test at a load of 200 g. In some embodiments, the glass-based article may include a Vicker's hardness is in the range from about 600 HVN to about 800 HVN.

The glass-based articles described herein may exhibit a stored tensile energy in the range from greater than 0 J/m² to about 40 J/m². In some instances, the stored tensile energy may be in the range from about 5 J/m² to about 40 J/m², from about 10 J/m² to about 40 J/m², from about 15 J/m² to about 40 J/m², from about 20 J/m² to about 40 J/m², from about 1 J/m² to about 35 J/m², from about 1 J/m² to about 30 J/m², from about 1 J/m² to about 25 J/m², from about 1 J/m² to about 20 J/m², from about 1 J/m² to about 15 J/m², from about 1 J/m² to about 10 J/m², from about 10 J/m² to about 30 J/m², from about 10 J/m² to about 25 J/m², from about 15 J/m² to about 30 J/m², from about 15 J/m² to about 25 J/m², from about 18 J/m² to about 22 J/m², from about 25 J/m² to about 40 J/m², or from about 25 J/m² to about 30 J/m². The thermally and chemically strengthened glass-based articles of one or more embodiments may exhibit a stored tensile energy of about 6 J/m² or greater, about 10 J/m² or greater, about 15 J/m² or greater, or about 20 J/m² or greater.

Stored tensile energy may be calculated using the following Equation (2):

$$\text{stored tensile energy } (J/m^2) = [(1-v)/E]f(\sigma^2)(dt) \qquad (2)$$

where $v$ is Poisson's ratio, $E$ is the Young's modulus (in MPa), $\sigma$ is stress (in MPa) and the integration is computed across the thickness (in microns) of the tensile region only. Each of the Young's modulus values recited in this disclosure refers to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

The glass-based articles described herein generally have a Young's modulus of about 70 GPa or greater (e.g., in the range from about 70 GPa to about 100 GPa, from about 72 GPa to about 100 GPa, from about 75 GPa to about 100 GPa, from about 76 GPa to about 100 GPa, from about 78 GPa to about 100 GPa, from about 80 GPa to about 100 GPa, from about 82 GPa to about 100 GPa, from about 84 GPa to about 100 GPa, from about 86 GPa to about 100 GPa, from about 88 GPa to about 100 GPa, from about 90 GPa to about 100 GPa, from about 70 GPa to about 95 GPa, from about 70 GPa to about 90 GPa, from about 70 GPa to about 88 GPa, from about 70 GPa to about 86 GPa, from about 70 GPa to about 85 GPa, from about 70 GPa to about 84 GPa, from about 70 GPa to about 82 GPa, or from about 70 GPa to about 80 GPa). The Young's modulus, which is intrinsic to the composition of the glass-based article, can provide the desired high stiffness, which is an extrinsic property, to the ultimate glass-based article that is produced therefrom.

In some embodiments, the glass-based article comprises a low liquidus viscosity that enables the formation of the glass-based articles via thin rolling techniques. As used herein, the term "liquidus viscosity" refers to the viscosity of a molten glass at the liquidus temperature, wherein the term "liquidus temperature" refers to the temperature at which crystals first appear as a molten glass cools down from the melting temperature (or the temperature at which the very last crystals melt away as temperature is increased from room temperature). In general, the glass-based articles (or the compositions used to form such articles) described herein a liquidus viscosity of less than about 100 kilopoise (kP). In some embodiments, the glass-based articles (or the compositions used to form such articles) exhibit a liquidus viscosity of less than about 80 kP, less than about 60 kP, less than about 40 kP, less than about 30 kP (e.g., in the range from about 15 kP to about 30 kP). The liquidus viscosity is determined by the following method. First the liquidus temperature of the glass is measured in accordance with ASTM C829-81 (2015), titled "Standard Practice for Measurement of Liquidus Temperature of Glass by the Gradient Furnace Method". Next the viscosity of the glass at the liquidus temperature is measured in accordance with ASTM C965-96 (2012), titled "Standard Practice for Measuring Viscosity of Glass Above the Softening Point".

In one or more embodiments, the glass-based articles exhibit a Knoop Lateral Cracking Scratch Threshold in the range from about 4 N to about 7 N, from about 4.5 N to about 7 N, from about 5 N to about 7 N, from about 4 N to about 6.5 N, from about 4 N to about 6 N, or from about 5 N to about 6 N. As used herein, Knoop Scratch Lateral Cracking Threshold is the onset of lateral cracking (in 3 or more of 5 scratch events). A series of increasing constant load scratches (3 minimum per load, but more per load could be used to increase confidence level) are performed to identify the Knoop scratch threshold. In Knoop Scratch Lateral Cracking Threshold testing, for each load, samples of the glass substrates and/or articles were scratched with a Knoop indenter over a length of 10 mm with a velocity of 0.25 mm/s. The Knoop scratch threshold range can be determined by comparing the test specimen to one of the following 3 failure modes: 1) sustained lateral surface cracks that are more than two times the width of the groove, 2) damage is contained within the groove, but there are lateral surface cracks that are less than two times the width of groove and there is damage visible by naked eye, or 3) the presence of large subsurface lateral cracks which are greater than two times the width of the groove and/or there is a median crack at the vertex of the scratch. The scratch threshold is then the highest load at which failure does not occur in 3 or more of 5 events.

In one or more embodiments, the glass-based articles exhibit a Vicker's Indentation Fracture Threshold in the range from about 10 kgf or greater, about 12 kgf or greater, or about 15 kgf or greater. In some instances, the glass-based articles exhibit a Vicker's Indentation Fracture Threshold in the range from about 15 kgf to about 25 kgf. As used herein, Vicker's Indentation Fracture Threshold is the onset of median/radial cracking (in 3 or more of 5 indentation events) extending from at least one corner of the indentation site. In Vicker's Indentation Fracture Threshold testing, samples of the glass substrates and articles were repeatedly indented with a diamond tip (at 136° angle) at increasing loads. Each indentation has the potential to produce 4 radial cracks, one from each corner of the indent. By counting the average number of radial cracks at each indentation load, the cracking threshold is the load at which there is an average of 2 cracks per indent (or the 50% cracking threshold).

In one or more embodiments, the glass-based articles exhibit improved surface strength when subjected to abraded ring-on-ring (AROR) testing. The strength of a material is the stress at which fracture occurs. The AROR test is a surface strength measurement for testing flat glass specimens, and ASTM C1499-09 (2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety. In one embodiment, the glass specimen is abraded prior to ring-on-ring testing with 90 grit silicon carbide (SiC) particles that are delivered to the glass sample using the method and apparatus described in Annex A2, entitled "abrasion Procedures," of ASTM C158-02 (2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass-based article is abraded as described in ASTM C158-02, Annex 2, to normalize and/or control the surface defect condition of the sample using the apparatus shown in Figure A2.1 of ASTM C158-02. The abrasive material is typically sandblasted onto the surface 110 of the glass-based article at a load of 15 psi using an air pressure of 304 kPa (44 psi); although in the Examples below, the abrasive material was sandblasted onto the surface 110 at other loads (e.g., 25 psi or 45 psi). After air flow is established, 5 cm$^3$ of abrasive material is dumped into a funnel and the sample is sandblasted for 5 seconds after introduction of the abrasive material.

Figure 5:
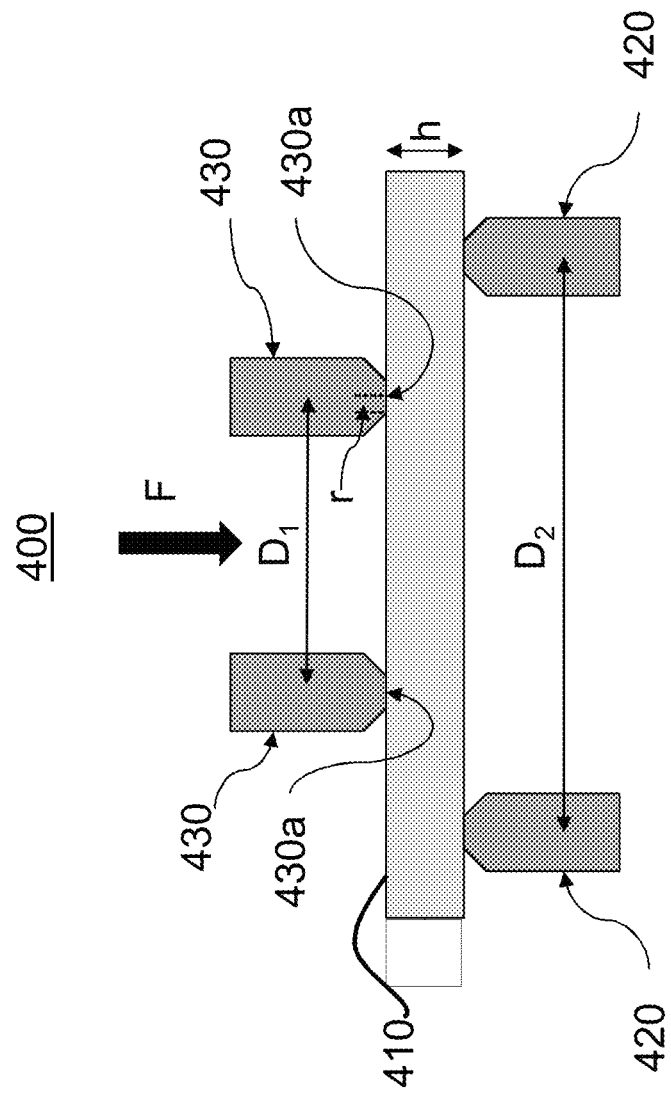
FIG. 5 is a is a schematic cross-sectional view of a ring-on-ring apparatus.

For the AROR test, a glass-based article having at least one abraded surface 410 as shown in FIG. 5 is placed between two concentric rings of differing size to determine equibiaxial flexural strength (i.e., the maximum stress that a material is capable of sustaining when subjected to flexure between two concentric rings), as also shown in FIG. 5. In the AROR configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from about 0.2 to about 0.5. In some embodiments, D1/D2 is about 0.5. Loading and support rings 130, 120 should be aligned concentrically to within 0.5% of support ring diameter D2. The load cell used for testing should be accurate to within ±1% at any load within a selected range. In some embodiments, testing is carried out at a temperature of 23±2° C. and a relative humidity of 40±10%.

For fixture design, the radius r of the protruding surface of the loading ring 430, $h/2 \leq r \leq 3h/2$, where h is the thickness of glass-based article 410. Loading and support rings 430, 420 are typically made of hardened steel with hardness HRc >40. AROR fixtures are commercially available.

The intended failure mechanism for the AROR test is to observe fracture of the glass-based article 410 originating from the surface 430a within the loading ring 430. Failures that occur outside of this region—i.e., between the loading rings 430 and support rings 420—are omitted from data analysis. Due to the thinness and high strength of the glass-based article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. AROR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore generally be used as a statistical representation of the data obtained.

In some embodiments, the glass-based articles described herein have a surface or equibiaxial flexural strength of 20 kgf or more, and up to about 30 kgf as determined by AROR testing using a load of 25 psi or even 45 psi to abrade the surface. In other embodiments, the surface strength is 25 kgf or more, and in still other embodiments, 30 kgf or more.

Figure 6:
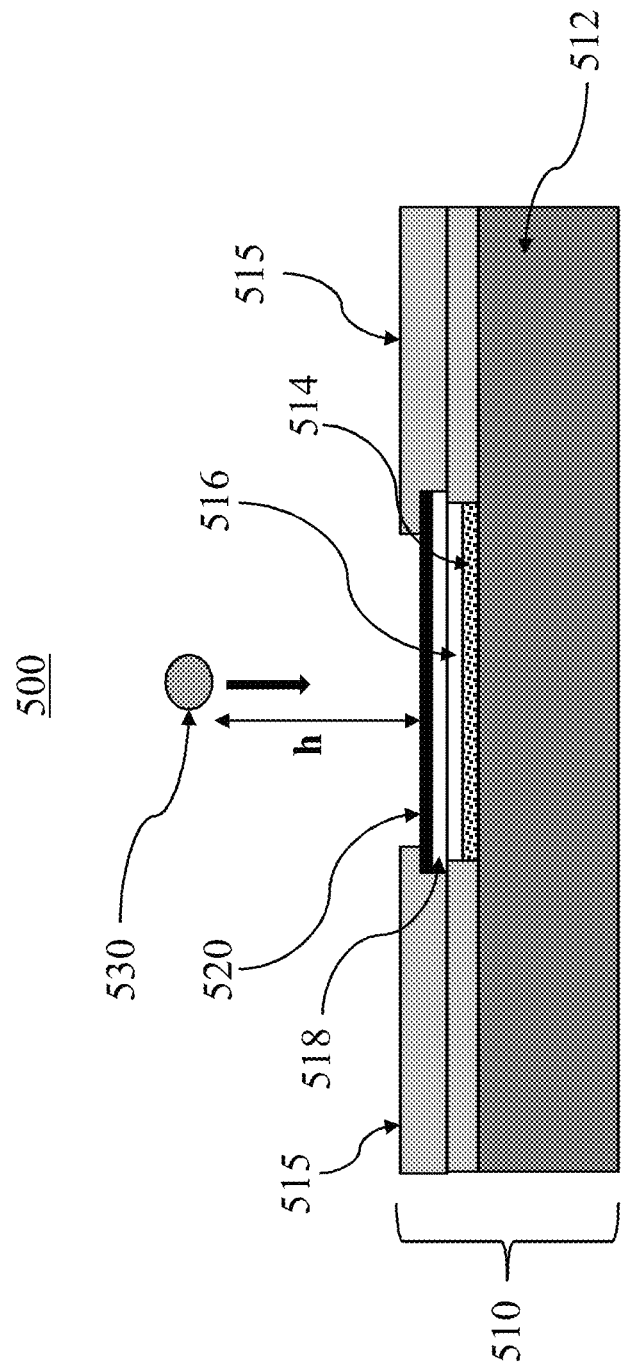
FIG. 6 is a schematic cross-sectional view of an embodiment of the apparatus that is used to perform the inverted ball on sandpaper (IBoS) test described in the present disclosure.
Figure 7:
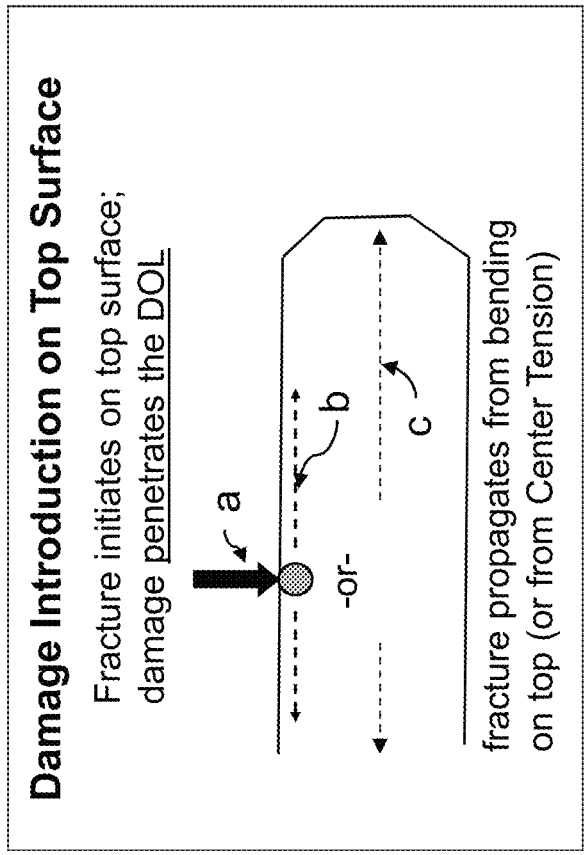
FIG. 7 is a schematic cross-sectional representation of the dominant mechanism for failure due to damage introduction plus bending that typically occurs in glass-based articles that are used in mobile or hand held electronic devices.

In some embodiments, the glass-based articles described herein may be described in terms of performance in an inverted ball on sandpaper (IBoS) test. The IBoS test is a dynamic component level test that mimics the dominant mechanism for failure due to damage introduction plus bending that typically occurs in glass-based articles that are used in mobile or hand held electronic devices, as schematically shown in FIG. 6. In the field, damage introduction (a in FIG. 7) occurs on the top surface of the glass-based article. Fracture initiates on the top surface of the glass-based article and damage either penetrates the glass-based article (b in FIG. 7) or the fracture propagates from bending on the top surface or from the interior portions of the glass-based article (c in FIG. 7). The IBoS test is designed to simultaneously introduce damage to the surface of the glass and apply bending under dynamic load. In some instances, the glass-based article exhibits improved drop performance when it includes a compressive stress than if the same glass-based article does not include a compressive stress.

An IBoS test apparatus is schematically shown in FIG. 6. Apparatus 500 includes a test stand 510 and a ball 530. Ball 530 is a rigid or solid ball such as, for example, a stainless steel ball, or the like. In one embodiment, ball 530 is a 4.2 gram stainless steel ball having diameter of 10 mm. The ball 530 is dropped directly onto the glass-based article sample 518 from a predetermined height h. Test stand 510 includes a solid base 512 comprising a hard, rigid material such as granite or the like. A sheet 514 having an abrasive material disposed on a surface is placed on the upper surface of the solid base 512 such that surface with the abrasive material faces upward. In some embodiments, sheet 514 is sandpaper having a 30 grit surface and, in other embodiments, a 180 grit surface. The glass-based article sample 518 is held in place above sheet 514 by sample holder 515 such that an air gap 516 exists between glass-based article sample 518 and sheet 514. The air gap 516 between sheet 514 and glass-based article sample 518 allows the glass-based article sample 518 to bend upon impact by ball 530 and onto the abrasive surface of sheet 514. In one embodiment, the glass-based article sample 218 is clamped across all corners to keep bending contained only to the point of ball impact and to ensure repeatability. In some embodiments, sample holder 514 and test stand 510 are adapted to accommodate sample thicknesses of up to about 2 mm. The air gap 516 is in a range from about 50 μm to about 100 μm. Air gap 516 is adapted to adjust for difference of material stiffness (Young's modulus, Emod), but also includes the Young's modulus and thickness of the sample. An adhesive tape 520 may be used to cover the upper surface of the glass-based article sample to collect fragments in the event of fracture of the glass-based article sample 518 upon impact of ball 530.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. In some embodiments, sandpaper having 30 grit may be used, as it has a surface topography that is more consistent than either concrete or asphalt, and a particle size and sharpness that produces the desired level of specimen surface damage.

Figure 8:
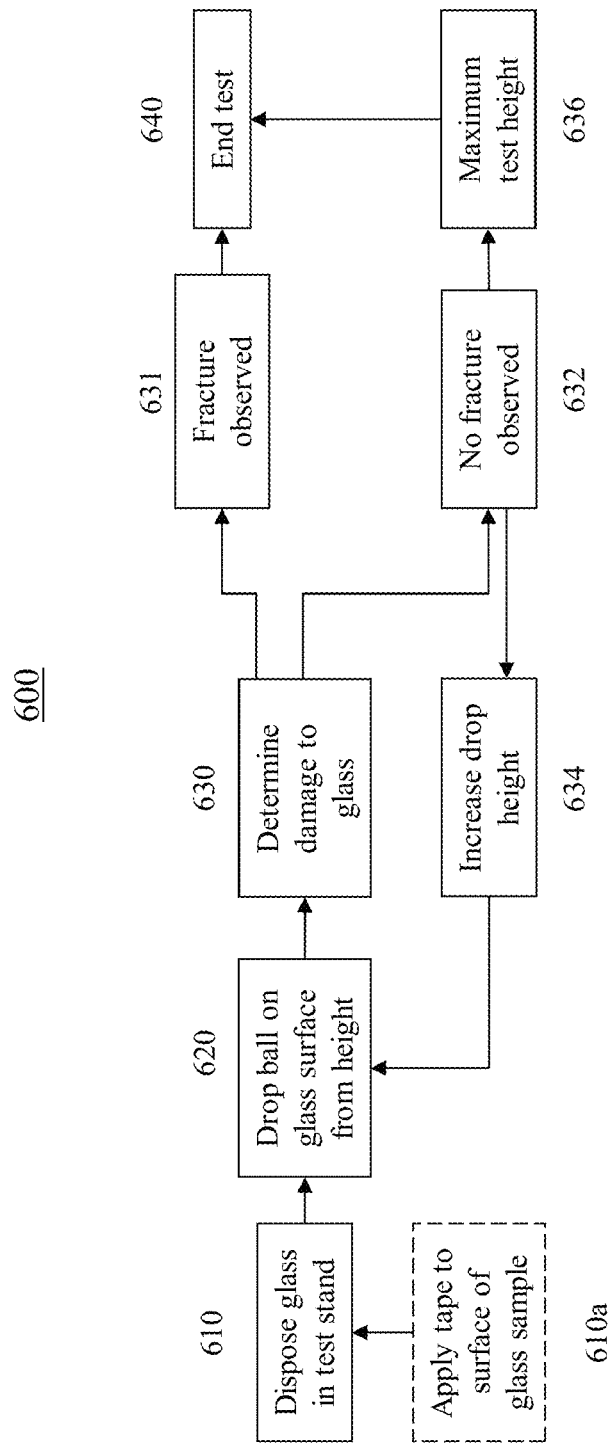
FIG. 8 is a flow chart for a method of conducting the IBoS test in the apparatus described herein.

In one aspect, a method 600 of conducting the IBoS test using the apparatus 500 described hereinabove is shown in FIG. 8. In Step 610, a glass-based article sample (218 in FIG. 6) is placed in the test stand 510, described previously and secured in sample holder 515 such that an air gap 516 is formed between the glass-based article sample 518 and sheet 514 with an abrasive surface. Method 600 presumes that the sheet 514 with an abrasive surface has already been placed in test stand 510. In some embodiments, however, the method may include placing sheet 514 in test stand 510 such that the surface with abrasive material faces upward. In some embodiments (Step 610a), an adhesive tape 520 is applied to the upper surface of the glass-based article sample 518 prior to securing the glass-based article sample 518 in the sample holder 510.

In Step 520, a solid ball 530 of predetermined mass and size is dropped from a predetermined height h onto the upper surface of the glass-based article sample 518, such that the ball 530 impacts the upper surface (or adhesive tape 520 affixed to the upper surface) at approximately the center (i.e., within 1 mm, or within 3 mm, or within 5 mm, or within 10 mm of the center) of the upper surface. Following impact in Step 520, the extent of damage to the glass-based article sample 518 is determined (Step 630). As previously described hereinabove, herein, the term "fracture" means that a crack propagates across the entire thickness and/or entire surface of a substrate when the substrate is dropped or impacted by an object.

In method 600, the sheet 518 with the abrasive surface may be replaced after each drop to avoid "aging" effects that have been observed in repeated use of other types (e.g., concrete or asphalt) of drop test surfaces.

Various predetermined drop heights h and increments are typically used in method 600. The test may, for example, utilize a minimum drop height to start (e.g., about 10-20 cm). The height may then be increased for successive drops by either a set increment or variable increments. The test described in method 600 is stopped once the glass-based article sample 518 breaks or fractures (Step 631). Alternatively, if the drop height h reaches the maximum drop height (e.g., about 100 cm) without fracture, the drop test of method 300 may also be stopped, or Step 520 may be repeated at the maximum height until fracture occurs.

In some embodiments, IBoS test of method 600 is performed only once on each glass-based article sample 518 at each predetermined height h. In other embodiments, however, each sample may be subjected to multiple tests at each height.

If fracture of the glass-based article sample 518 has occurred (Step 631 in FIG. 8), the IBoS test according to method 600 is ended (Step 640). If no fracture resulting from the ball drop at the predetermined drop height is observed (Step 632), the drop height is increased by a predetermined increment (Step 634)—such as, for example 5, 10, or 20 cm—and Steps 620 and 630 are repeated until either sample fracture is observed (631) or the maximum test height is reached (636) without sample fracture. When either Step 631 or 636 is reached, the test according to method 600 is ended.

When subjected to the inverted ball on sandpaper (IBoS) test described above, embodiments of the glass-based article described herein have about a 60% or more survival rate when the ball is dropped onto the surface of the glass from a height of 100 cm. For example, a glass-based article is described as having a 60% survival rate when dropped from a given height when three of five identical (or nearly identical) samples (i.e., having approximately the same composition and, when strengthened, approximately the same compressive stress and depth of compression or compressive stress layer, as described herein) survive the IBoS drop test without fracture when dropped from the prescribed height (here 100 cm). In other embodiments, the survival rate in the 80 cm IBoS test of the glass-based articles that are strengthened is about 70% or more, in other embodiments, about 80% or more, and, in still other embodiments, about 90% or more. In other embodiments, the survival rate of the strengthened glass-based articles dropped from a height of 100 cm in the IBoS test is about 60% or more, in other embodiments, about 70% or more, in still other embodiments, about 80% or more, and, in other embodiments, about 90% or more. In one or more embodiments, the survival rate of the strengthened glass-based articles dropped from a height of 150 cm in the IBoS test is about 60% or more, in other embodiments, about 70% or more, in still other embodiments, about 80% or more, and, in other embodiments, about 90% or more.

To determine the survivability rate of the glass-based articles when dropped from a predetermined height using the IBoS test method and apparatus described hereinabove, at least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results. Each sample is dropped a single time from the predetermined height (e.g., 100 cm or 150 cm) or, alternatively, dropped from progressively higher heights without fracture until the predetermined height is reached, and visually (i.e., with the naked eye) examined for evidence of fracture (crack formation and propagation across the entire thickness and/or entire surface of a sample). A sample is deemed to have "survived" the drop test if no fracture is observed after being dropped from the predetermined height, and a sample is deemed to have "failed (or "not survived") if fracture is observed when the sample is dropped from a height that is less than or equal to the predetermined height. The survivability rate is determined to be the percentage of the sample population that survived the drop test. For example, if 7 samples out of a group of 10 did not fracture when dropped from the predetermined height, the survivability rate of the glass would be 70%.

The glass-based articles described herein may be transparent. In one or more the glass-based article may have a thickness of about 3 millimeters or less, for example 1 millimeter or less, and exhibit a transmittance of about 88% or greater over a wavelength in the range from about 380 nm to about 780 nm.

The glass-based article may also exhibit a substantially white color. For example, the glass-based article may exhibit CIELAB color space coordinates, under a CIE illuminant F02, of L* values of about 88 and greater, a* values in the range from about −3 to about +3, and b* values in the range from about −6 to about +6. Alternatively, the glass-based article may exhibit CIELAB color space coordinates, under a CIE illuminant F02, of L* values of about 40 and less, a* values in the range from about −3 to about +3, and b* values in the range from about −6 to about +6. Such color space coordinates may be present under other CIE illuminants (e.g., D65).

Choice of substrates not particularly limited. In some examples, the glass-based article may be described as having a high cation diffusivity for ion exchange. In one or more embodiments, the glass or glass-ceramic has fast ion-exchange capability, i.e., the glass or glass-ceramic exhibits a monovalent ion diffusivity that is about 450 μm²/hour or greater at 460° C. or is about 500 μm²/hour or greater at 460° C. In one or more embodiments, the glass or glass-ceramic exhibits a sodium ion diffusivity that is about 450 μm²/hour or greater at 460° C. or is about 500 μm²/hour or greater at 460° C. In one or more embodiments, the glass or glass-ceramic exhibits a potassium ion diffusivity that is about 450 μm²/hour or greater at 460° C. or is about 500 μm²/hour or greater at 460° C.

The glass-based article may include an amorphous substrate, a crystalline substrate or a combination thereof (e.g., a glass-ceramic substrate). In one or more embodiments, the glass-based article substrate (prior to being chemically strengthened as described herein) may include a glass composition, in mole percent (mole %), including: $SiO_2$ in the range from about 40 to about 80, $Al_2O_3$ in the range from about 10 to about 30, $B_2O_3$ in the range from about 0 to about 10, $R_2O$ in the range from about 0 to about 20, and RO in the range from about 0 to about 15. As used herein, $R_2O$ refers to the total amount of alkali metal oxides such as $Li_2O$, $Na_2O$, $K_2O$, $Rb_2O$, and $Cs_2O$. As used herein RO refers to the total amount of alkaline earth metal oxides such as MgO, CaO, SrO, BaO, ZnO and the like. In some instances, the composition may include either one or both of $ZrO_2$ in the range from about 0 mol % to about 5 mol % and $P_2O_5$ in the range from about 0 to about 15 mol %. $TiO_2$ can be present from about 0 mol % to about 2 mol %.

In some embodiments, the glass composition may include $SiO_2$ in an amount, in mol %, in the range from about 45 to about 80, from about 45 to about 75, from about 45 to about 70, from about 45 to about 65, from about 45 to about 60, from about 45 to about 65, from about 45 to about 65, from about 50 to about 70, from about 55 to about 70, from about 60 to about 70, from about 70 to about 75, from about 70 to about 72, or from about 50 to about 65.

In some embodiments, the glass composition may include $Al_2O_3$ in an amount, in mol %, in the range from about 5 to about 28, from about 5 to about 26, from about 5 to about 25, from about 5 to about 24, from about 5 to about 22, from about 5 to about 20, from about 6 to about 30, from about 8 to about 30, from about 10 to about 30, from about 12 to about 30, from about 12 to about 18, or from about 12 to about 14.

In one or more embodiments, the glass composition may include $B_2O_3$ in an amount, in mol %, in the range from about 0 to about 8, from about 0 to about 6, from about 0 to about 4, from about 0.1 to about 8, from about 0.1 to about 6, from about 0.1 to about 4, from about 1 to about 10, from about 2 to about 10, from about 4 to about 10, from about 2 to about 8, from about 0.1 to about 5, or from about 1 to about 3. In some instances, the glass composition may be substantially free of $B_2O_3$. As used herein, the phrase "substantially free" with respect to the components of the composition means that the component is not actively or intentionally added to the composition during initial batching, but may be present as an impurity in an amount less than about 0.001 mol %.

In some embodiments, the glass composition may include one or more alkali earth metal oxides, such as MgO, CaO and ZnO. In some embodiments, the total amount of the one or more alkali earth metal oxides may be a non-zero amount up to about 15 mol %. In one or more specific embodiments, the total amount of any of the alkali earth metal oxides may be a non-zero amount up to about 14 mol %, up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkali earth metal oxides may be in the range from about 0.1 to 10, from about 0.1 to 8, from about 0.1 to 6, from about 0.1 to 5, from about 1 to 10, from about 2 to 10, or from about 2.5 to 8. The amount of MgO may be in the range from about 0 mol % to about 5 mol % (e.g., from about 2 mol % to about 4 mol %). The amount of ZnO may be in the range from about 0 to about 2 mol % (e.g., from about 0.1 mol % to about 2 mol %, from about 0.1 mol % to about 1 mol % or from about 0.5 mol % to about 1.5 mol %). The amount of CaO may be from about 0 mol % to about 2 mol %. In one or more embodiments, the glass composition may include MgO and may be substantially free of CaO and ZnO. In one variant, the glass composition may include any one of CaO or ZnO and may be substantially free of the others of MgO, CaO and ZnO. In one or more specific embodiments, the glass composition may include only two of the alkali earth metal oxides of MgO, CaO and ZnO and may be substantially free of the third of the earth metal oxides.

The total amount, in mol %, of alkali metal oxides $R_2O$ in the glass composition may be in the range from about 5 to about 20, from about 5 to about 18, from about 5 to about 16, from about 5 to about 15, from about 5 to about 14, from about 5 to about 12, from about 5 to about 10, from about 5 to about 8, from about 5 to about 20, from about 6 to about 20, from about 7 to about 20, from about 8 to about 20, from about 8 to about 18, from about 8 to about 16, from about 8 to about 14, from about 8 to about 12, or from about 8 to about 11.

In one or more embodiments, the glass composition includes $Na_2O$ in an amount in the range from about 0 mol % to about 18 mol %, from about 0 mol % to about 16 mol % or from about 0 mol % to about 14 mol %, from about 0 mol % to about 12 mol %, from about 1 mol % to about 18 mol %, from about 1 mol % to about 16 mol %, from about 1 mol % to about 14 mol %, from about 1 mol % to about 12 mol %, from about 1 mol % to about 10 mol %, from about 1 mol % to about 8 mol %, from about 1 mol % to about 5 mol %, from about 1 mol % to about 4 mol %, or from about 1 mol % to about 3 mol %. In some embodiments, the composition may include less than about 4 mol % $Na_2O$.

In some embodiments, the amount of $Li_2O$ and $Na_2O$ is controlled to a specific amount or ratio to balance formability and ion exchangeability. For example, as the amount of $Li_2O$ increases, the liquidus viscosity may be reduced, thus preventing some forming methods from being used; however, such glass compositions are ion exchanged to deeper DOC levels, as described herein. The amount of $Na_2O$ can modify liquidus viscosity but can inhibit ion exchange to deeper DOC levels. In one or more embodiments, for sufficient stress at depth in $Li_2O$ containing glass compositions (or those compositions where an Na+ for Li+ exchange is the primary strengthening mechanism), the glass composition of one or more embodiments includes the compositional ratio of $Li_2O/(R_2O)$ of greater than about 0.3, about 0.45 or greater, about 0.5 or greater, or about 0.7 or greater. To maintain higher CS values at deeper depths in the glass-based articles described herein, and especially in such glass-based articles that include $Na_2O$ (or those compositions where a K+ for Na+ exchange is the primary strengthening mechanism), the glass composition of one or more embodiments may include the compositional ratio of $Na_2O/(R_2O)$ of greater than about 0.3, about 0.5 or greater, or about 0.7 or greater.

In one or more embodiments, the glass composition may include $K_2O$ in an amount less than about 5 mol %, less than about 4 mol %, less than about 3 mol %, less than about 2 mol %, or less than about 1 mol %. In one or more alternative embodiments, the glass composition may be substantially free, as defined herein, of $K_2O$.

In one or more embodiments, the glass composition may include $Li_2O$ in an amount about 0 mol % to about 18 mol %, from about 0 mol % to about 15 mol % or from about 0 mol % to about 10 mol %, from about 0 mol % to about 8 mol %, from about 0 mol % to about 6 mol %, from about 0 mol % to about 4 mol % or from about 0 mol % to about 2 mol %. In some embodiments, the glass composition may include $Li_2O$ in an amount about 2 mol % to about 10 mol %, from about 4 mol % to about 10 mol %, from about 6 mol % to about 10 mol, or from about 5 mol % to about 8 mol %. In one or more alternative embodiments, the glass composition may be substantially free, as defined herein, of $Li_2O$.

In one or more embodiments, the glass composition may include $Fe_2O_3$. In such embodiments, $Fe_2O_3$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $Fe_2O_3$.

In one or more embodiments, the glass composition may include $ZrO_2$. In such embodiments, $ZrO_2$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $ZrO_2$.

In one or more embodiments, the glass composition may include $P_2O_5$ in a range from about 0 mol % to about 10 mol %, from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 2 mol % to about 8 mol %, from about 2 mol % to about 6 mol % or from about 2 mol % to about 4 mol %. In some instances, the glass composition may be substantially free of $P_2O_5$.

In one or more embodiments, the glass composition may include $TiO_2$. In such embodiments, $TiO_2$ may be present in an amount less than about 6 mol %, less than about 4 mol %, less than about 2 mol %, or less than about 1 mol %. In one or more alternative embodiments, the glass composition may be substantially free, as defined herein, of $TiO_2$. In some embodiments, $TiO_2$ is present in an amount in the range from about 0.1 mol % to about 6 mol %, or from about 0.1 mol % to about 4 mol %.

In some embodiments, the glass composition may include various compositional relationships. For example, the glass composition may include a ratio of the amount of $Li_2O$ (in mol %) to the total amount of $R_2O$ (in mol %) in the range from about 0 to about 1, from about 0.4 to about 1, from about 0.45 to about 1, from about 0.5 to about 1, or from about 0.6 to about 1.

In some embodiments, the glass composition may include a difference between the total amount of $R_2O$ (in mol %) to the amount of $Al_2O_3$ (in mol %) ($R_2O—Al_2O_3$) in the range from about −5 to about 2 (e.g., from about −5 to about 1.5, from about −5 to about 1, from about −5 to about 0, from about −5 to about −1, from about −5 to about −2, from about −4 to about 2, from about −3 to about 2, from about −2 to about 2 or from about −3 to about −1).

In some embodiments, the glass composition may include a difference between the total amount of $R_xO$ (in mol %) to the amount of $Al_2O_3$ (in mol %) ($R_xO—Al_2O_3$) in the range from about 0 to about 5 (e.g., from about 0 to about 4, from about 0 to about 3, from about 0.1 to about 4, from about 0.1 to about 3, from about 1 to about 3, or from about 1 to about 2). As used herein, RxO includes $R_2O$ and RO, as defined herein.

In some embodiments, the glass composition may include a ratio of the total amount of $R_2O$ (in mol %) to the amount of $Al_2O_3$ (in mol %) ($R_2O/Al_2O_3$) in the range from about −4 to about 5, from about −2 to about 4, or from about 0.1 to about 5. For example, the ratio of the total amount of $R_2O$ (in mol %) to the amount of $Al_2O_3$ (in mol %) ($R_2O/Al_2O_3$) may be in the range from about −4 to about 4.5, from about −4 to about 4, from about −4 to about 3.5, from about −4 to about 3, from about −4 to about 2.5, from about −4 to about 2, from about −4 to about 1.5, from about −4 to about 1, from about −3.5 to about 5, from about −3 to about 5, from about −2.5 to about 5, from about −2 to about 5, from about −1.5 to about 5, from about −1 to about 5, from about 0 to about 5, from about 0 to about 4, from about 0 to about 3, from about 0.1 to about 4, from about 0.1 to about 3, or from about 0.1 to about 2.

In one or more embodiments, the glass composition includes a combined amount of $Al_2O_3$ and $Na_2O$ of about 15 mol % or less (e.g., 14 mol % or less, 13 mol % or less, 12 mol % or less, 11 mol % or less, or about 10.5 mol % or less). The combined amount of $Al_2O_3$ and $Na_2O$ may be greater than about 5 mol %.

The glass composition of one or more embodiments may exhibit a ratio of the amount of MgO (in mol %) to the total amount of RO (in mol %) in the range from about 0 to about 1. In some embodiments, the ratio MgO/RO is in the range from about 0 to about 0.9, from about 0 to about 0.8, from about 0 to about 0.7, from about 0 to about 0.6, from about 0 to about 0.5, from about 0.1 to about 1, from about 0.2 to about 1, from about 0.3 to about 1, from about 0.4 to about 1, or from about 0.5 to about 1.

In some embodiments, glass composition may be substantially free of nucleating agents. Examples of typical nucleating agents are $TiO_2$, $ZrO_2$ and the like. Nucleating agents may be described in terms of function in that nucleating agents are constituents in the glass can initiate the formation of crystallites in the glass.

In some embodiments, the compositions used for the glass substrate may be batched with from about 0 mol % to about 2 mol % of at least one fining agent selected from any one or more of $Na_2SO_4$, NaCl, NaF, NaBr, $K_2SO_4$, KCl, KF, KBr, $As_2O_3$, $Sb_2O_3$, and $SnO_2$. The glass composition according to one or more embodiments may further include $SnO_2$ in the range from about 0 to about 2, from about 0 to about 1, from about 0.1 to about 2, from about 0.1 to about 1, or from about 1 to about 2. The glass compositions disclosed herein may be substantially free of $As_2O_3$ and/or $Sb_2O_3$.

In one or more embodiments, the composition may specifically include 62 mol % to 75 mol % $SiO_2$; 10.5 mol % to about 17 mol % $Al_2O_3$; 5 mol % to about 13 mol % $Li_2O$; 0 mol % to about 4 mol % ZnO; 0 mol % to about 8 mol % MgO; 2 mol % to about 5 mol % $TiO_2$; 0 mol % to about 4 mol % $B_2O_3$; 0 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % $MnO_x$; and 0.05 mol % to about 0.2 mol % $SnO_2$.

In one or more embodiments, the composition may include 67 mol % to about 74 mol % $SiO_2$; 11 mol % to about 15 mol % $Al_2O_3$; 5.5 mol % to about 9 mol % $Li_2O$; 0.5 mol % to about 2 mol % ZnO; 2 mol % to about 4.5 mol % MgO; 3 mol % to about 4.5 mol % $TiO_2$; 0 mol % to about 2.2 mol % $B_2O_3$; 0 mol % to about 1 mol % $Na_2O$; 0 mol % to about 1 mol % $K_2O$; 0 mol % to about 1 mol % $ZrO_2$; 0 mol % to about 4 mol % $P_2O_5$; 0 mol % to about 0.1 mol % $Fe_2O_3$; 0 mol % to about 1.5 mol % $MnO_x$; and 0.08 mol % to about 0.16 mol % $SnO_2$.

In one or more embodiments, the composition may include 70 mol % to 75 mol % $SiO_2$; 10 mol % to about 15 mol % $Al_2O_3$; 5 mol % to about 13 mol % $Li_2O$; 0 mol % to about 4 mol % ZnO; 0.1 mol % to about 8 mol % MgO; 0 mol % to about 5 mol % $TiO_2$; 0.1 mol % to about 4 mol % $B_2O_3$; 0.1 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % $MnO_x$; and 0.05 mol % to about 0.2 mol % $SnO_2$.

Other exemplary compositions of glass-based articles prior to being chemically strengthened, as described herein, are shown in Table 1A. Table 1B lists selected physical properties determined for the examples listed in Table 1A. The physical properties listed in Table 1B include: density; low temperature and high temperature CTE; strain, anneal and softening points; $10^{11}$ Poise, 35 kP, 200 kP, liquidus, and zircon breakdown temperatures; zircon breakdown and liquidus viscosities; Poisson's ratio; Young's modulus; refractive index, and stress optical coefficient. In some embodiments, the glass-based articles and glass substrates described herein have a high temperature CTE of less than or equal to 30 ppm/° C. and/or a Young's modulus of 70 GPa or more and, in some embodiments, a Young's modulus of up to 80 GPa.

TABLE 1A

Exemplary compositions prior to chemical strengthening.

| Mol % | Ex. A | Ex. B | Ex. C | Ex. D | Ex. E | Ex. F |
|---|---|---|---|---|---|---|
| $SiO_2$ | 71.8 | 69.8 | 69.8 | 69.8 | 69.8 | 69.8 |
| $Al_2O_3$ | 13.1 | 13 | 13 | 13 | 13 | 13 |
| $B_2O_3$ | 2 | 2.5 | 4 | 2.5 | 2.5 | 4 |
| $Li_2O$ | 8 | 8.5 | 8 | 8.5 | 8.5 | 8 |
| MgO | 3 | 3.5 | 3 | 3.5 | 1.5 | 1.5 |
| ZnO | 1.8 | 2.3 | 1.8 | 2.3 | 2.3 | 1.8 |
| $Na_2O$ | 0.4 | 0.4 | 0.4 | 0.4 | 0.4 | 0.4 |
| $TiO_2$ | 0 | 0 | 0 | 1 | 1 | 1 |
| $Fe_2O_3$ | 0 | 0 | 0 | 0.8 | 0.8 | 0.8 |
| $SnO_2$ | 0.1 | 0.1 | 0.1 | 0.1 | 0.1 | 0.1 |

| Mol % | Ex. G | Ex. H | Ex. I | Ex. J | Ex. K | Ex. L | Ex. M | Ex. N |
|---|---|---|---|---|---|---|---|---|
| $SiO_2$ | 70.18 | 70.91 | 71.28 | 71.65 | 71.65 | 71.65 | 74.77 | 72.00 |
| $Al_2O_3$ | 12.50 | 12.78 | 12.93 | 13.07 | 13.07 | 13.07 | 10.00 | 12.50 |
| $B_2O_3$ | 1.91 | 1.95 | 1.98 | 2.00 | 2.00 | 2.00 | 1.99 | 2.00 |
| $Li_2O$ | 7.91 | 7.95 | 7.96 | 7.98 | 6.98 | 5.00 | 6.13 | 6.00 |
| $Na_2O$ | 4.43 | 2.43 | 1.42 | 0.41 | 1.41 | 3.40 | 3.97 | 0.50 |
| MgO | 2.97 | 2.98 | 2.99 | 3.00 | 3.00 | 3.00 | 2.94 | 2.10 |
| ZnO | 0.00 | 0.89 | 1.34 | 1.80 | 1.80 | 1.80 | 0.00 | 0.00 |
| CaO | 0.00 | 0.00 | 0.00 | 0.00 | 0.00 | 0.00 | 0.05 | 4.90 |
| $SnO_2$ | 0.10 | 0.10 | 0.10 | 0.10 | 0.10 | 0.10 | 0.10 | 0.10 |
| $Li_2O/R_2O$ | 0.64 | 0.77 | 0.85 | 0.95 | 0.83 | 0.60 | 0.61 | 0.92 |
| $R_2O—Al_2O_3$ | −0.16 | −2.41 | −3.54 | −4.68 | −4.68 | −4.67 | 0.10 | −6.00 |
| $R_xO—Al_2O_3$ | 2.81 | 1.47 | 0.79 | 0.12 | 0.12 | 0.13 | 3.09 | 1.00 |
| $R_2O/Al_2O_3$ | 0.99 | 0.81 | 0.73 | 0.64 | 0.64 | 0.64 | 1.01 | 0.52 |
| MgO/RO | 1.00 | 0.77 | 0.69 | 0.63 | 0.63 | 0.63 | 1.00 | 1.00 |
| $R_2O$ | 12.34 | 10.38 | 9.39 | 8.39 | 8.39 | 8.40 | 10.10 | 6.50 |
| RO | 2.97 | 3.88 | 4.34 | 4.79 | 4.79 | 4.79 | 2.99 | 7.00 |
| $Na_2O + Al_2O_3$ | 16.93 | 15.21 | 14.35 | 13.48 | 14.48 | 16.47 | | |

TABLE 1B

Selected physical properties of Examples G-L.

| | Ex. G | Ex. H | Ex. I | Ex. J | Ex. K | Ex. L |
|---|---|---|---|---|---|---|
| Strain pt. (C. °) | 553 | 592 | 604 | 617 | 613 | 615 |
| Anneal pt. (C. °) | 602 | 642 | 654 | 667 | 666 | 668 |

TABLE 1B-continued

Selected physical properties of Examples G-L.

| | Ex. G | Ex. H | Ex. I | Ex. J | Ex. K | Ex. L |
|---|---|---|---|---|---|---|
| Softening pt. (C. °) | | | | 919 | 921 | 929 |
| Fulcher A | −3.277 | −2.717 | −2.47 | −3.039 | −3.216 | −3.212 |
| Fulcher B | 9103.3 | 7328.4 | 6642 | 7326.7 | 8338.1 | 8522.4 |
| Fulcher $T_0$ | 7.1 | 193.8 | 260 | 176.7 | 147 | 136.1 |
| $T^{200\,kP}$ (° C.) | 1640 | 1654 | 1652 | 1642 | | |
| Liquidus temperature (° C.) | 1175 | 1235 | 1240 | 1265 | 1280 | 1290 |
| Liquidus phase | spodumene | spodumene | spodumene | spodumene | gahnite | gahnite |
| Liquidus viscosity (P) | 33000 | 21000 | 20000 | 14000 | 13900 | 14500 |
| Low temperature CTE 25-300° C. (ppm/° C.) | | 4.6 | | | | |
| Density (g/cm$^3$) | | 2.386 | | | | |
| Stress optical coefficient (nm/cm/MPa) | 30.47 | 30.9 | 30.75 | 30.83 | 31.07 | 31.44 |
| Refractive index at 589 nm | 1.5073 | 1.5087 | 1.51 | 1.5112 | 1.51 | 1.5076 |
| Young's modulus (GPa) | 80.39 | 81.4 | 82.19 | 82.05 | 82.6 | 81.63 |
| Shear modulus (GPa) | 33.16 | 33.8 | 33.85 | 33.78 | 34.13 | 33.58 |
| Poisson's ratio | 0.211 | 0.205 | 0.213 | 0.215 | 0.209 | 0.214 |
| Specific modulus (GPa/g/cc) | | 34.1 | | | | |
| $K_{1C}$ (Mpa · m$^{1/2}$)* | | 0.75 | | | | |
| Vicker's hardness (HVN)* | | 605 | | | | |

*indicates glass substrate property measured, before strengthening.

Table 1C shows the properties of Example H after being ion exchanged in a molten salt bath having 80% KNO$_3$ and 20% NaNO$_3$ and a temperature of 430° C. for 16 hours.

TABLE 1C

Properties of Example H after ion exchanging in molten salt bath including 80% KNO$_3$ and 20% NaNO$_3$, having a temperature of 430° C. for 16 hours.

| | Ex. H |
|---|---|
| Max CT (MPa) | 75 |
| Knoop Scratch Threshold* | in the range from greater than about 4 to less than or equal to about 6 |
| Vicker's hardness (HVN) | 635 |
| Vicker's IFT (kgf) | in the range from greater than about 10 to less than or equal to about 15 |

*indicates glass substrate property measured, before strengthening.

Where the glass-based article includes a glass-ceramic, the crystal phases may include β-spodumene, rutile, gahnite or other known crystal phases and combinations thereof.

The glass-based article may be substantially planar, although other embodiments may utilize a curved or otherwise shaped or sculpted substrate. In some instances, the glass-based article may have a 3D or 2.5D shape. The glass-based article may be substantially optically clear, transparent and free from light scattering. The glass-based article may have a refractive index in the range from about 1.45 to about 1.55. As used herein, the refractive index values are with respect to a wavelength of 550 nm.

Additionally or alternatively, the thickness of the glass-based article may be constant along one or more dimension or may vary along one or more of its dimensions for aesthetic and/or functional reasons. For example, the edges of the glass-based article may be thicker as compared to more central regions of the glass-based article. The length, width and thickness dimensions of the glass-based article may also vary according to the article application or use.

The glass-based article may be characterized by the manner in which it is formed. For instance, where the glass-based article may be characterized as float-formable (i.e., formed by a float process), down-drawable and, in particular, fusion-formable or slot-drawable (i.e., formed by a down draw process such as a fusion draw process or a slot draw process).

A float-formable glass-based article may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass-based article that can be lifted from the tin onto rollers. Once off the bath, the glass glass-based article can be cooled further and annealed to reduce internal stress. Where the glass-based article is a glass ceramic, the glass-based article formed from the float process may be subjected to a ceramming process by which one or more crystalline phases are generated.

Down-draw processes produce glass-based articles having a uniform thickness that possess relatively pristine surfaces. Because the average flexural strength of the glass-based article is controlled by the amount and size of surface flaws, a pristine surface that has had minimal contact has a higher initial strength. When this high strength glass-based article is then further strengthened (e.g., chemically), the resultant strength can be higher than that of a glass-based article with a surface that has been lapped and polished. Down-drawn glass-based articles may be drawn to a thickness of less than about 2 mm. In addition, down drawn glass-based articles have a very flat, smooth surface that can be used in its final application without costly grinding and polishing. Where the glass-based article is a glass ceramic, the glass-based article formed from the down draw process may be subjected to a ceramming process by which one or more crystalline phases are generated.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based article. The fusion draw method offers the advantage that, because the two glass films flowing over the channel fuse together, neither of the outside surfaces of the resulting glass-based article comes in contact with any part of the apparatus. Thus, the surface properties of the fusion drawn glass-based article are not affected by such contact. Where the glass-based article is a glass ceramic, the glass-based article formed from the fusion process may be subjected to a ceramming process by which one or more crystalline phases are generated.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based article and into an annealing region. Where the glass-based article is a glass ceramic, the glass-based article formed from the slot draw process may be subjected to a ceramming process by which one or more crystalline phases are generated.

In some embodiments, the glass-based article may be formed using a thin rolling process, as described in U.S. Pat. No. 8,713,972, entitled "Precision Glass Roll Forming Process and Apparatus", U.S. Pat. No. 9,003,835, entitled "Precision Roll Forming of Textured Sheet Glass", U.S. Patent Publication No. 20150027169, entitled "Methods And Apparatus For Forming A Glass Ribbon", and U.S. Patent Publication No. 20050099618, entitled "Apparatus and Method for Forming Thin Glass Articles", the contents of which are incorporated herein by reference in their entirety. More specifically the glass-based article may be formed by supplying a vertical stream of molten glass, forming the supplied stream of molten glass or glass-ceramic with a pair of forming rolls maintained at a surface temperature of about 500° C. or higher or about 600° C. or higher to form a formed glass ribbon having a formed thickness, sizing the formed ribbon of glass with a pair of sizing rolls maintained at a surface temperature of about 400° C. or lower to produce a sized glass ribbon having a desired thickness less than the formed thickness and a desired thickness uniformity. The apparatus used to form the glass ribbon may include a glass feed device for supplying a supplied stream of molten glass; a pair of forming rolls maintained at a surface temperature of about 500° C. or higher, the forming rolls being spaced closely adjacent each other defining a glass forming gap between the forming rolls with the glass forming gap located vertically below the glass feed device for receiving the supplied stream of molten glass and thinning the supplied stream of molten glass between the forming rolls to form a formed glass ribbon having a formed thickness; and a pair of sizing rolls maintained at a surface temperature of about 400° C. or lower, the sizing rolls being spaced closely adjacent each other defining a glass sizing gap between the sizing rolls with the glass sizing gap located vertically below the forming rolls for receiving the formed glass ribbon and thinning the formed glass ribbon to produce a sized glass ribbon having a desired thickness and a desired thickness uniformity.

In some instances, the thin rolling process may be utilized where the viscosity of the glass does not permit use of fusion or slot draw methods. For example, thin rolling can be utilized to form the glass-based articles when the glass exhibits a liquidus viscosity less than 100 kP.

The glass-based article may be acid polished or otherwise treated to remove or reduce the effect of surface flaws.

Figure 39:
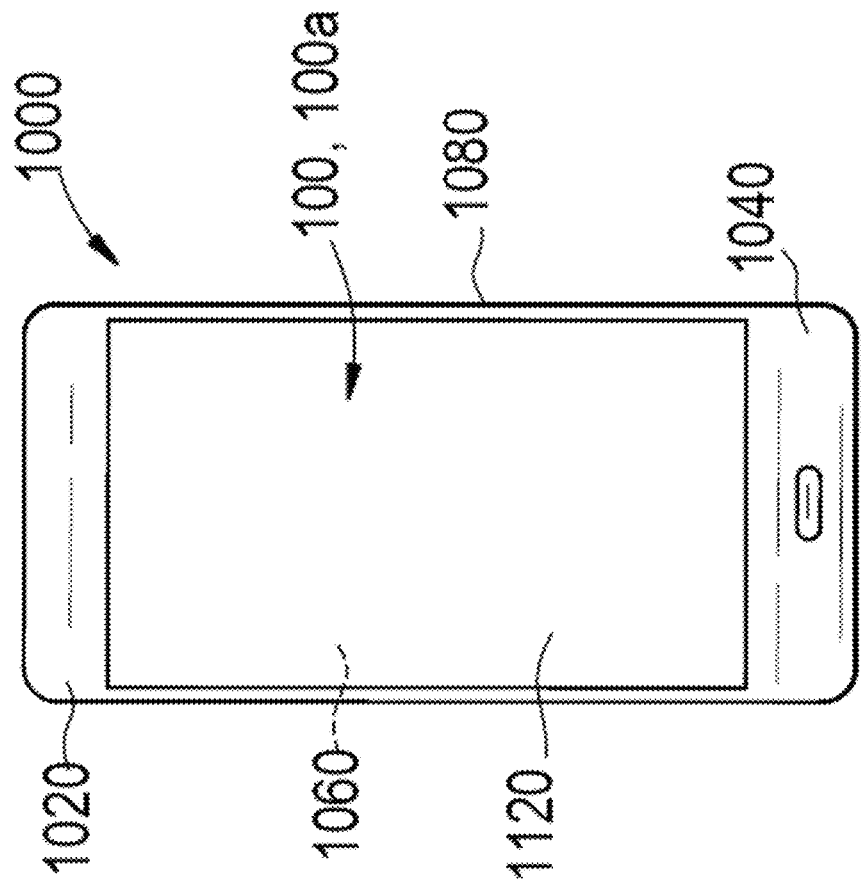
FIG. 39 is a front plan view of an electronic device incorporating one or more embodiments of the glass-based articles described herein.
Figure 40:
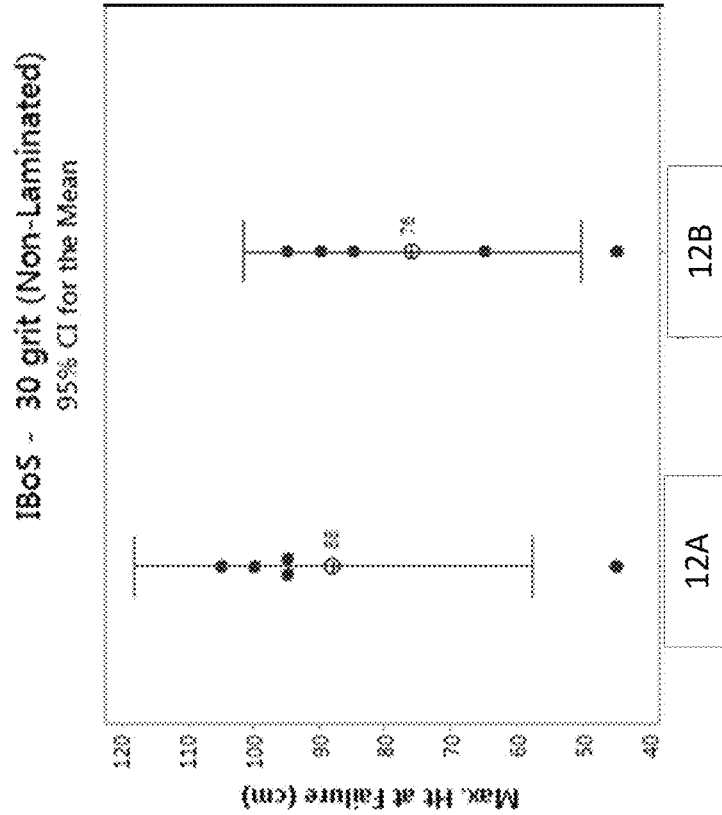
FIG. 40 is a graph showing IBoS test results for samples according to some embodiments.

Another aspect of this disclosure pertains to devices that include the glass-based articles described herein. For example, the devices may include any device including a display or requiring, strengthened thin glass. In one or more embodiments the devices are electronic devices, which can include mobile devices such as mobile phones, laptops, tablets, mp3 players, navigation devices and the like, or stationary devices such as computers, electronic displays, in vehicle information/entertainment systems, billboards, point of sale systems, navigation systems, and the like). In some embodiments, the glass-based articles described herein may be incorporated into architectural articles (walls, fixtures, panels, windows, etc.), transportation articles (e.g., glazing or interior surfaces in automotive applications, trains, aircraft, sea craft, etc.), appliances (e.g., washers, dryers, dishwashers, refrigerators and the like), or any article that requires some fracture resistance. As shown in FIG. 39, an electronic device 1000 may include a glass-based article 100 according to one or more embodiments described herein. The device 100 includes a housing 1020 having front 1040, back 1060, and side surfaces 1080; electrical components (not shown) that are at least partially inside or entirely within the housing and including at least a controller, a memory, and a display 1120 at or adjacent to the front surface of the housing. The glass-based article 100 is shown as a cover disposed at or over the front surface of the housing such that it is over the display 1120. In some embodiments, the glass-based article may be used as a back cover.

Another aspect of this disclosure pertains to a method of forming a fracture-resistant glass-based article. The method includes providing a glass-based substrate having a first surface and a second surface defining a thickness of about 3 millimeters or less, for example 1 millimeter or less, and generating a stress profile in the glass-based substrate, as described herein to provide the fracture-resistant glass-based article. In one or more embodiments, generating the stress profile comprises ion exchanging a plurality of alkali ions into the glass-based substrate to form a non-zero alkali metal oxide concentration that varies along a substantial portion of the thickness (as described herein) or along the entire thickness. In one example, generating the stress profile includes immersing the glass-based substrate in a molten salt bath including nitrates of Na+, K+, Rb+, Cs+ or a combination thereof, having a temperature of about 350° C. or greater (e.g., about 350° C. to about 500° C.). In one example, the molten bath may include NaNO$_3$, KNO$_3$ or a combination thereof, and may have a temperature of about 485° C. or less. In another example, the bath may include a mixture of NaNO$_3$ and KNO$_3$ and have a temperature of about 460° C. The glass-based substrate may be immersed in the bath for about 2 hours or more, up to about 48 hours (e.g., from about 2 hours to about 10 hours, from about 2 hours to about 8 hours, from about 2 hours to about 6 hours, from about 3 hours to about 10 hours, or from about 3.5 hours to about 10 hours).

In some embodiments, the method may include chemically strengthening or ion exchanging the glass-based substrate in a single bath or in more than one step using successive immersion steps in more than one bath. For example, two or more baths may be used successively. The composition of the one or more baths may include a single metal (e.g., Ag+, Na+, K+, Rb+, or Cs+) or a combination of metals in the same bath. When more than one bath is utilized, the baths may have the same or different composition and/or temperature as one another. The immersion times in each such bath may be the same or may vary to provide the desired stress profile.

In one or more embodiments of the method, a second bath or subsequent baths may be utilized to generate a greater surface CS. In some instances, the method includes immersing the glass-based substrate in the second or subsequent baths to generate a greater surface CS, without significantly influencing the chemical depth of layer and/or the DOC. In such embodiments, the second or subsequent bath may include a single metal (e.g., KNO$_3$ or NaNO$_3$) or a mixture of metals (KNO$_3$ and NaNO$_3$). The temperature of the second or subsequent bath may be tailored to generate the greater surface CS. In some embodiments, the immersion time of the glass-based substrate in the second or subsequent bath may also be tailored to generate a greater surface CS without influencing the chemical depth of layer and/or the DOC. For example, the immersion time in the second or subsequent baths may be less than 10 hours (e.g., about 8 hours or less, about 5 hours or less, about 4 hours or less, about 2 hours or less, about 1 hour or less, about 30 minutes or less, about 15 minutes or less, or about 10 minutes or less).

In one or more alternative embodiments, the method may include one or more heat treatment steps which may be used in combination with the ion-exchanging processes described herein. The heat treatment includes heat treating the glass-based article to obtain a desired stress profile. In some embodiments, heat treating includes annealing, tempering or heating the glass-based substrate to a temperature in the range from about 300° C. to about 600° C. The heat treatment may last for 1 minute up to about 18 hours. In some embodiments, the heat treatment may be used after one or more ion-exchanging processes, or between ion-exchanging processes.

EXAMPLES

Various embodiments will be further clarified by the following examples. In the Examples, prior to being strengthened, the Examples are referred to as "substrates". After being subjected to strengthening, the Examples are referred to as "articles" or "glass-based articles".

Example 1

Glass-ceramic substrates having a nominal composition as shown below in Table 2 was provided. The glass-ceramic substrates had a thickness of 0.8 millimeters and included a crystal phase assemblage comprising a β-spodumene solid solution as a predominant crystalline phase and one or more minor phases including rutile. The glass-ceramic substrates were immersed in a molten salt bath including NaNO$_3$ having a temperature of 485° C. for 10 hours (Condition A), 13 hours (Condition B) or 24 hours (Condition C), or a molten salt bath including NaNO$_3$ having a temperature of 430° C. for the 2 hours (Comparative Condition D) to form glass-ceramic articles.

TABLE 2

Composition of the glass-ceramic substrate of Example 1, prior to chemical strengthening.

| Example ➡<br>Oxide [mole %] | 1 |
|---|---|
| SiO$_2$ | 69.2 |
| Al$_2$O$_3$ | 12.6 |
| B$_2$O$_3$ | 1.8 |
| Li$_2$O | 7.7 |
| Na$_2$O | 0.4 |
| MgO | 2.9 |
| ZnO | 1.7 |
| TiO$_2$ | 3.5 |
| SnO$_2$ | 0.1 |
| $\dfrac{[\text{Li}_2\text{O} + \text{Na}_2\text{O} + \text{MgO} + \text{ZnO} + \text{K}_2\text{O}]}{[\text{Al}_2\text{O}_3 + \text{B}_2\text{O}_3]}$ | $\dfrac{12.7}{14.4} = 0.88$ |
| $\dfrac{[\text{TiO}_2 + \text{SnO}_2]}{[\text{SiO}_2 + \text{B}_2\text{O}_3]}$ | $\dfrac{3.6}{7.1} = 0.051$ |

Figure 9:
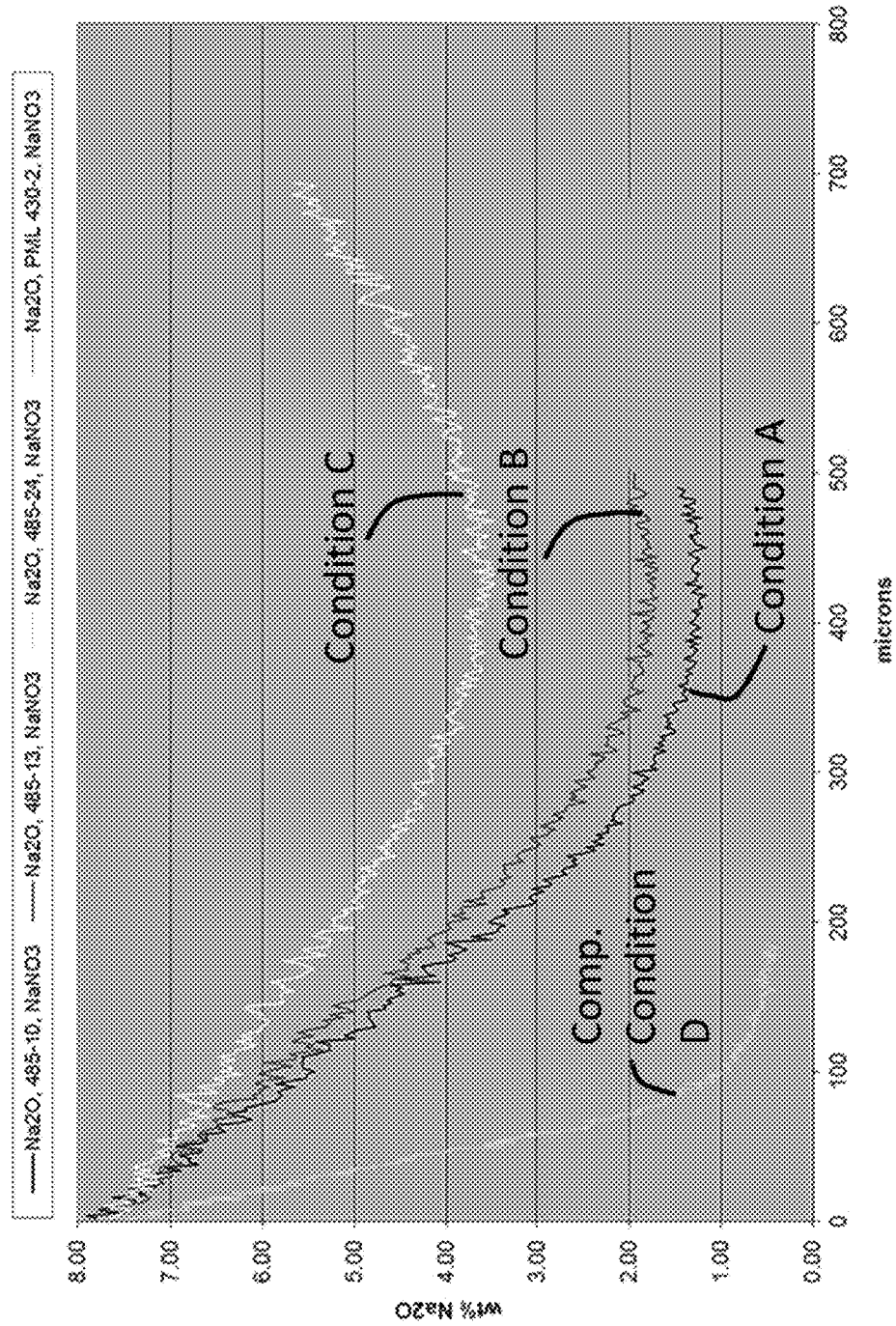
FIG. 9 is a graph showing the concentration of $Na_2O$ in known chemically strengthened glass-based articles and glass-based articles according to one or more embodiments of this disclosure.

The chemical profiles of the glass-ceramic articles were measured by microprobe and are shown in FIG. 9. Stress is proportional to concentration through Equation (4):

$$\text{Sigma}(z) = BE/1 - n(C\text{ avg} - C(z)) \qquad (4)$$

In Equation (4), B is the lattice dilation coefficient, E is Young's modulus, n is Poisson's ratio, and Cavg is in the integral of the concentration across the sample. As shown in FIG. 9, the Na+ ions are ion exchanged through almost the entire thickness of the articles when a higher temperature bath is utilized (i.e., Conditions A-C). In such glass-ceramics, Na$_2$O is present in the CT region in an amount of about 1.2 mol % or greater. The glass-ceramic article ion exchanged in a lower temperature bath (Comparative Condition D) exhibited a stress profile that resembles known stress profiles.

Example 2

Figure 10:
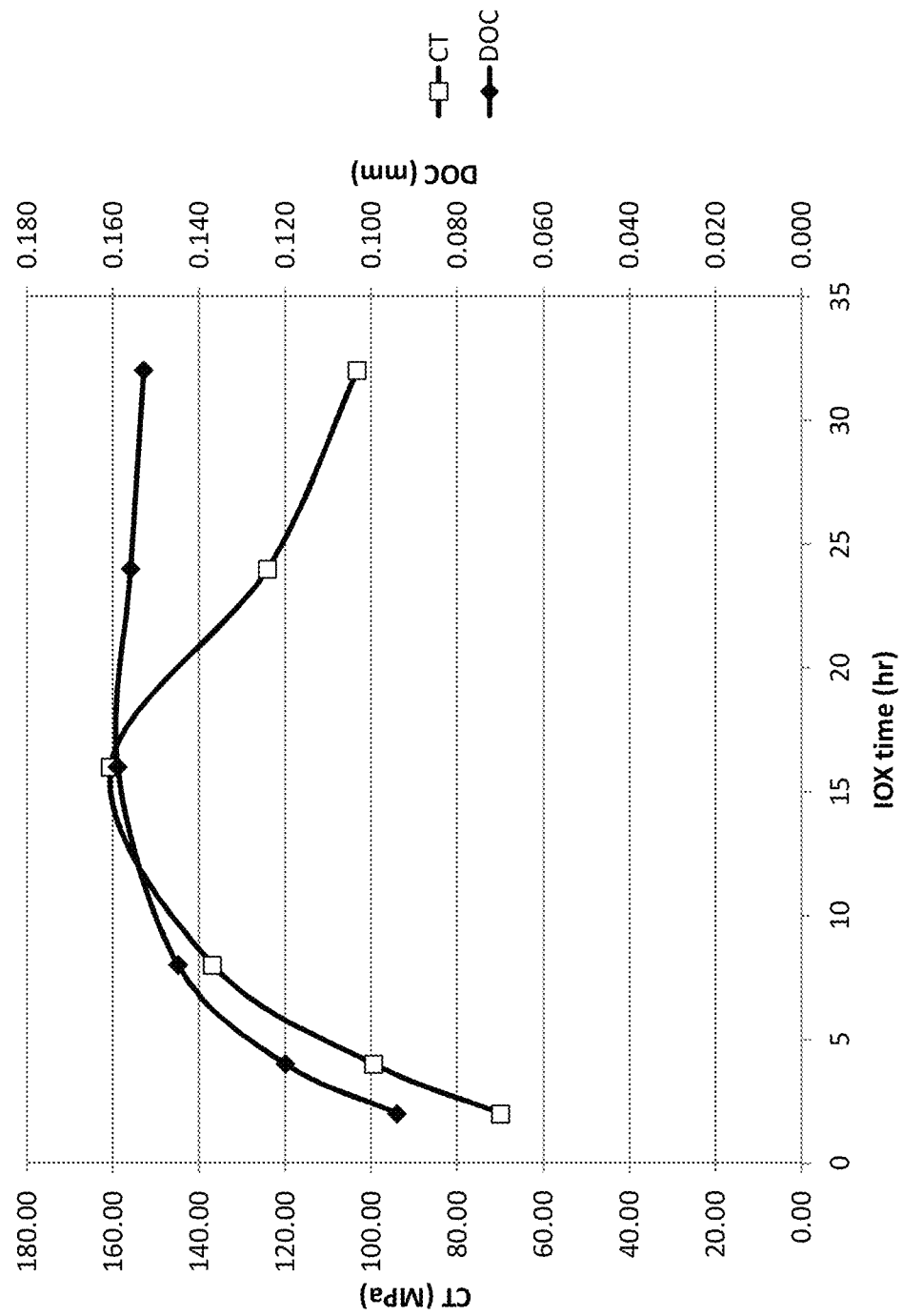
FIG. 10 is a graph showing CT values and DOC values as a function of ion exchange time, according to one or more embodiments of this disclosure.

Glass substrates having the same composition as shown in Table 2 and a thickness of 0.8 mm, but having an amorphous structure (and no crystal phases) were chemically strengthened by immersing in a molten salt bath including 100% NaNO$_3$ having a temperature of about 430° C. for various durations to provide glass articles. The DOC and the maximum CT value of the glass articles were measured using a SCALP. As shown in FIG. 10, the DOC and the maximum CT increases are dependent on the length of immersion or ion exchange. The greatest CT values were observed after immersing the glasses for about 16 hours.

Figure 11:
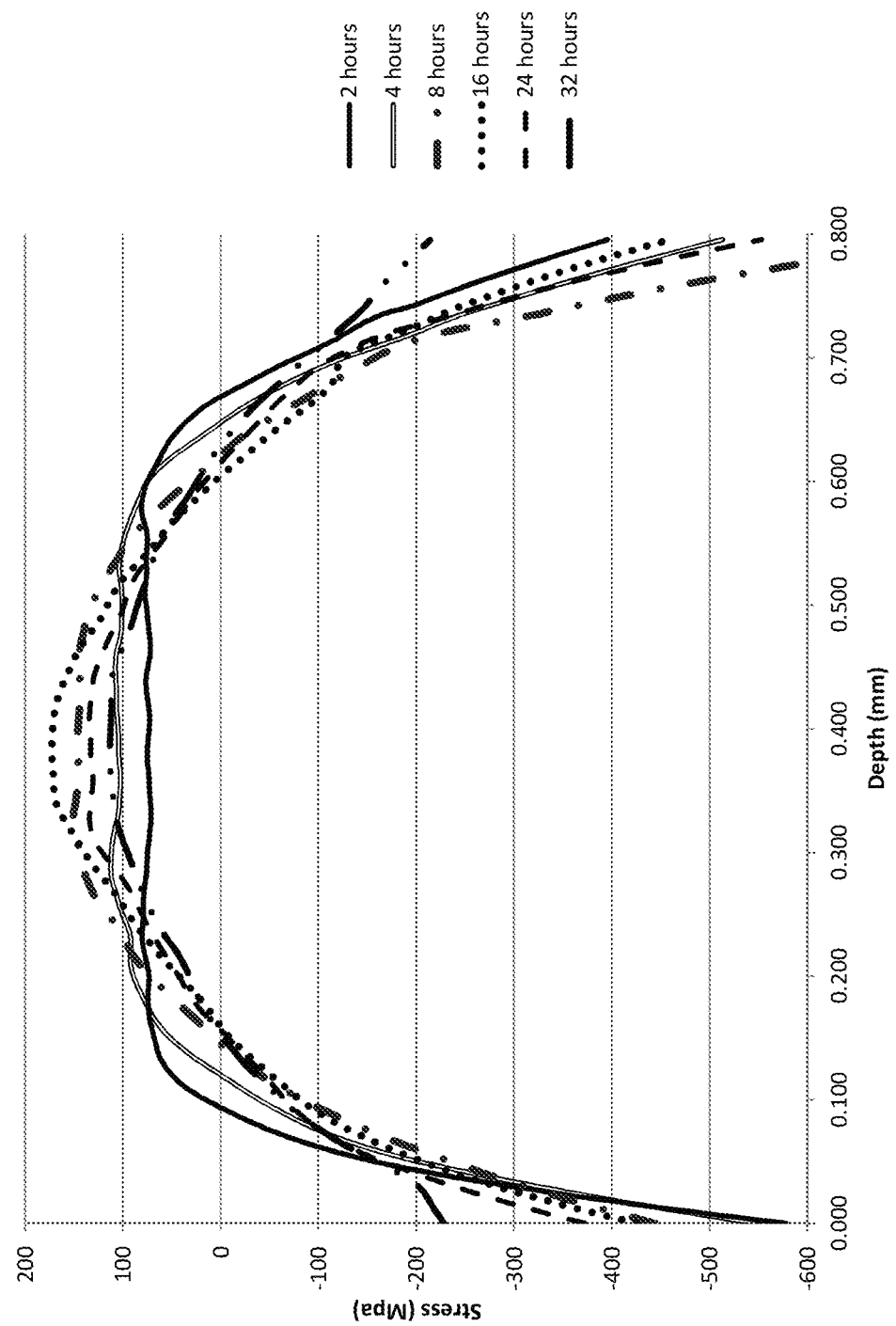
FIG. 11 is a graph comparing the stress profiles as a function of depth of known chemically strengthened glass-based articles and glass-based articles, according to one or more embodiments of this disclosure

The stress profiles of the glass articles of Example 2 were measured using SCALP and are shown in FIG. 11. The upper portion of the y-axis indicating a positive stress value is the CT layer and the lower portion of the y-axis indicating a negative stress value is the CS values. The stress profile of the glass article that was chemically strengthened for 16 hours exhibited the greatest CT value (i.e., 175 MPa) and a shape that was parabolic-like, which included substantially no flat portions, in a depth direction, of 100 micrometers. The surface CS measured by SCALP was about 410 MPa. Accordingly, the ratio of maximum CT to absolute value of surface CS of Example 2 is about 0.4375. In FIG. 11, positive numbers are used for compressive stress, and negative numbers indicate tensile stress. This same convention (compressive stress is indicated as positive values on the y axis, and tensile stress is indicated by negative values on the y axis) is used for FIGS. 1-3 and 33 also. However, in the remainder of the figures, compressive stress is indicated as negative values on the y axis and tensile stress is indicated as positive values on the y axis.

Example 3

Figure 12:
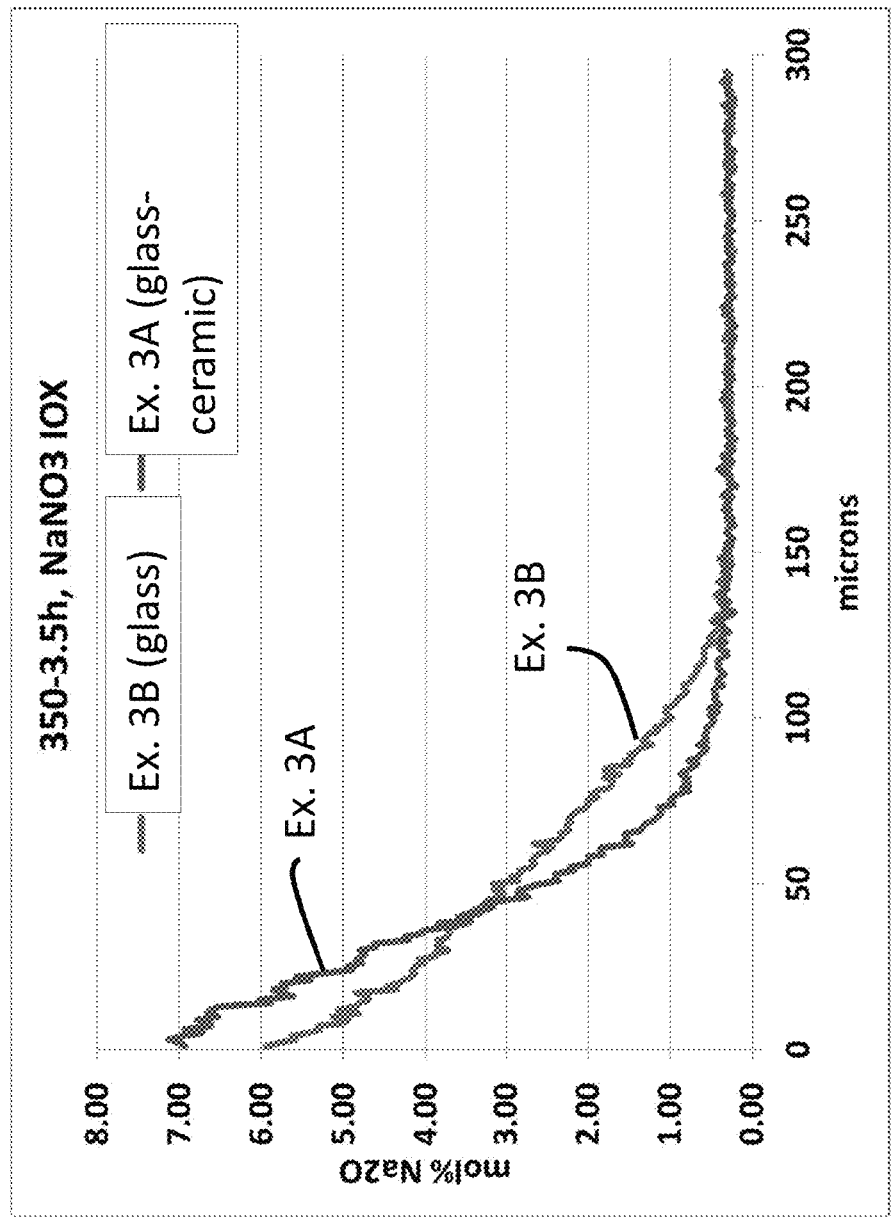
FIG. 12 shows a graph of the stress profiles of a known chemically strengthened glass and glass-ceramic.

For comparison, the glass-ceramic substrate of Example 1 and the glass substrate of Example 2, each having a thickness of about 0.8 mm, were subjected to chemical strengthening by immersing in a molten salt bath of $NaNO_3$ having a temperature of 350° C. for 3.5 hours (Example 3A and 3B, respectively). The resulting stress profiles (as approximated by the chemical profile measured by microprobe using Equation 4) of the glass-ceramic article and glass article shown in FIG. 12 resemble an error function (erfc) or quasi-linear shape. Moreover, the CS depth of layer is less than the depth of the alkali ion exchanged into the glass or glass-ceramic (or the chemical ion exchange depth).

Figure 13:
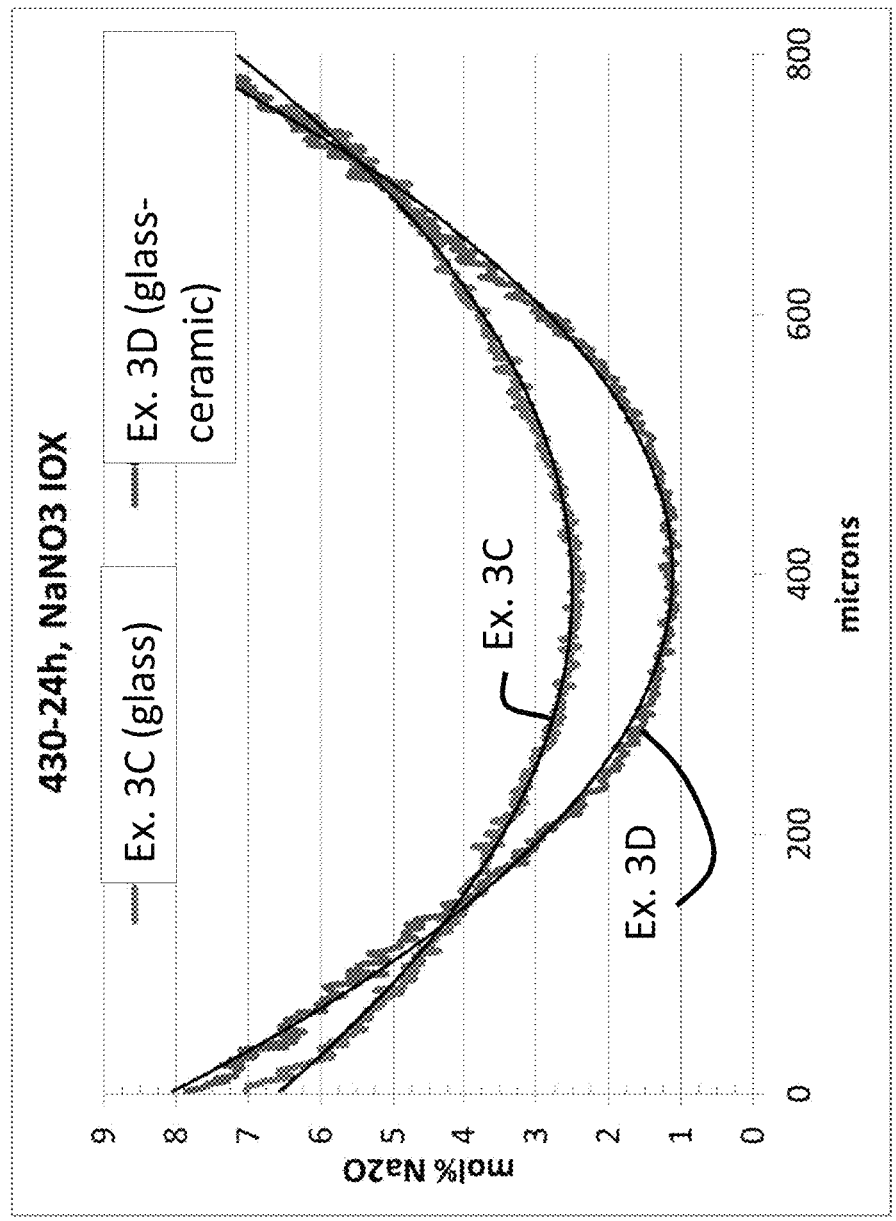
FIG. 13 shows a graph of the stress profiles of a glass and glass-ceramic according to one or more embodiments of this disclosure.
Figure 13A:
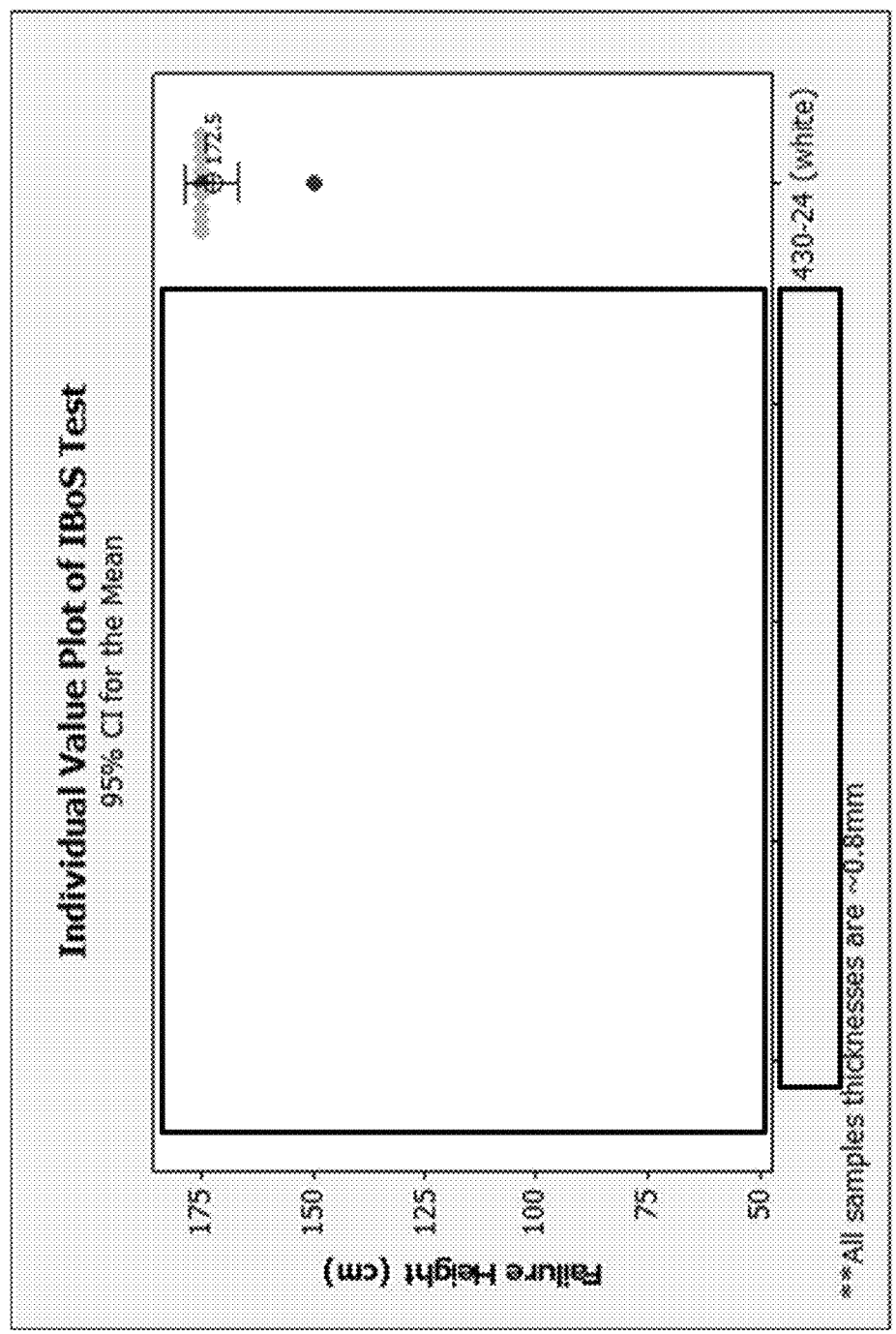
FIG. 13A shows a graph of the failure height in drop testing of Example 3D.

When the glass-ceramic substrate of Example 1 and the glass substrate of Example 2, each having a thickness of about 0.8 mm were subjected to the chemical strengthening described herein by immersing in a molten salt bath of $NaNO_3$ having a temperature of 430° C. for 24 hours (Examples 3C and 3D, respectively), the resulting glass-based articles exhibited metal oxide concentration profiles (obtained by EPMA) as shown in FIG. 13. The metal oxide concentration profiles are parabolic-like and show an ion exchange of Na+ ions throughout the entire thickness. The chemical profiles were measured using EMPA and the chemical depth of $Na_2O$ diffusion is shown as equal to or larger than 400 micrometers. Moreover, $Na_2O$ is present in a concentration of about 1 mol % or greater throughout the thickness, including in the CT layer. The resulting glass-ceramic articles of Example 3D exhibited superior fracture resistance in a drop test in which the glass-ceramic substrates were retrofitted into identical mobile phone housing. Specifically, Five samples of Example 3D were assembled in a mobile phone device and dropped onto sandpaper for successive drops starting at a height of 50 cm. As each sample survived the drop from a height, it was dropped again from an increase height until it fractured, at which point the failure height of that sample was recorded in FIG. 13A. Example 3D exhibited an average failure height of 172.5 cm.

Figure 14:
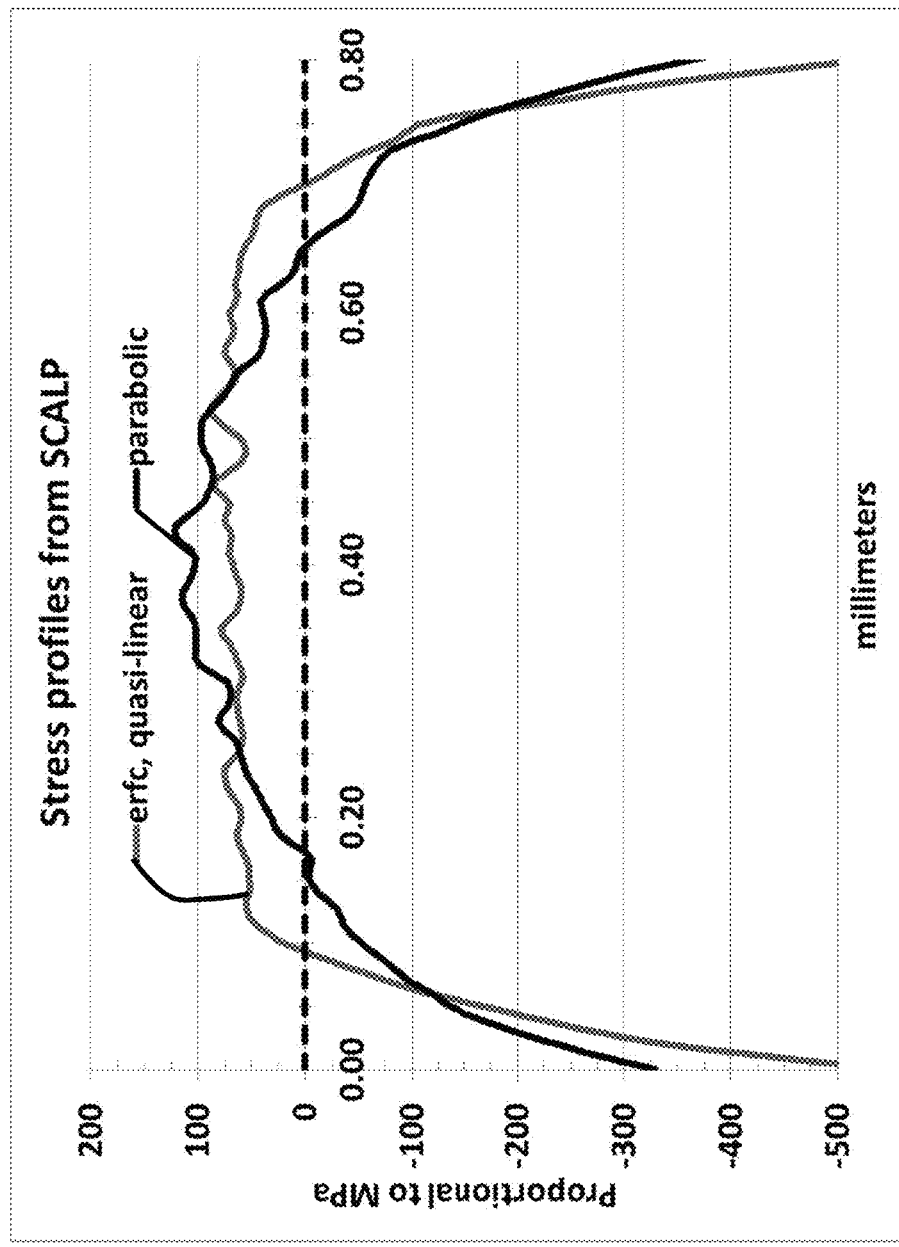
FIG. 14 is a graph comparing a known stress profile of a chemically strengthened glass-based article and a glass-based article according to one or more embodiments of this disclosure.

FIG. 14 shows stress profiles of a glass-based substrate chemically strengthened according to known processes and a glass-based substrate chemically strengthened according to the methods described herein. As shown in FIG. 14, the stress profile of the glass-based articles of the embodiments described herein have a shape that is substantially free of flat segments (having a length or absolute depth greater than about 50 micrometers) and exhibits a DOC of about 0.2·t, while the known stress profile exhibits a substantially linear and/or flat portion from a depth of about 0.1 millimeters to about 0.7 millimeters (for a total length of about 0.6 millimeters or 600 micrometers). The known stress profile also exhibits a lower CT value and a lower DOC.

Example 4

Figure 15:
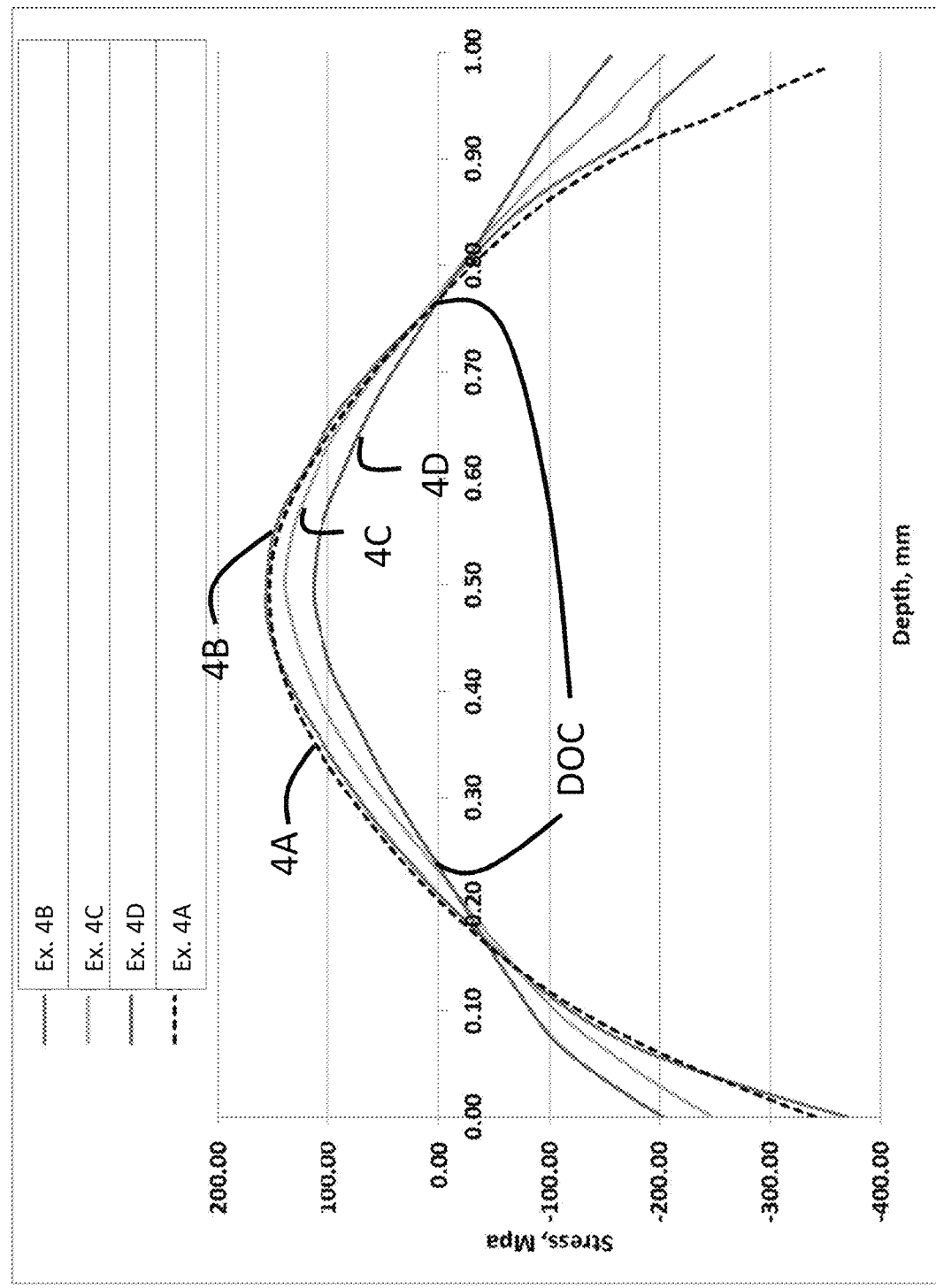
FIG. 15 is a graph showing the stress profiles of Examples 4A-4D as function of thickness.

Glass substrates (each having a thickness of about 1 mm) having the composition of Table 2 were subjected to chemical strengthening by immersing in a first molten salt bath of $NaNO_3$ having a temperature of 430° C. for 24 hours. One glass-based article was not subjected to any additional strengthening steps (Example 4A). Three glass-based articles were subjected to a second strengthening step by immersion in a second molten salt bath of $KNO_3$ having a temperature of about 430° C. for either 0.75 hours, 4 hours, or 8 hours (Examples 4B, 4C and 4D, respectively). The stress profiles as measured by SCALP of the resulting glass-based articles are shown in FIG. 15, with depth or thickness of the glass-based articles plotted on the x-axis and stress plotted on the y-axis. The positive stress values are CT values and the negative stress values are the CS values. Spatial resolution of the instrument prohibits measurement of the CS associated with the second $KNO_3$ ion exchange step. The glass-based articles of Examples 4A and 4B exhibited similar profiles. The glass-based articles of Examples 4C and 4D exhibited decreasing CT (as compared to Examples 4A and 4B) and decreasing CS (as compared to Examples 4A and 4B), with time and after the immersion at second strengthening step. The glass-based articles of Examples 4C and 4D also exhibited increased DOC, as compared to Examples 4A and 4B, and such DOC values were greater than 0.2·t.

Figure 16:
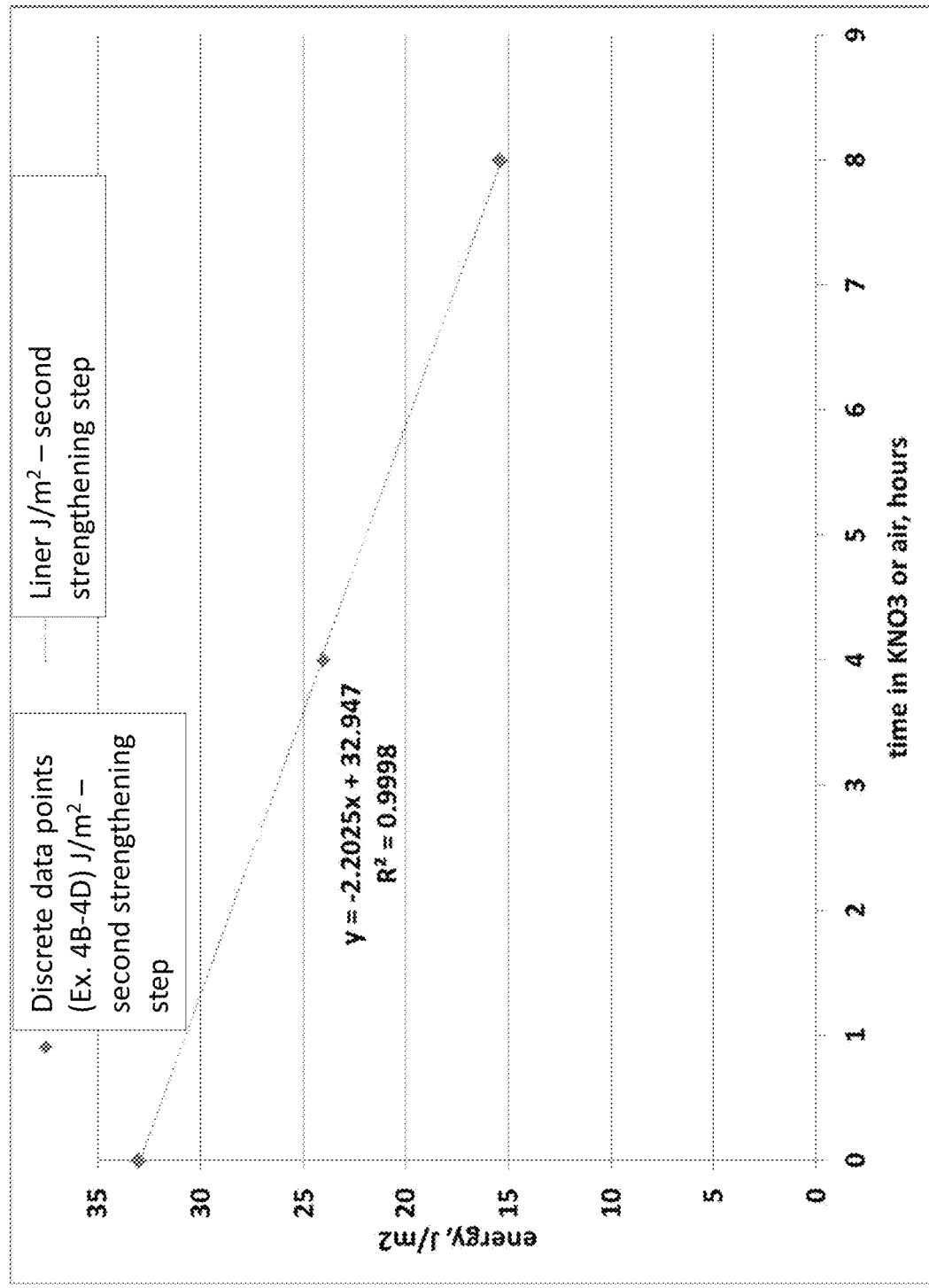
FIG. 16 is a graph showing discrete stored tensile energy data points for Examples 4B-4D.

FIG. 16 shows the stored tensile energy in $J/m^2$ for each of Examples 4B-4D, which are greater than 15 $J/m^2$ depending on time immersed in the second molten salt bath of $KNO_3$. The stored tensile energy can be calculated from the measured SCALP stress profile data and using Equation (2) above.

Figure 17:
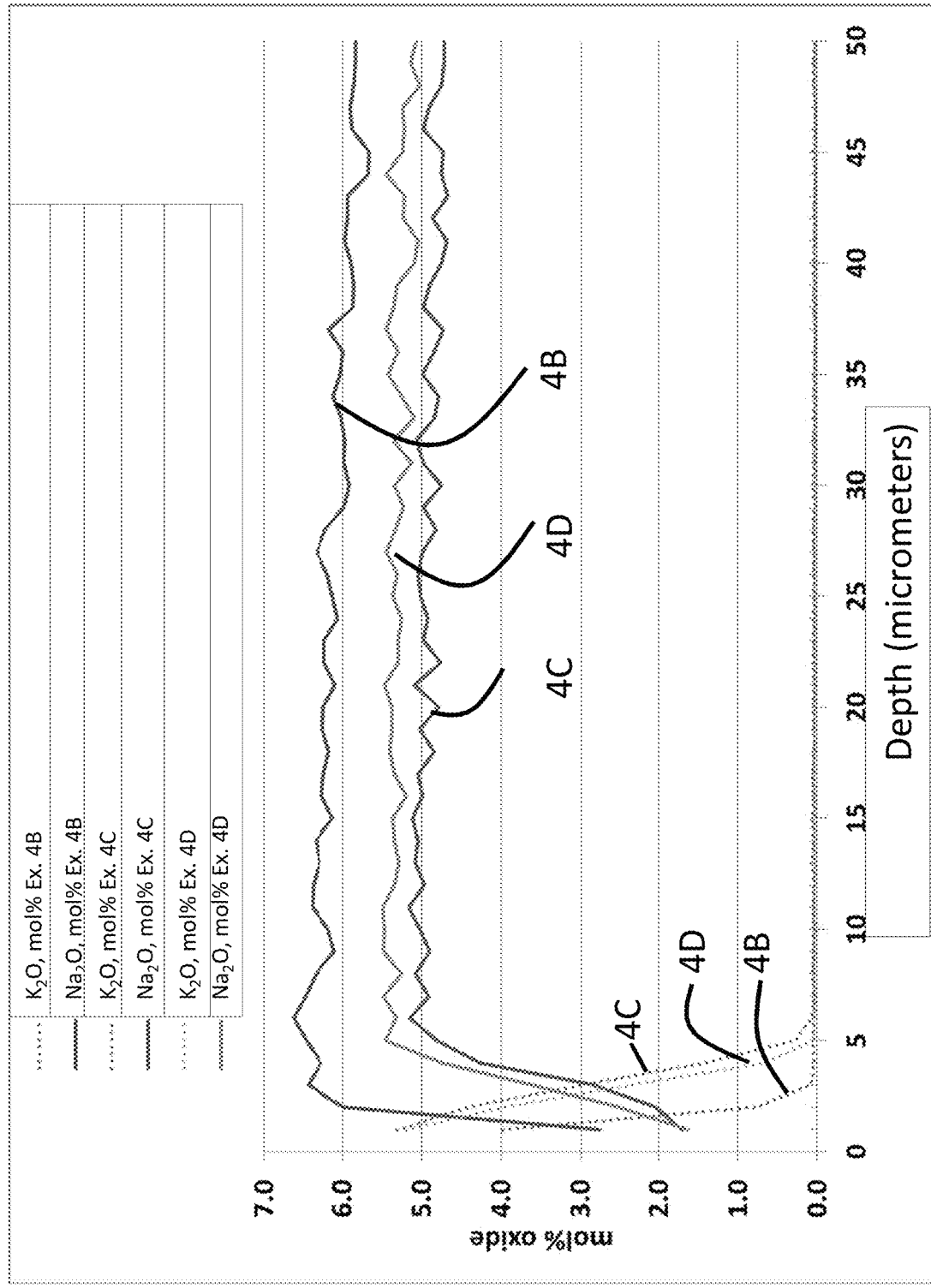
FIG. 17 is a graph showing the concentration of $K_2O$ and $Na_2O$ as a function of depth in Examples 4A-4D.
Figure 18:
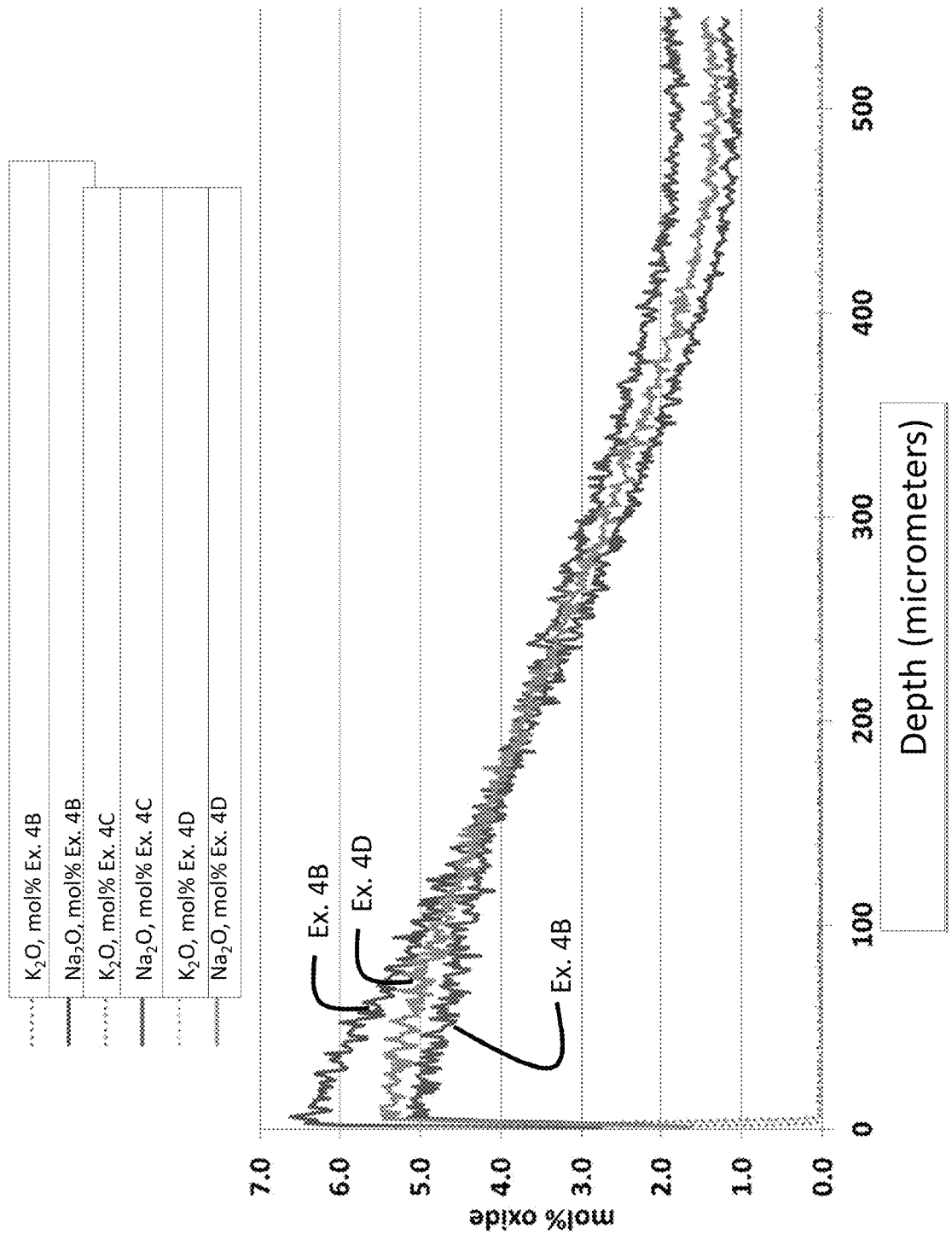
FIG. 18 is a graph showing the same data as FIG. 16, but with a different scale to more clearly illustrate the concentration of $Na_2O$ as a function of depth.

FIGS. 17 and 18 show the concentration profiles of each of $K_2O$ and $Na_2O$ as a function of depth (in micrometers) each of Examples 4B-4D. As shown in FIG. 17, the chemical depth of $K_2O$ is 3 micrometers (Ex. 4B, immersion for 0.75 hours in a $KNO_3$ bath), 6 micrometers (Ex. 4C, immersion for 4 hours in a $KNO_3$ bath) and 5 micrometers (Ex. 4D, immersion for 8 hours in a $KNO_3$ bath). As shown in FIG. 18, $Na_2O$ penetrates the entire depth and has a concentration of about 1 mol % or greater for each of Examples 4B-4D along the entire depth of the glass-based article.

Figure 19:
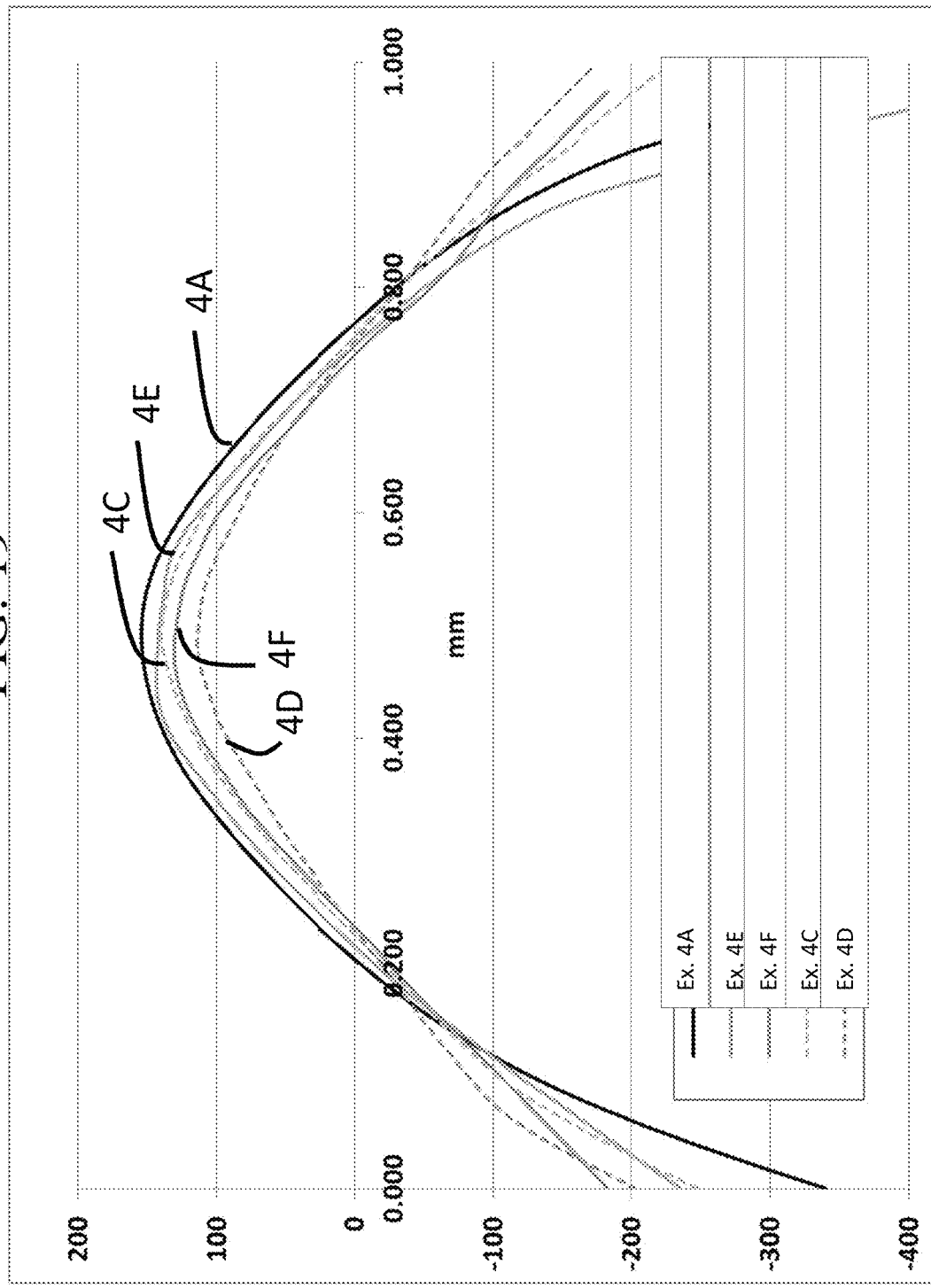
FIG. 19 is a graph showing the stress profiles of Examples 4A and 4C-4F as a function of depth.
Figure 20:
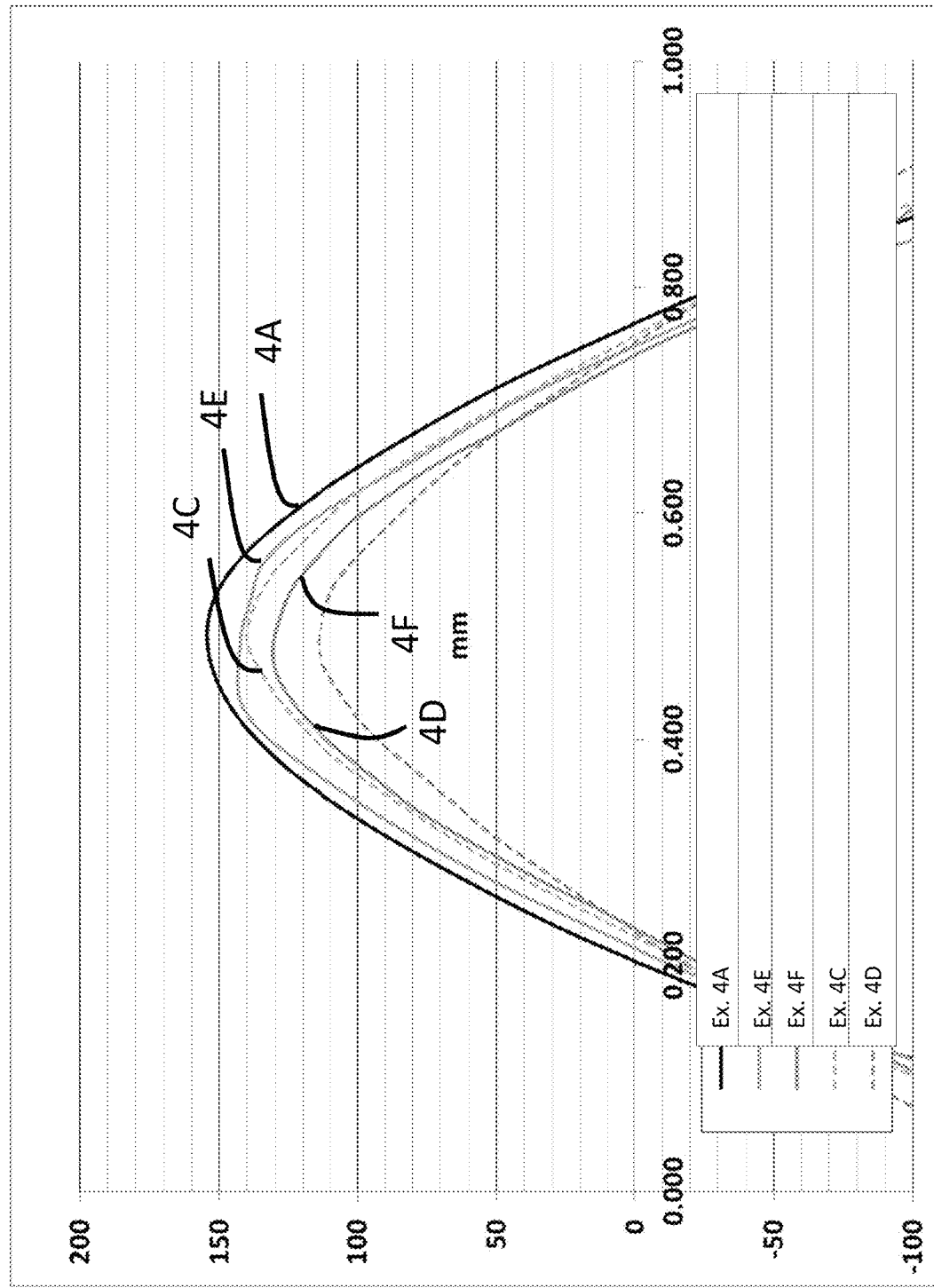
FIG. 20 is a graph showing different scale of FIG. 18.

Examples 4E and 4F included glass substrates (each having a thickness of about 1 mm) having the composition of Table 2, which were subjected to chemical strengthening by immersing in a first molten salt bath of $NaNO_3$ having a temperature of 430° C. for 24 hours, followed by heat treatment to a temperature of 430° C. in air for 4 hours or 8.25 hours, respectively. The stress profiles of the glass-based articles of Examples 4E, 4F are shown in FIG. 19, with the stress profiles for Examples 4A, 4C and 4D shown for comparison. FIG. 20 shows the same graph as FIG. 19, at a smaller scale to illustrate the differences in the stress profiles at or near a depth of 0.5·t.

Example 5

Glass substrates (each having a thickness of about 1 mm) having the composition of Table 2 were subjected to chemical strengthening by immersing in a first molten salt bath of NaNO$_3$ having a temperature of 430° C. for 24 hours. One glass-based article was not subjected to any additional strengthening steps (Example 5A). Two glass-based articles were subjected to a second strengthening step by placing the glass-based articles in a furnace at 390° C. and maintaining the glass-based articles in the furnace for about 8 hours or 28 hours (Examples 5B-5C, respectively). Four glass-based articles were subjected to a third strengthening step (after the first strengthening step and either of the different second strengthening steps) by immersing in a second molten salt bath of KNO$_3$ having a temperature of 430° C. for 4 hours or 8 hours (Examples 5D-5G). The strengthening steps for each of Examples 5A-5G is shown in Table 3. The measured CT values are also shown in Table 3.

duration for which the glass substrates were immersed in the molten salt bath are shown in Table 5.

TABLE 4

Chemical strengthening duration (or ion exchange times) for Examples 6A-6G.

| Ex. | IOX Time (hours) |
|---|---|
| 6A | 2 |
| 6B | 4 |
| 6C | 8 |
| 6D | 16 |
| 6E | 24 |
| 6F | 32.5 |
| 6G | 48 |

Figure 24:
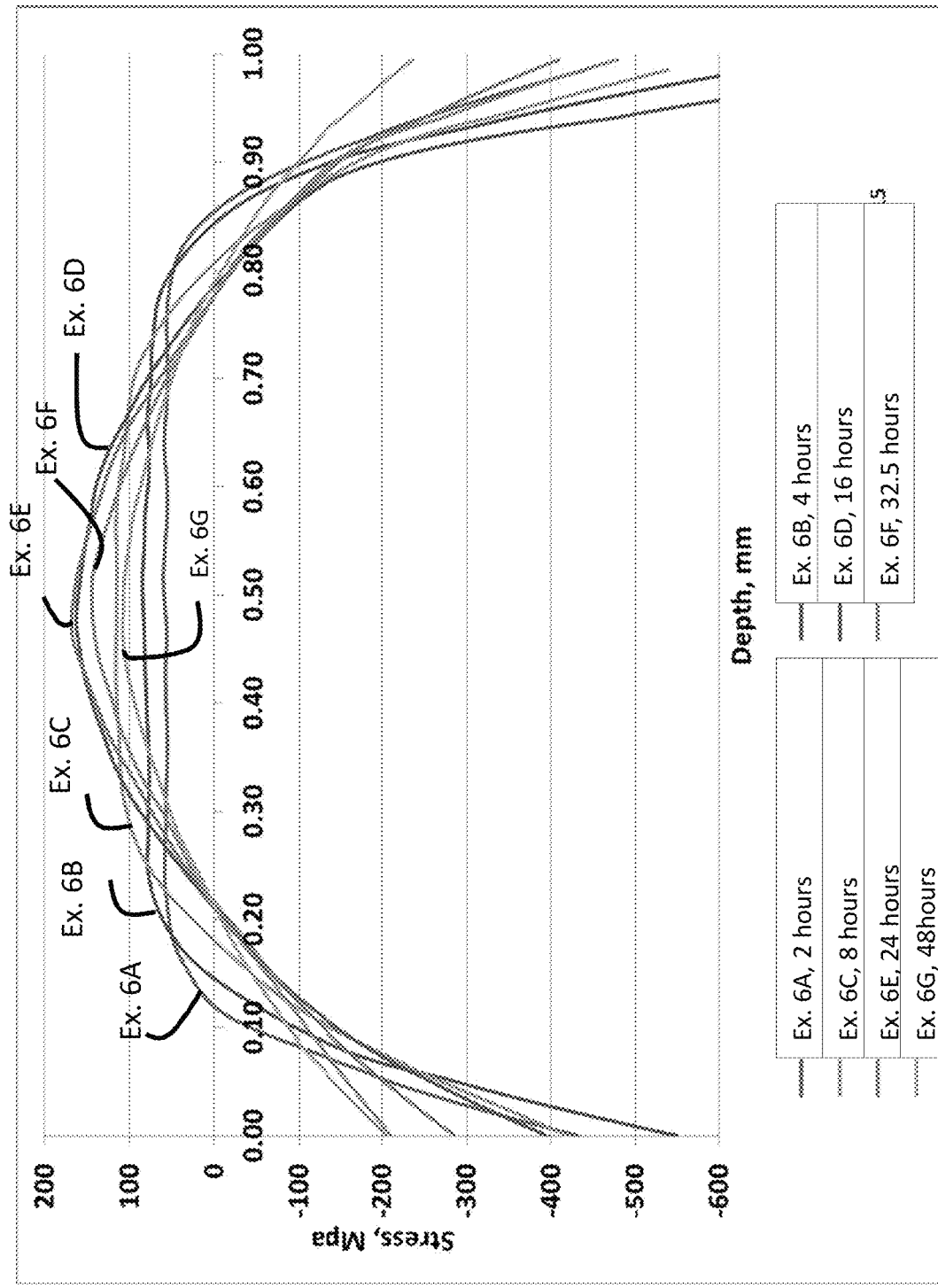
FIG. 24 is a graph showing CT as a function of ion exchange time for Examples 6A-6G.

The stress profiles of the glass-based articles of Examples 6A-6G are shown in FIG. 24. The stress profiles were measured using SCALP. As shown in FIG. 24, immersion of the glass substrates in the molten salt bath for 16 hours and 24 hours results in glass-based articles exhibiting the greatest surface CS values and the greatest CT values, in absolute

TABLE 3

Strengthening steps for Examples 5A-5G.

| Step | Ex. 5A | Ex. 5B | Ex. 5C | Ex. 5D | Ex. 5E | Ex. 5F | Ex. 5G |
|---|---|---|---|---|---|---|---|
| 1$^{st}$ Step | NaNO$_3$, 430° C., 24 hours | NaNO$_3$, 430° C., 24 hours | NaNO$_3$, 430° C., 24 hours | NaNO$_3$, 430° C., 24 hours | NaNO$_3$, 430° C., 24 hours | NaNO$_3$, 430° C., 24 hours | NaNO$_3$, 430° C., 24 hours |
| 2$^{nd}$ Step | | Air, 390° C., 8 hours | Air, 390° C., 28 hours | Air, 390° C., 8 hours | Air, 390° C., 28 hours | Air, 390° C., 8 hours | Air, 390° C., 28 hours |
| 3$^{rd}$ Step | | | | KNO$_3$, 430° C., 4 hours | KNO$_3$, 430° C., 4 hours | KNO$_3$, 430° C., 8 hours | KNO$_3$, 430° C., 8 hours |
| CT | 174 MPa | 148 MPa | 96 MPa | 129 MPa | 82 MPa | 103 MPa | 72 MPa |

Figure 21:
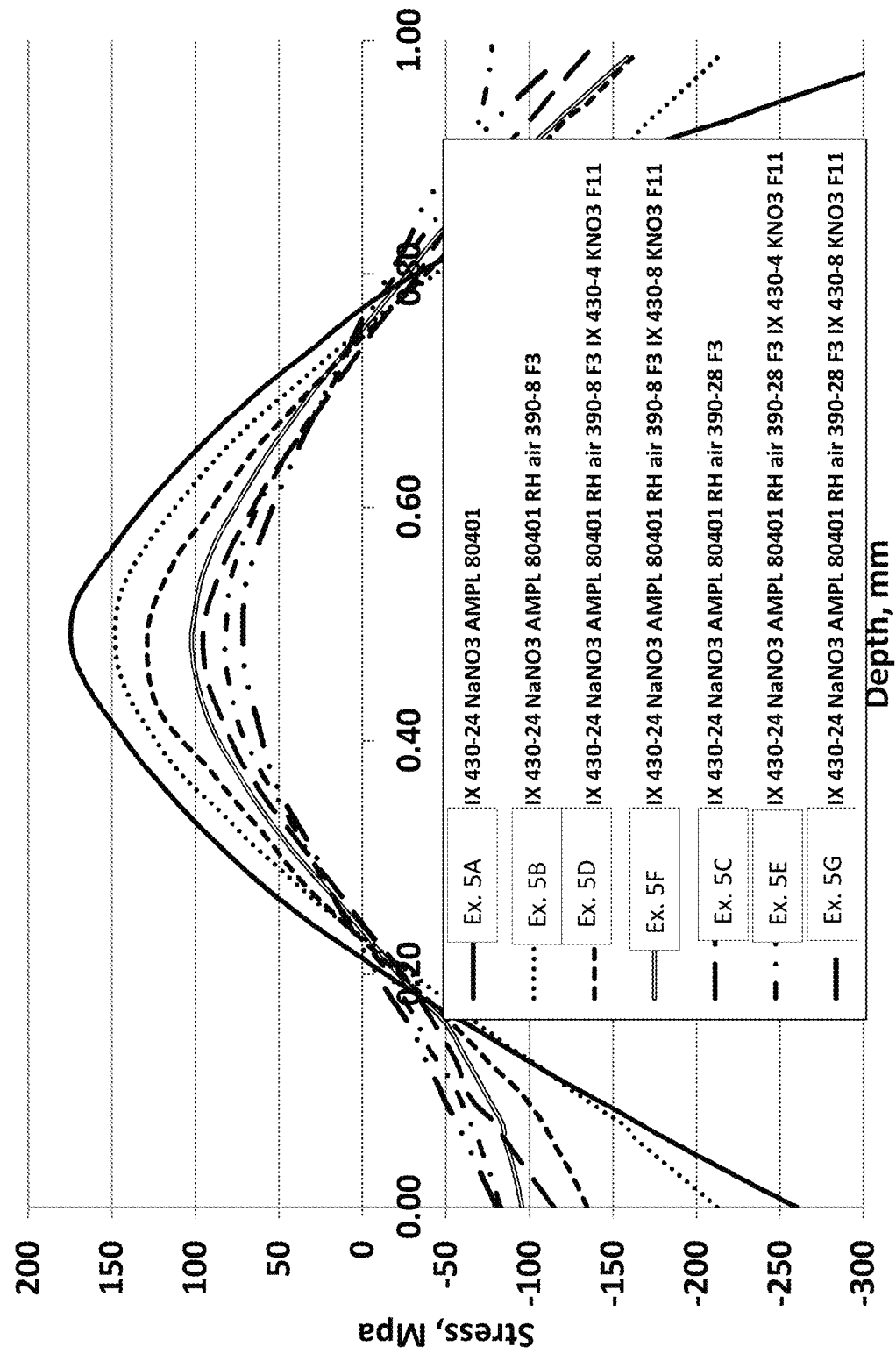
FIG. 21 is a graph showing the stress profiles of Examples 5A-5G as a function of depth.
Figure 22:
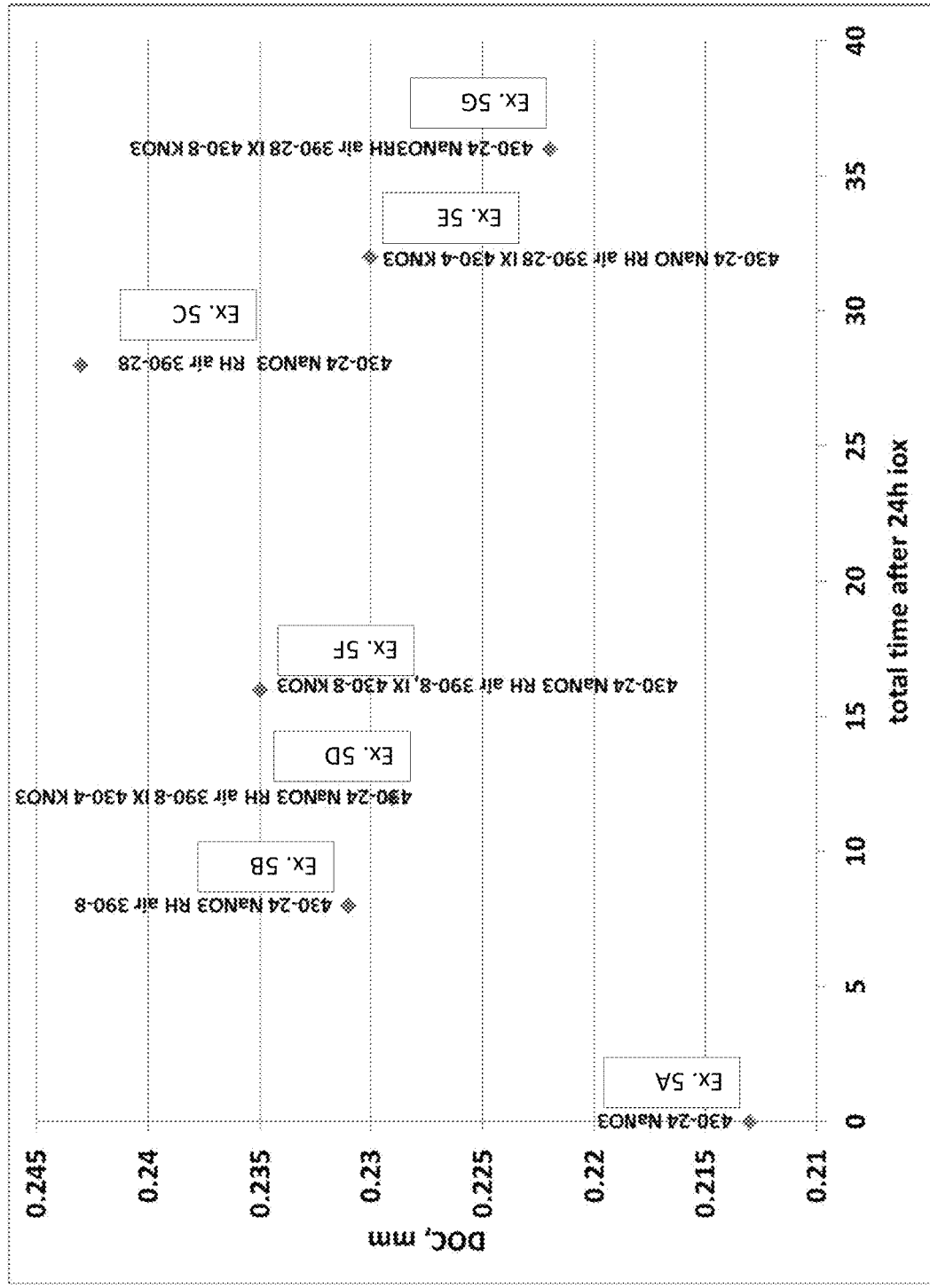
FIG. 22 is a graph showing the DOC values for Examples 5A-5G as a function of duration of the second and/or third ion exchange steps.
Figure 23:
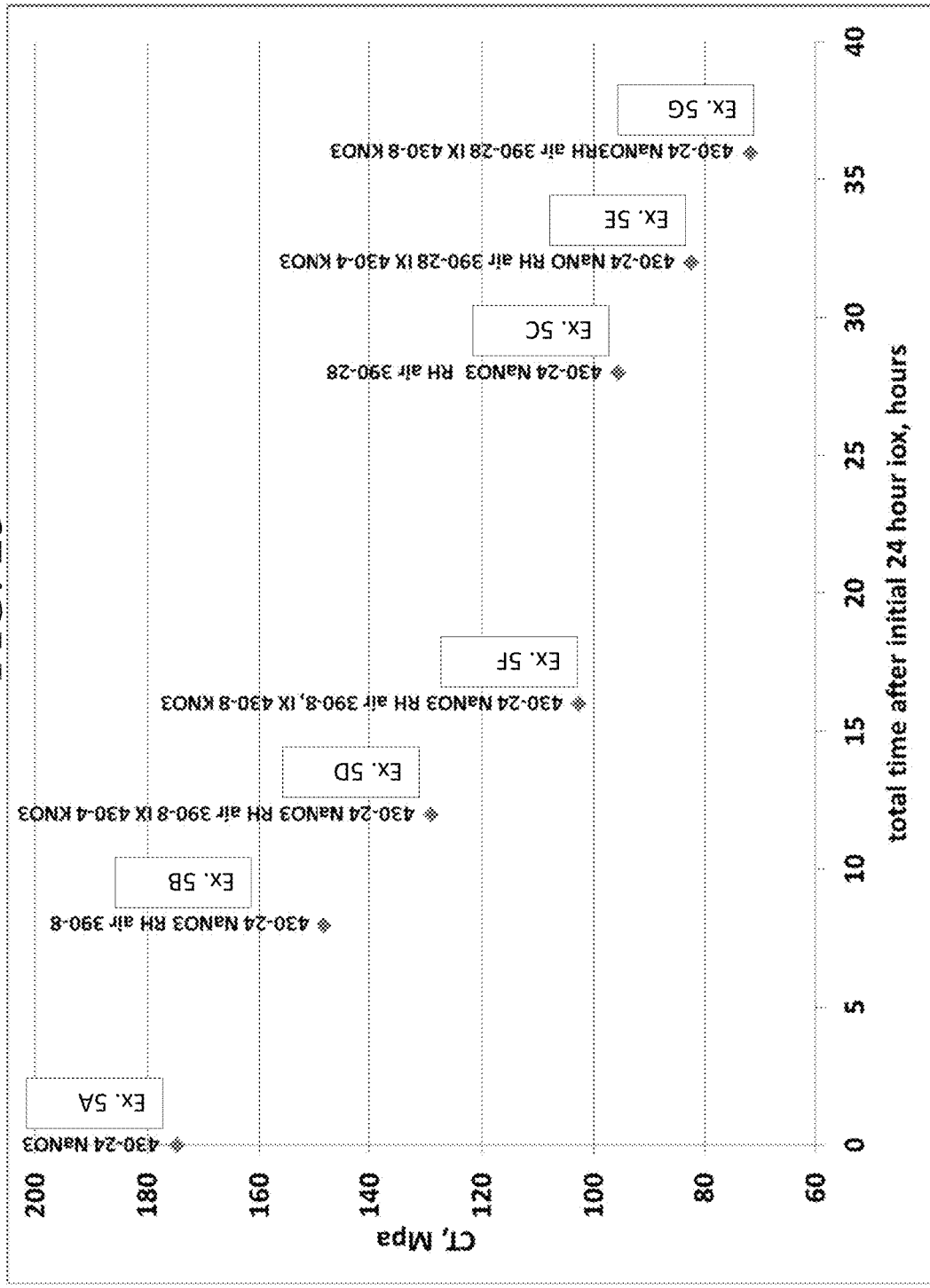
FIG. 23 is a graph showing the CT values Examples 5A-5G as a function of duration of the second and/or third ion exchange steps.

The stress profiles of the resulting glass-based articles are shown in FIG. 21, with depth or thickness of the glass-based articles plotted on the x-axis and stress plotted on the y-axis. The positive stress values are CT values and the negative stress values are the CS values. As shown in FIG. 21, as the duration of the second and/or third heat treatments is increased, the DOC increased and the CT decreased. The decrease in DOC and CT in shown more clearly in FIGS. 22 and 23, respectively.

The glass-based articles of Examples 5A-5G were then subjected to a poke test in which one side of the glass-based article is adhered to tape and the opposite bare side is impacted with sharp implement and fractured. The resulting number of fragments can be correlated to the stored tensile energy of the glass-based article. Examples 5A, 5B and 5D exhibited numerous fragments (i.e., in excess of 50 and even 100), while Example 5F exhibited 10 fragments, Example 5C exhibited 3 fragments, and Example 5E and 5G exhibited 4 fragments. Examples 5A, 5B and 5D, which fractured into numerous fragments exhibited higher CT (greater than about 100 MPa) than Examples 5C, 5E, 5F and 5G which all had CT values of about 100 MPa or less.

Example 6

Figure 25:
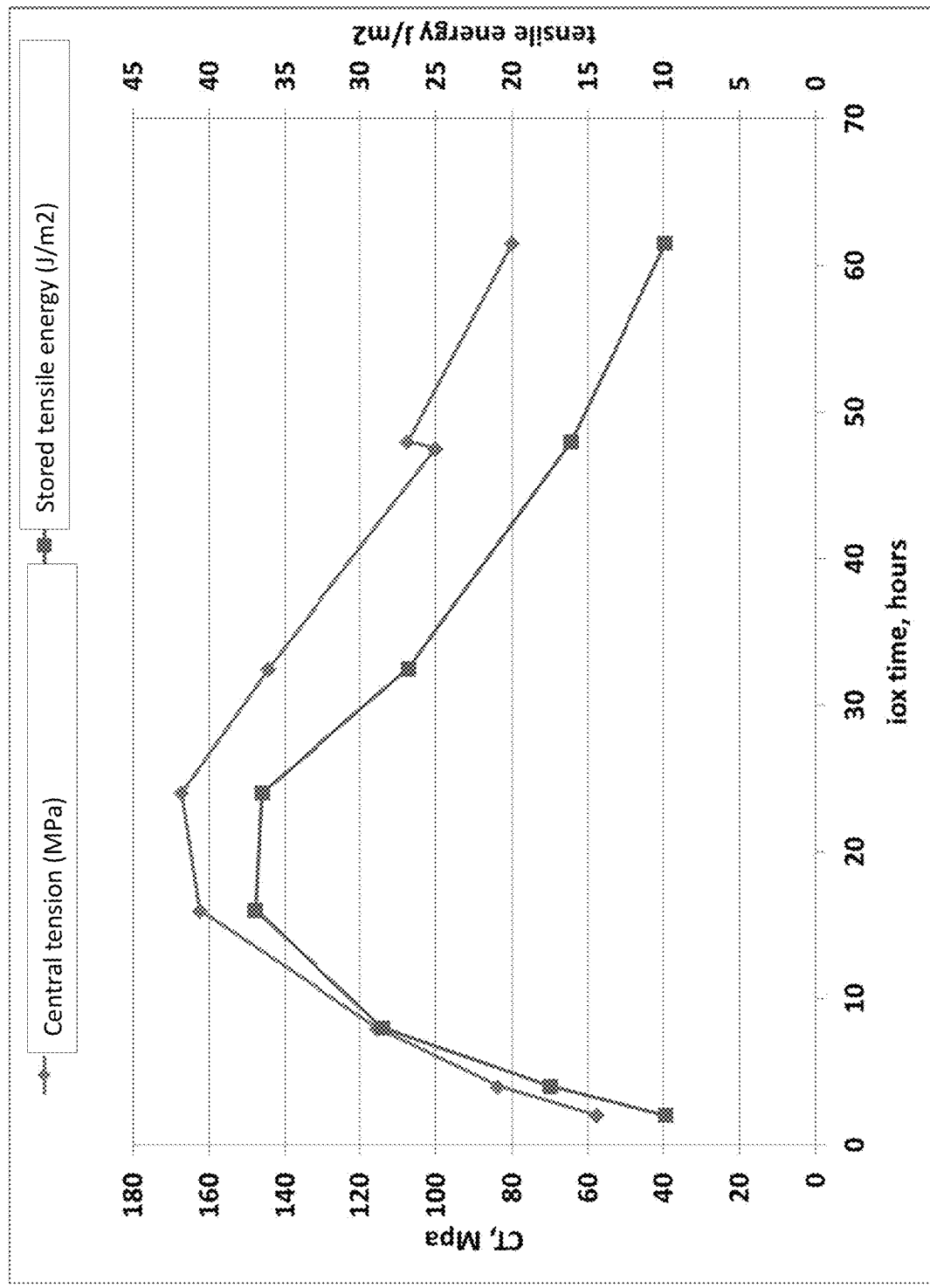
FIG. 25 is a graph showing the change in central tension values and stored tensile energy, both as a function of ion exchange time for Examples 6A-6G.

Glass substrates having a nominal composition as shown in Table 2 and each having a thickness of about 1 mm were subjected to chemical strengthening in a molten salt bath including 100% NaNO$_3$ and a temperature of 430° C. The terms. A graph showing the change in CT values and stored tensile energy, both as a function of ion exchange time is shown in FIG. 25.

Example 7

Figure 26:
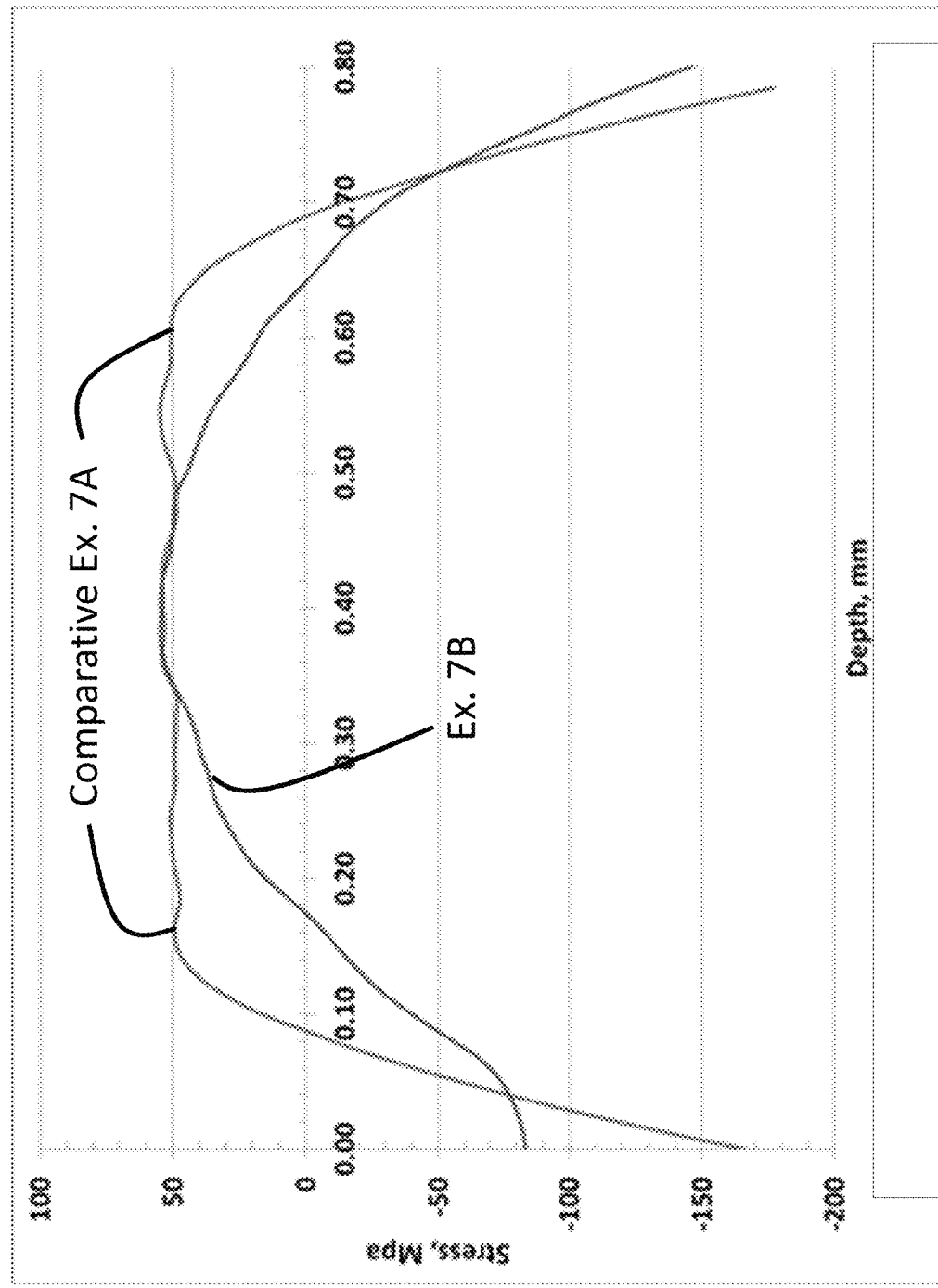
FIG. 26 is a graph showing the stress profiles of Comparative Example 7A and Example 7B as a function of depth.

Glass substrates having a nominal composition as shown in Table 2 and having a thicknesses of about 0.8 mm each were subjected to chemical strengthening in a molten salt bath including a mixture of NaNO$_3$ and NaSO$_4$ and a temperature of 500° C. for 15 minutes (Comparative Example 7A) and for 16 hours (Example 7B). The stress profile of the glass-based articles of Examples 7A and 7B are shown in FIG. 26. A shown in FIG. 26, Comparative Example 7A exhibited a known stress profile, whereas, Example 7B showed a stress profile according to one or more embodiments of this disclosure. The stored tensile energy of the glass-based articles of Examples 7A and 7B was calculated in the same manner as Examples 4B-4D. The calculated stored tensile energy is plotted as a function of measured CT (MPa), as shown in FIG. 27.

Figure 27:
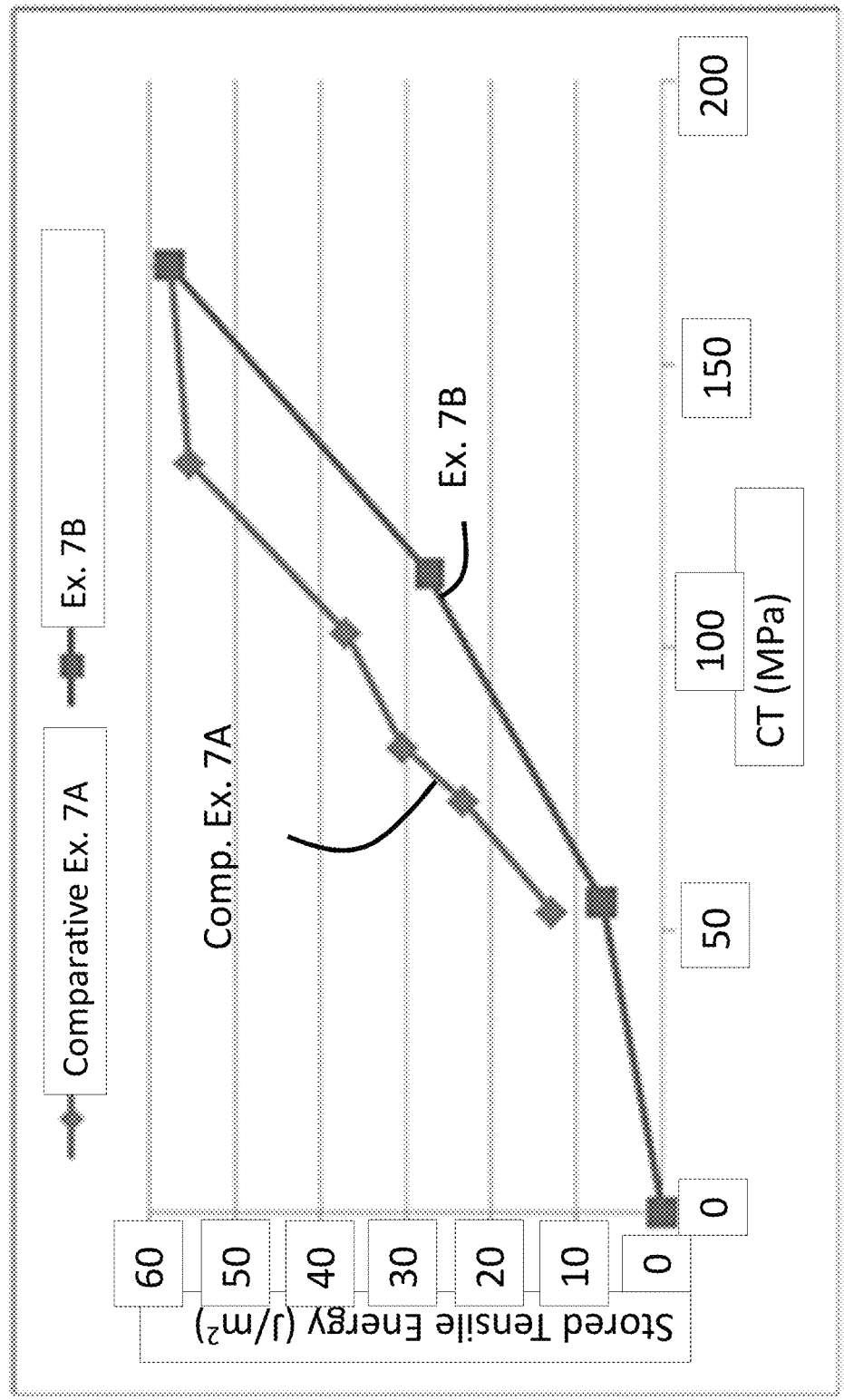
FIG. 27 is a graph showing the stored tensile energy of Comparative Example 7A and Example 7B as a function of CT.

As shown in FIG. 27, Comparative 7A exhibited much greater stored tensile energy values for a given CT value than Example 7B (for the same CT value). In this figure, CT is the maximum CT in the sample. Specifically, at a CT of about 55 MPa, Comparative Example 7A exhibited a stored tensile energy of about 12.5 J/m$^2$, whereas Example 7B exhibited a stored tensile energy of about 9 J/m$^2$. Comparative Example 7A and Example 7B were fractured and Example 7B fractured into fewer pieces than Comparative Example 7A, which fractured into a significantly greater number of pieces. Accordingly, without being bound by theory, it is believed that controlling the stored tensile energy may provide a way to control or predict fragmentation patterns or the number of fragments that result from fracture. In these examples, the CT was varied by keeping a sample in the ion exchange bath for a longer period of time while using the same bath temperature and composition. In FIG. 27, the point 0,0 was not experimental, but is would one of ordinary skill in the art would expect to be the case, i.e., when there is 0 CT, there will be 0 stored tensile energy.

Glass substrates having a nominal composition as shown in Table 2 and having a thicknesses of about 1 mm each were subjected to chemical strengthening in a molten salt bath including $NaNO_3$ and a temperature of 430° C. for 4 hours (Comparative Example 7C) and for 61.5 hours (Example 7D). Comparative Example 7C exhibited a known stress profile, whereas, Example 7D showed a stress profile according to one or more embodiments of this disclosure. The stored tensile energy of Examples 7C and 7D was calculated using the same method used with Examples 4B-4D and plotted as a function of measured CT (MPa), as shown in FIG. 28.

Figure 28:
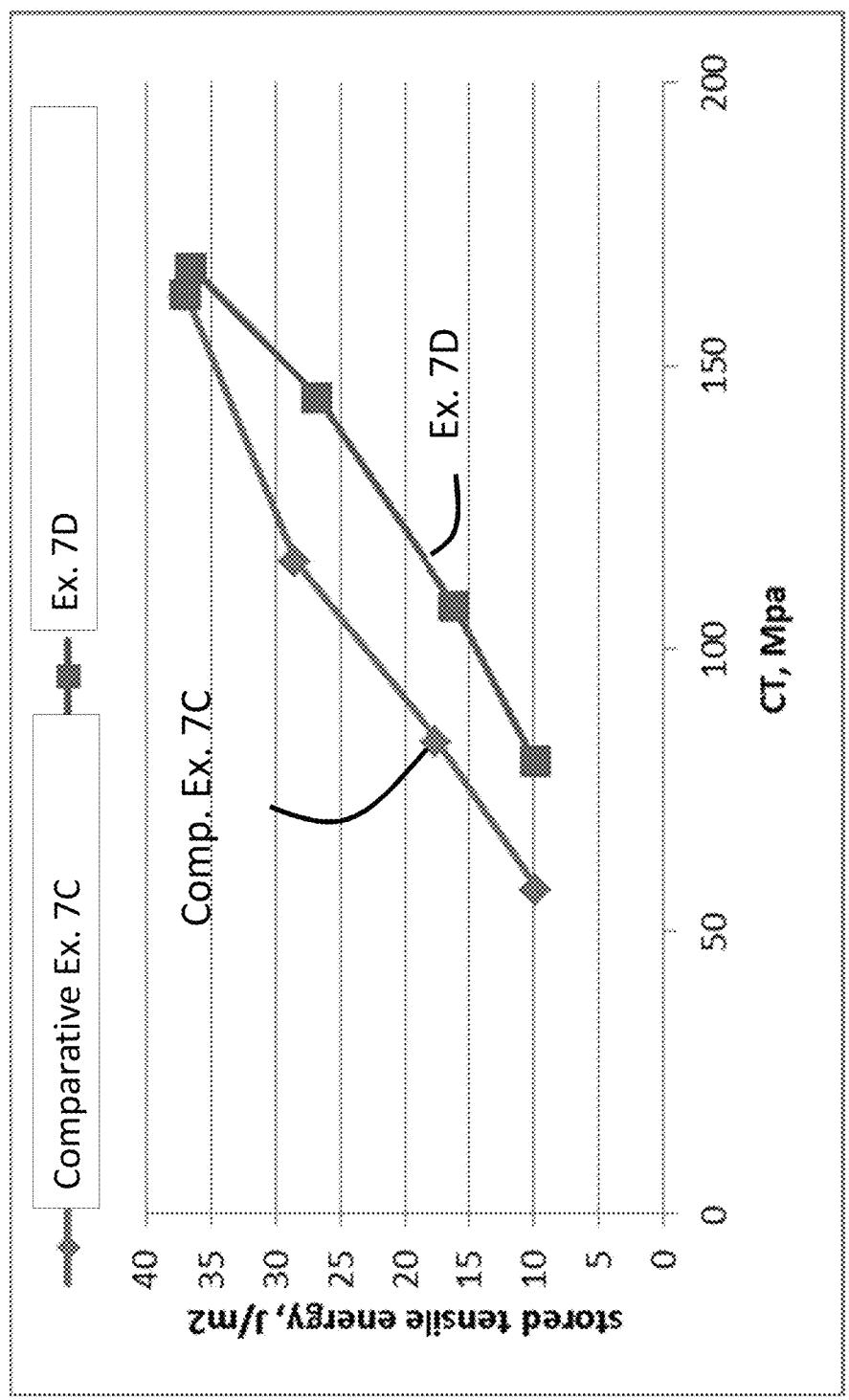
FIG. 28 is a graph showing stored tensile energy of Comparative Example 7C and Example 7D as a function of CT.

As shown in FIG. 28, Comparative 7C exhibited much greater stored tensile energy values for a given CT (again, as with FIG. 27, these are maximum CT values, and again the values were varied by using the same ion exchange bath temperature and composition, but with longer periods of time) value than Example 7D (for the same CT value). Comparative Example 7C and Example 7D were fractured and Example 7D fractured into fewer pieces than Comparative Example 7C, which fractured into a significantly greater number of pieces.

Example 8

Glass substrates having a nominal composition of 70.9 mol % $SiO_2$, 12.8 mol % $Al_2O_3$, 1.95 mol % $B_2O_3$, 7.95 mol % $Li_2O$, 2.43 mol % $Na_2O$, 2.98 mol % MgO, 0.89 mol % ZnO, and 0.1 mol % $SnO_2$ and having a thicknesses of about 0.8 mm were subjected the ion exchange conditions of Table 5. Various properties of Example 8 are compared to Example 2 in Table 6.

TABLE 5

Ion exchange conditions for Example 8.

| Condition | Bath Composition | Bath Temperature (° C.) | Immersion time |
|---|---|---|---|
| 1 | 100% $NaNO_3$ | 430° C. | 16 hours |
| 2 | 20% $NaNO_3$, 80% $KNO_3$ | 430° C. | 11 hours |
| 3 | 100% $NaNO_3$ | 430° C. | 24 hours |
| 4 | 20% $NaNO_3$, 80% $KNO_3$ | 430° C. | 12.5 hours |

TABLE 6

Comparison of properties for Example 8 and Example 2.

| Property | Units | Ex. 8 | Ex. 2 |
|---|---|---|---|
| Strain point | ° C. | 592 | 615 |
| Anneal point | ° C. | 642 | 663 |
| Young's Modulus | GPa | 81.4 | 83.8 |
| Shear Modulus | GPa | 33.8 | 34.3 |
| Poisson's ratio | | 0.211 | 0.222 |
| CTE (RT-300° C.) | ppm/° C. | 4.58 | 3.84 |
| Thermal Conductivity | W/cm*K | | |
| SOC | nm/cm/MPa | 30.94 | 32.65 |
| Refractive Index (at 550 nm) | | 1.5087 | 1.532 |

The stress profiles of the glass-based articles of Example 8 were measured and exhibited the shapes described herein.

Glass substrates according to Example 2, Comparative Examples 8A and 8B were provided having the same thickness as Example 8. The glass substrates according to Example 2 were ion exchanged in a molten bath of 100% $NaNO_3$, having a temperature of 430° C. for 33 hours. Comparative Example 8A was ion exchanged in a molten bath of 100% $NaNO_3$, having a temperature of 390° C. for 16 hours and also exhibited a known error function stress profile. The glass substrates according to Example 8B included a nominal composition of 57.5 mol % $SiO_2$, 16.5 mol % $Al_2O_3$, 16.7 mol % $Na_2O$, 2.5 mol % MgO, and 6.5 mol % $P_2O_5$ and were ion exchanged to exhibit a known error function stress profile. As used herein, the term "error function stress profile" refers to a stress profile resembling FIG. 1.

Figure 29:
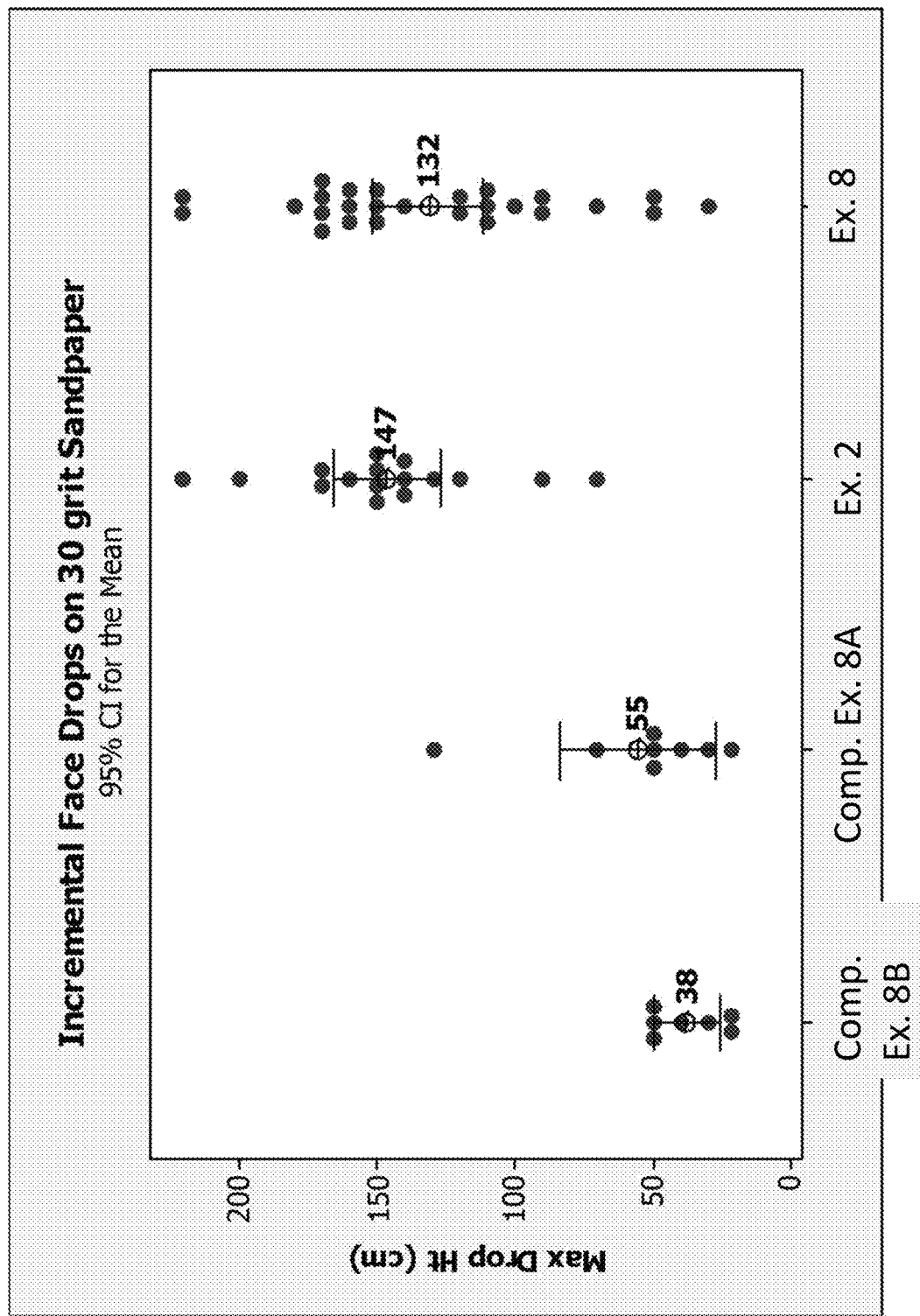
FIG. 29 is a graph showing the drop height failure for Examples 2 and 8, and Comparative Examples 8A and 8B.

The glass-based articles from Example 2, Example 8 and Comparative Examples 8A and 8B were then retrofitted onto identical mobile phone devices. The phone devices were dropped from incremental heights starting at 20 centimeters onto 30 grit sandpaper. If a glass-based article survived the drop from one height (e.g., 20 cm), the mobile phone was dropped again from a greater height (e.g., 30 cm, 40 cm, 50 cm, etc.). The height at which the glass-based article failed is plotted in FIG. 29, which also shows the average failure height for the samples of Examples 2, and 8 and Comparative Examples 8A and 8B. As shown in FIG. 29, Examples 2 and 8 exhibited failures at significantly greater drop height than Comparative Examples 8A and 8B. Specifically, Comparative Examples 8A and 8B exhibited failures at drop heights of about 38 cm and 55 cm, respectively, while Example 2 and 8 exhibited failures at drop heights of about 147 cm and 132 cm, respectively.

The same test was repeated with new samples using the same mobile phone device onto 180 grit sandpaper. The average failure height for Comparative Example 8A was 204 cm, the average failure height for Comparative Example 8B was 190 cm, the average failure height for Example 2 was 214 cm and the average failure height for Example 8 was 214 cm.

Glass substrates according to Comparative Example 8C, having a nominal composition of 65 mol % $SiO_2$, 5 mol % $B_2O_3$, 14 mol % $Al_2O_3$, 14 mol % $Na_2O$, 2 mol % MgO, and 0.1 mol % $SnO_2$ and a thickness of 0.8 mm, were ion exchanged to exhibit a known error function stress profile The glass-based article samples of Example 2 and Comparative Example 8B (exhibiting the stress profile described above in this Example), Comparative Example 8C and the glass-based articles of Example 8 ion exchanged according to Condition 4, as shown in Table 5, were subjected to A-ROR testing as described herein.

Figure 30:
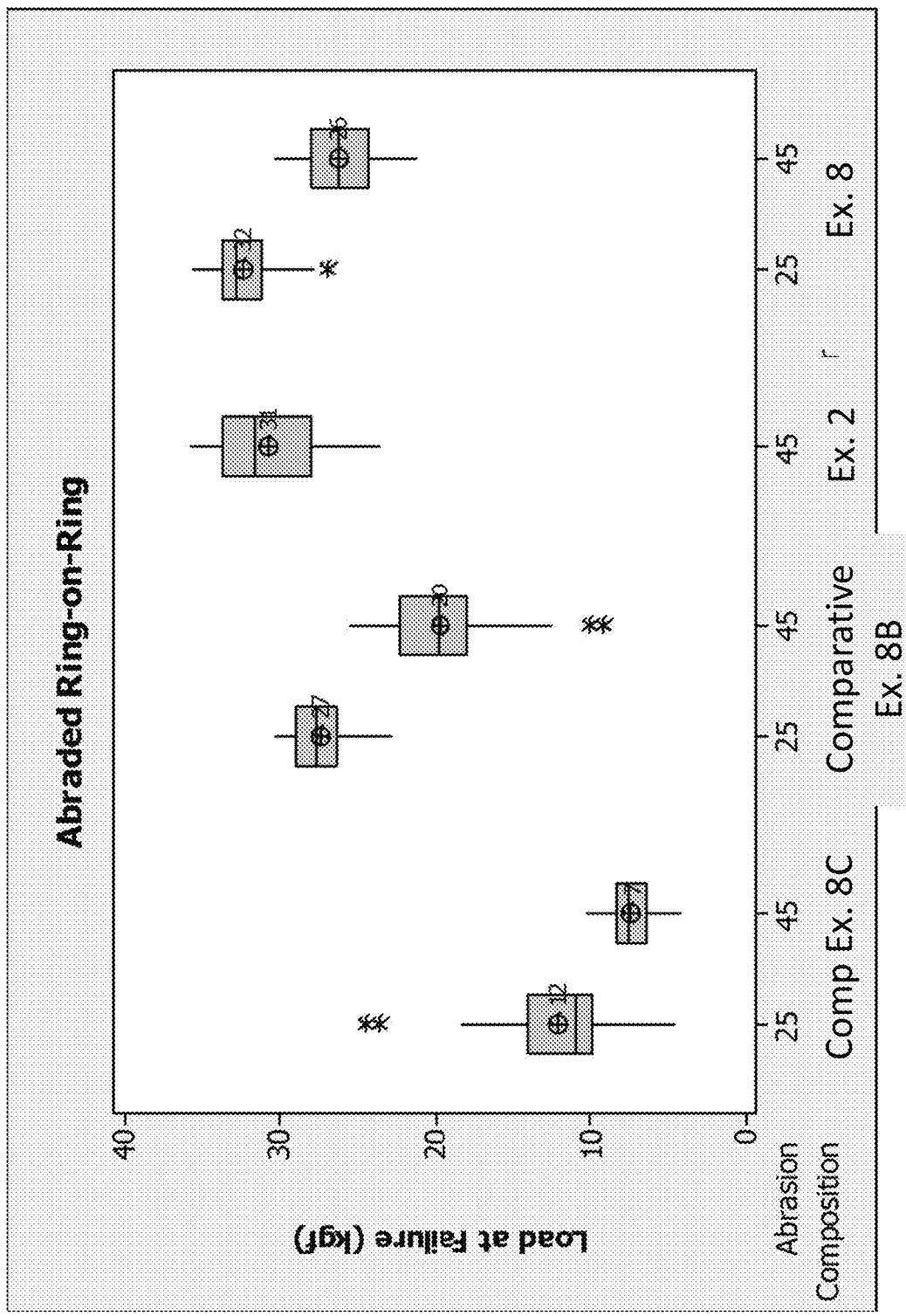
FIG. 30 is a graph showing the abraded ring-on-ring results for Examples 2 and 8, and Comparative Examples 8B and 8C.

Examples 6 and 8 and Comparative Example 8C were abraded using a load or pressure of 25 psi and 45 psi, and Example 2 was abraded using a load of 25 psi, only. The AROR data is shown in FIG. 30. As shown in FIG. 30, Examples 2 and 8 exhibited higher load to failure than Comparative Example 8B and Comparative Example 8C at the respective abrasion load or pressure.

Figure 31:
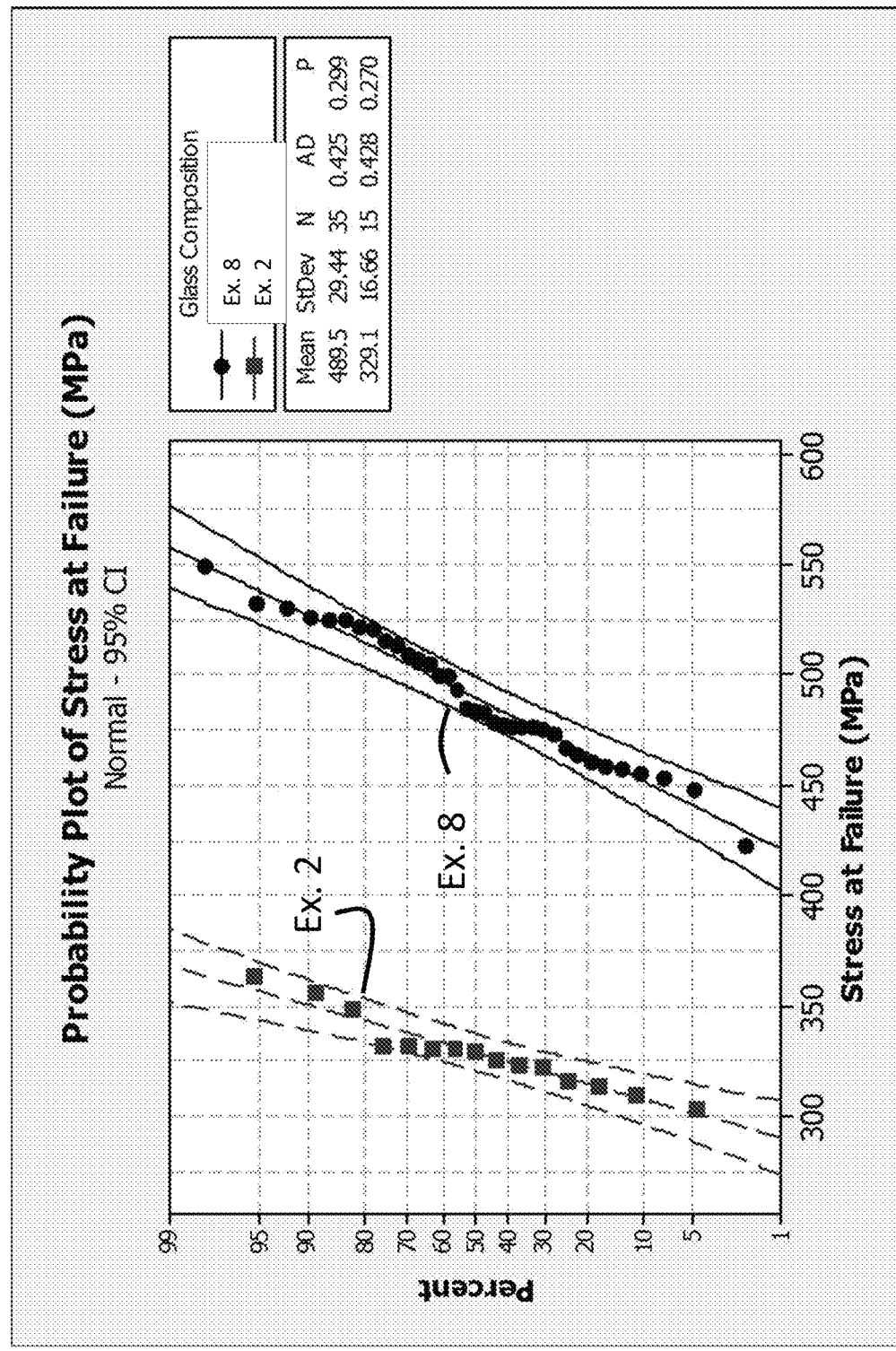
FIG. 31 is a Weibull distribution plot showing the 4-point bend results for Examples 2 and 8B.

Glass-based article samples of Examples 2 (ion exchanged as described above in this Example) and 8 (ion exchanged according to Condition 4) were subjected a 4-point bend test. The results are shown in the Weibull distribution plot of FIG. 31. As shown in FIG. 31, Example 8 exhibited higher stress or load to failure (e.g., greater than about 400 MPa).

As shown above, glass-based articles made from compositions having a strain point greater than 525° C. enable ion exchange temperatures (or ion exchange bath temperatures) in the range from about 350° C. to about 480° C. In some embodiments, glass compositions exhibiting a monovalent ion diffusivity greater than about 800 square micrometers/hour enable the metal oxides diffusing into the glass based article to penetrate the entire depth or thickness of the article quickly such that stress relaxation is minimized, Excessive stress relaxation can reduce the surface compressive stress of the glass-based article.

It will be apparent to those skilled in the art that various modifications and variations can be made without departing from the spirit or scope of the invention.

Example 9

Figure 32:
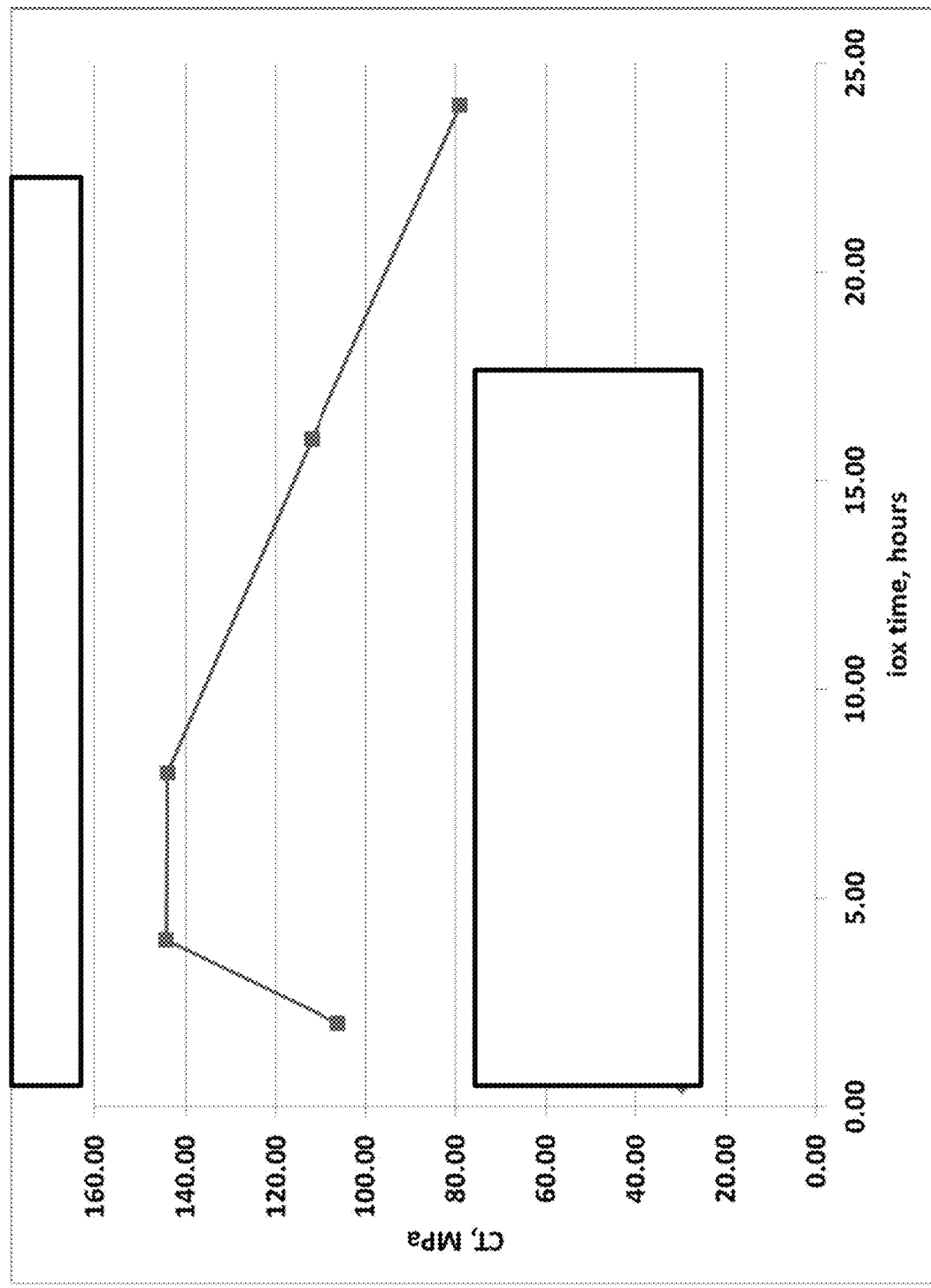
FIG. 32 is a graph showing the maximum CT values for Examples 9A-9E as a function of ion exchange time.

Glass substrates having the same composition as Example 8 and a thickness of about 0.8 mm, were subjected the ion exchange by immersing in a 100% NaNO3 molten salt bath having a temperature of 430° C. according to the conditions provided in Table 7. The resulting glass-based articles exhibited maximum CT values, which are plotted as a function of ion exchange time in FIG. 32.

TABLE 7

Ion exchange conditions for Examples 9A-9E.

| Example | Time immersed in bath (hours) | Maximum CT (MPa) |
| --- | --- | --- |
| 9A | 2 hours | 105 |
| 9B | 4 hours | 145 |
| 9C | 8 hours | 144 |
| 9D | 16.5 hours | 115 |
| 9E | 24 hours | 79 |

Figure 33:
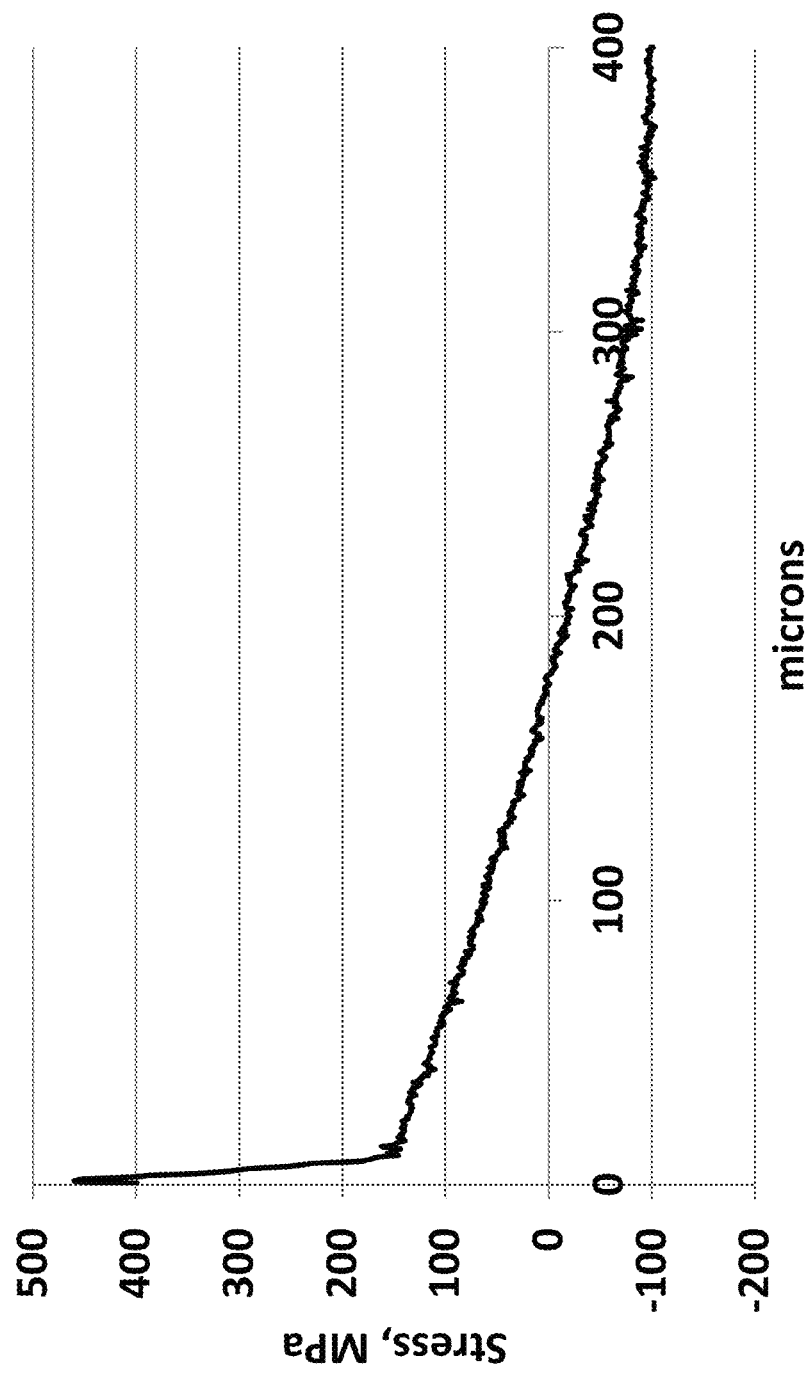
FIG. 33 is a graph showing the measured stress of Example 9D as a function of depth extending from the surface of the glass-based article of Example 9D into the glass-based article.

The stress profile for Example 9D was measured using a refracted near-field (RNF) measurement, as described in U.S. Pat. No. 8,854,623, entitled "Systems and methods for measuring a profile characteristic of a glass sample", which is incorporated herein by reference in its entirety. FIG. 33 shows the measured stress as a function of depth extending from the surface of the glass-based article of Example 9D into the glass-based article. The stress at specific depths is shown in Table 8, including at the "knee" which is the depth at which the slope of the stress changes drastically.

TABLE 8

Stress at specific depths of Example 9D.

| Depth (micrometers) | Stress (MPa) |
| --- | --- |
| 12 ("knee") | 151 |
| 50 | 105 |

TABLE 8-continued

Stress at specific depths of Example 9D.

| Depth (micrometers) | Stress (MPa) |
| --- | --- |
| 100 | 66 |
| 150 | 20 |

Example 10

Example 10A included a glass substrate having the same composition as Example 1 and a thickness of 0.8 mm. The glass substrate was ion exchanged in a single molten salt bath including 80% KNO3 and 20% NaNO$_3$, and having a temperature of about 430° C., for 16 hours. The resulting glass-based article exhibited the stress profile as described in Table 9.

TABLE 9

Stress profile of Example 10A.

| | |
| --- | --- |
| Surface Compressive Stress | 500 MPa |
| Depth of layer for potassium (as measured by FSM technique) | 12 micrometers |
| Stress at potassium DOL | 151 MPa |
| Maximum CT | 90 MPa |
| DOC | 160 micrometers |

Figure 34:
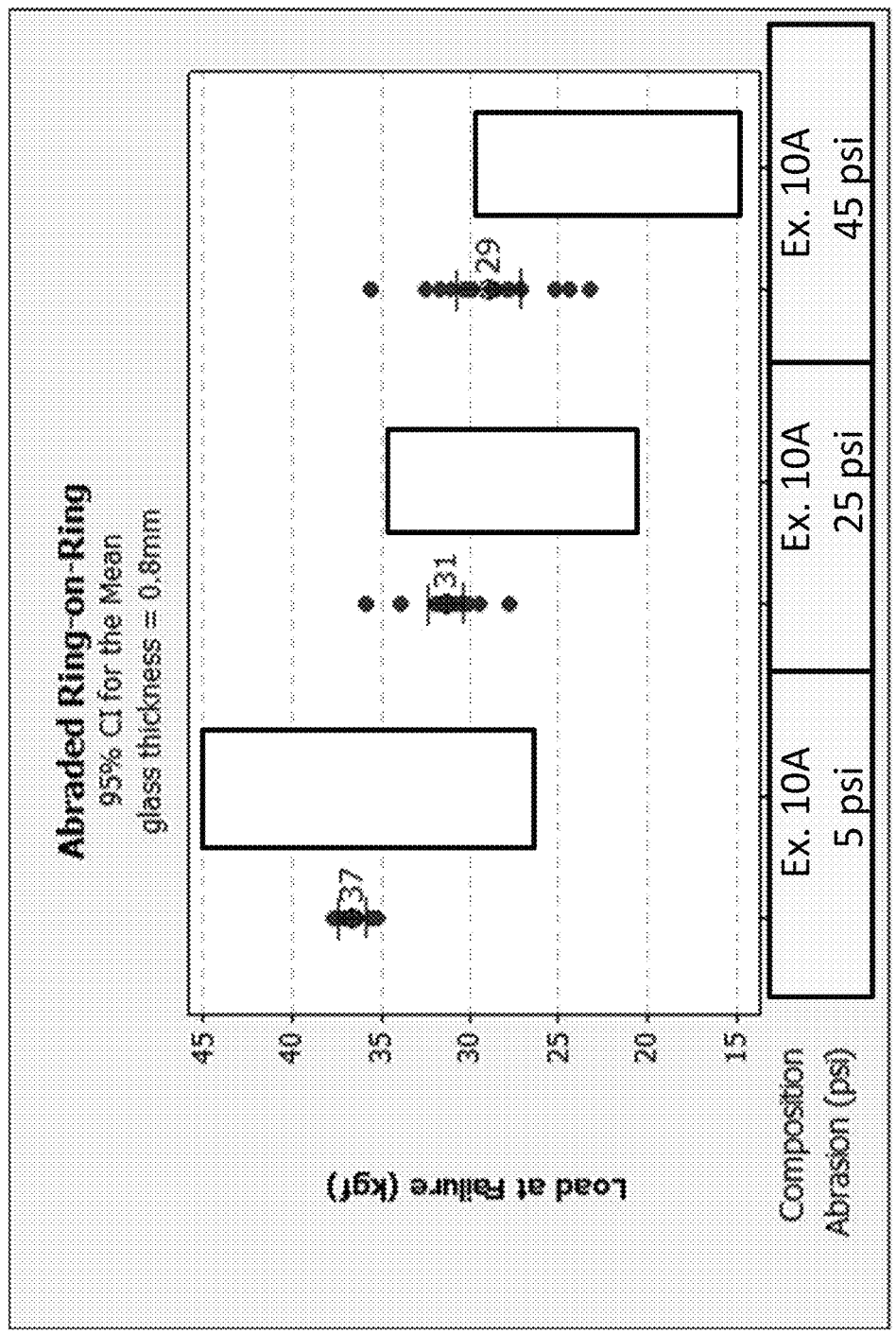
FIG. 34 is a graph showing the load to failure values for glass-based articles according to Example 10A after being abraded at different loads or pressures.

Glass-based articles according to Example 10A were subjected to AROR testing as described herein. One set of glass-based articles was abraded using a load or pressure of 5 psi, a second set of glass-based articles was abraded using a load or pressure of 25 psi, and a third set of glass-based articles was abraded using a load or pressure of 45 psi. The AROR data is shown in FIG. 34. As shown in FIG. 34, all of the glass-based articles according to Example 10A exhibited an average load to failure of greater than about 25 kgf.

Figure 35:
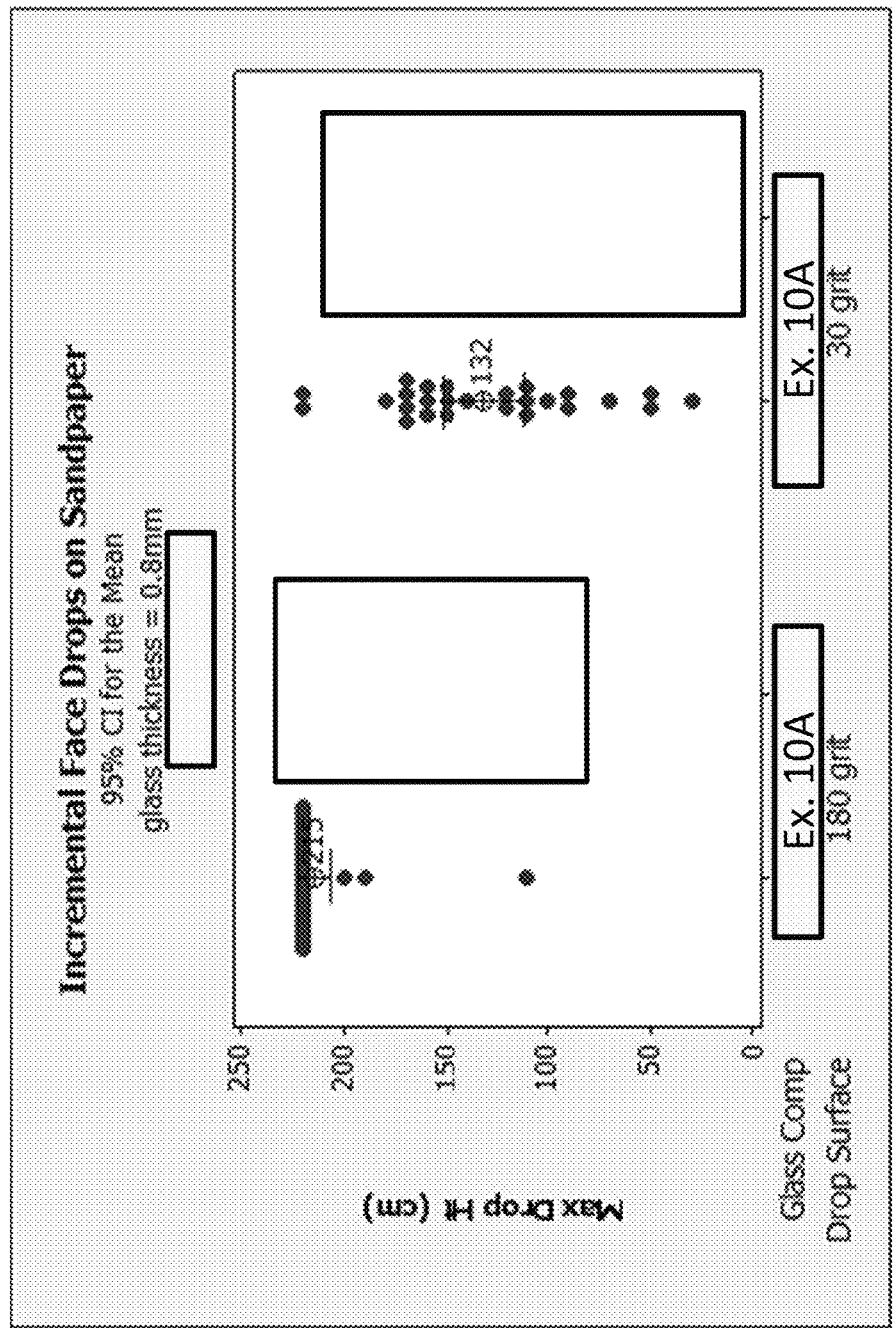
FIG. 35 is a graph showing the heights at which the glass-based articles according to Example 10A failed after being dropped onto 180 grit sandpaper and then onto 30 grit sandpaper.

Glass-based articles according to Example 10A were retrofitted onto identical mobile phone devices. The phone devices were dropped from incremental heights starting at 20 centimeters onto 180 grit sandpaper. If a glass-based article survived the drop from one height (e.g., 20 cm), the mobile phone was dropped again from a greater height (e.g., 30 cm, 40 cm, 50 cm, etc.) up to a height of 225 cm. The surviving glass-based articles were then dropped onto 30 grit sandpaper (in the same phone devices). The height at which the glass-based article failed on both 180 grit sandpaper and 30 grit sandpaper is plotted in FIG. 35. As shown in FIG. 35, all but three glass-based article of Example 10A survived being dropped onto 180 grit sandpaper up to heights of about 225 cm (providing an average survival drop height of about 215 cm). The average survival drop height onto 30 grit sandpaper was 132 cm.

The glass based articles according to Example 10A exhibited a dielectric constant of about 5.8 to about 6 over a frequency range from about 480 mHz to about 3000 mHz. The glass-based articles according to Example 10A exhibited a dielectric loss tangent in the range from about 0.010 to about 0.013 over a frequency range from about 480 mHz to about 3000 mHz.

The refractive index of the glass-based articles according to Example 10A is in the range from about 1.496 to about 1.523 over a range from about 380 nm to about 1550 nm, and from about 1.496 to about 1.503 over a wavelength range from about 380 nm to about 800 nm.

The glass-based articles according to Example 10A were subjected to various chemical treatments as shown in Table 10. The chemical durability of the glass-based articles was compared to Comparative Examples 10B, 10C and 10D. Comparative Example 10B was a glass substrate having a nominal composition of 64.3 mol % $SiO_2$, 7.02 mol % $B_2O_3$, 14 mol % $Al_2O_3$, 14 mol % $Na_2O$, 0.5 mol % $K_2O$, 0.03 mol % $Fe_2O_3$, and 0.1 mol % $SnO_2$. Comparative Example 10C was a glass substrate having a nominal composition of 64.75 mol % $SiO_2$, 5 mol % $B_2O_3$, 14 mol % $Al_2O_3$, 13.75 mol % $Na_2O$, 2.4 mol % MgO, and 0.08 mol % $SnO_2$. Comparative Example 10D included a glass substrate having a nominal composition of 57.5 mol % $SiO_2$, 16.5 mol % $Al_2O_3$, 16.71 mol % $Na_2O$, 2.8 mol % MgO, 0.05 mol % $SnO_2$ and 6.5 mol % $P_2O_5$.

TABLE 10

Chemical durability of Example 10A and Comparative Examples 10B, 10C and 10D.

| Chemical Treatment | Weight loss (mg/cm2) | | | |
|---|---|---|---|---|
| | Comparative Example 10B | Comparative Example 10C | Comparative Example 10D | Example 10A |
| 5% w/w HCl, 95° C., 24 hours | 29.3 | 6.7 | 50 | 5.77 |
| 5% w/w NaOH, 95° C., 6 hours | 2.8 | 2.4 | 5.8 | 2.68 |
| 10% HF, room temperature, 20 minutes | 20.8 | 18.1 | 37.4 | 24.03 |
| 10% ammonium bifluoride (ABF), room temperature, 20 minutes | 2 | 2.7 | 3.2 | 0.98 |

Example 11

Example 11A included glass substrates having the same composition as Example 1 and a thickness of 0.8 mm. Comparative Example 11B included glass substrates having the same composition as Comparative Example 10D and a thickness of 0.8 mm. The glass substrates of Example 11A were chemically strengthened in a single step using a single bath, as described in Table 11. The glass substrates of Comparative Example 3B was ion exchanged in a two-step process, as described in Table 11.

TABLE 11

Ion exchange conditions for Example 11A and Comparative Example 11B.

| | | Example 11A | Comparative Example 11B |
|---|---|---|---|
| 1st Step | Molten salt bath composition | 20% NaNO3/ 80% KNO3 | 49% NaNO3/ 51% KNO3 |
| | Bath Temperature | 430° C. | 460° C. |
| | Immersion time | 16 hours | 14 hours |
| 2nd Step | Molten salt bath composition | — | 99.5% KNO3/ 0.5%NaNO3 |
| | Bath Temperature | — | 390° C. |
| | Immersion time | — | 0.25 hours |

TABLE 11-continued

Ion exchange conditions for Example 11A and Comparative Example 11B.

| | | Example 11A | Comparative Example 11B |
|---|---|---|---|
| Properties of resulting glass article | Surface CS | 500 MPa | 825 MPa |
| | Potassium DOL | 12 microns | 10 microns |
| | Stress at potassium DOL | 150 MPa | 220 MPa |
| | DOC | 160 microns | 100 microns |

Figure 36:
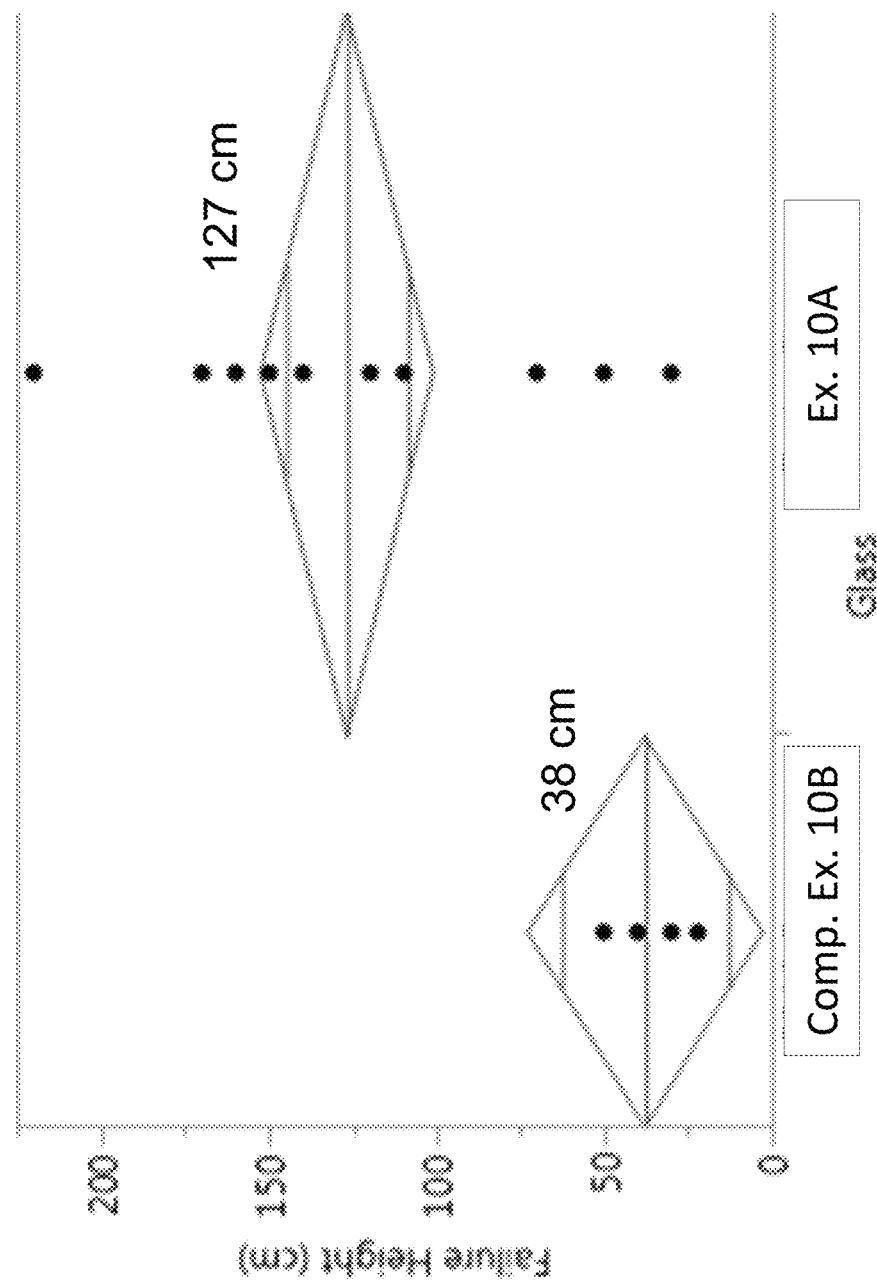
FIG. 36 is a graph showing the heights at which the glass-based articles according to Example 10A and Comparative Example 10B failed after being dropped onto 30 grit sandpaper.

The glass-based articles according to Example 11A and Comparative Example 11B were retrofitted onto identical mobile phone devices. The phone devices were dropped from incremental heights starting at 20 centimeters onto 30 grit sandpaper. The height at which the glass-based article failed on 30 grit sandpaper is plotted in FIG. 36. As shown in FIG. 36, the glass-based articles of Example 11A exhibited an average survival drop height that is more than three times (i.e., 127 cm) the average survival drop height of Comparative Example 11B (i.e., 38 cm).

Figure 37:
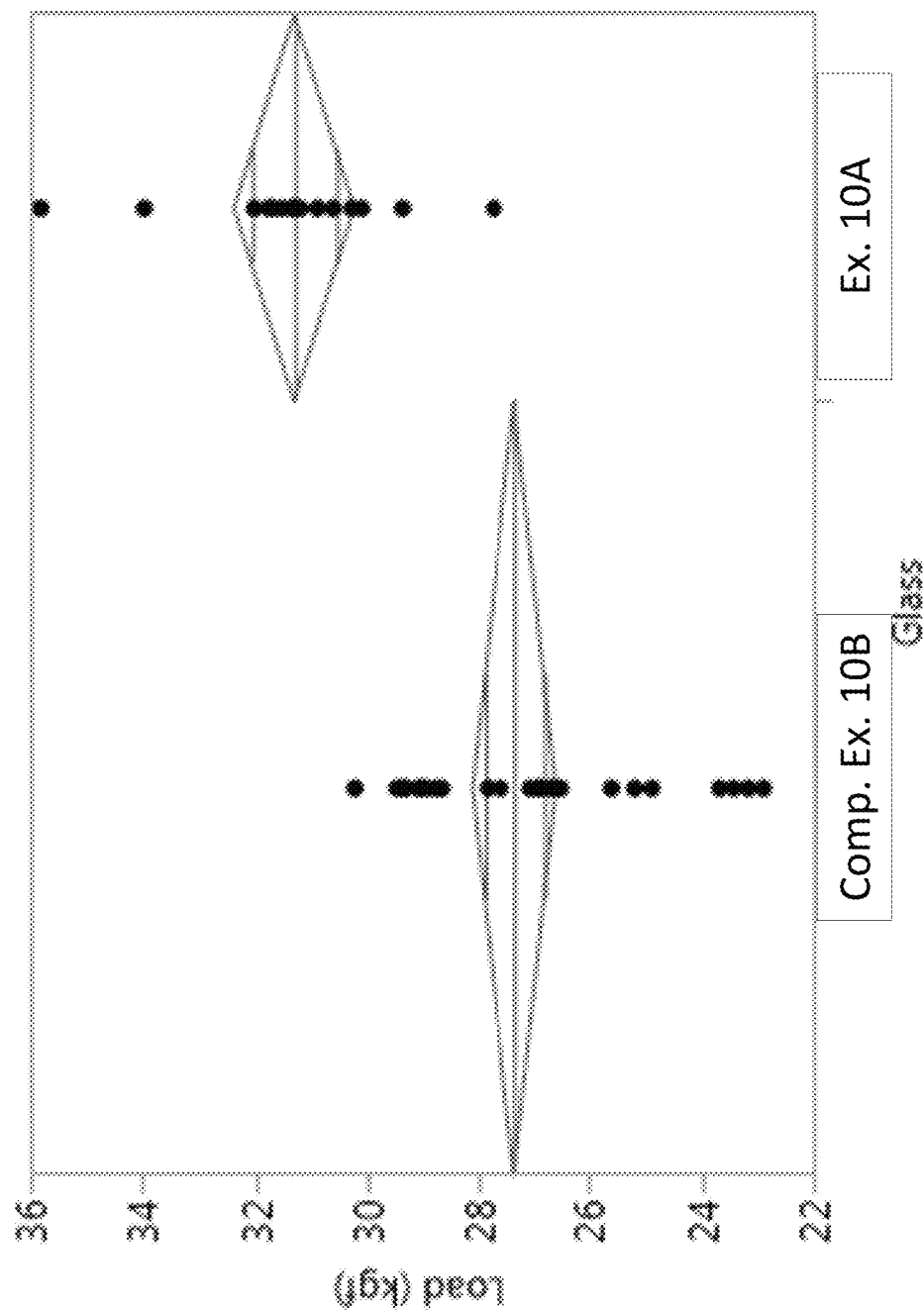
FIG. 37 is a graph comparing the average load to failure of glass-based articles according to Example 10A and Comparative Example 10B, after being abraded at a load or pressure of 25 psi.
Figure 38:
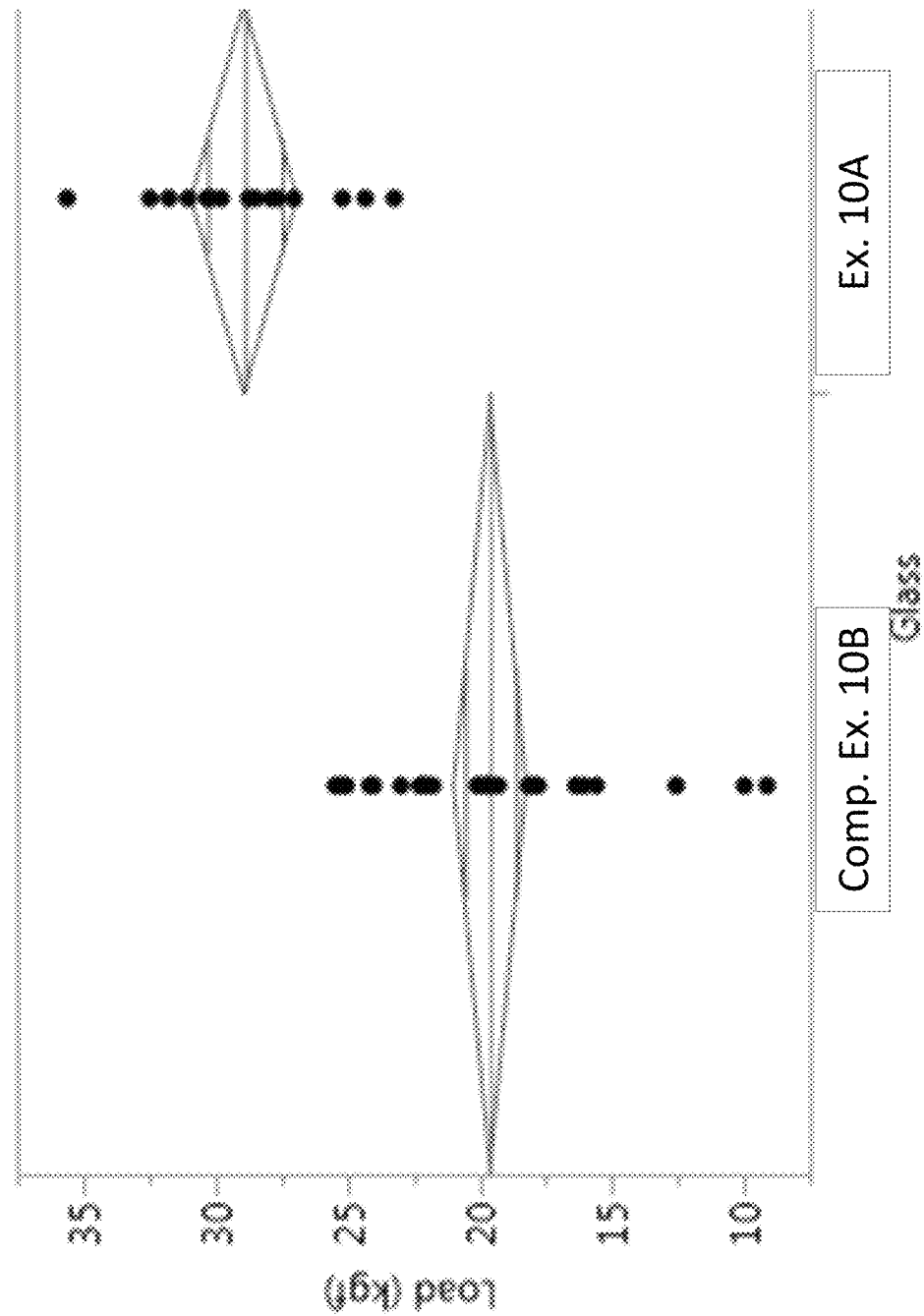
FIG. 38 is a graph comparing the average load to failure of glass-based articles according to Example 10A and Comparative Example 10B, after being abraded at a load or pressure of 45 psi.

Glass-based articles according to Example 11A and Comparative Example 11B were subjected to AROR testing, as described herein, using a load or pressure of 25 psi. The glass-based substrates of Example 10A exhibited an average load to failure of about 31.3 kgf, while the glass-based substrates of Comparative Example 10B exhibited an average load to failure of about 27.4 kgf, as shown in FIG. 37. When the abrasion load or pressure was increased to 45 psi, the difference in average load to failure for Example 10A and Comparative Example 10B increased. Specifically, under a 45 psi load or pressure, Example 10A exhibited an average load to failure of about 28.9 kgf, while Comparative Example 10B exhibited an average load to failure of about 19.6 kgf, as shown in FIG. 38.

Example 12

Examples 12A and 12B included glass substrates having the nominal composition as in Example 1H and a thickness of 0.8 mm. The glass substrates of Examples 12A were chemically strengthened at 430° C. in a bath having 6.5% Na:93.5% K for 4.5 hours, and resulted in a CS of about 656, a DOL of about 8.1, and a CSk (or compressive stress at the knee) of from about 105 to about 130 MPa. The substrates of Examples 12B were chemically strengthened at a temperature of 430° C. in a bath having 7% Na:93% K for 4.5 hours, and resulted in a CS of about 640 MPa, a DOL of about 8.2, and a CSk of about 100 MPa. Examples 12A and 12B were subjected to inverted ball drop on sandpaper (IBoS) tests according to the procedure described herein. The tests were conducted using 30 grit sandpaper and a 4.2 g stainless steel ball having a diameter of 10 mm.

TABLE 12

Sample thickness, depth of layer (DOL), surface compressive stress (CS), estimated average fracture height, and percent survival (surv.) at various heights, of samples subjected to IBoS testing.

| Sample | Thickness (mm) | CS (MPa) | DOL (μm) | Avg. Fracture Height (cm) | % surv. at 75 cm | % surv. at 80 cm | % surv. at 85 cm | % surv. at 90 cm |
|---|---|---|---|---|---|---|---|---|
| 12A | 0.8 | 656 | 8.1 | 88 | 80 | 80 | 80 | 80 |
| 12B | 0.8 | 640 | 8.2 | 76 | 60 | 60 | 60 | 40 |

Sample set 12A exhibited an average fracture height of 88 cm. Additionally, four out of five samples withstood drop heights of each 75 cm, 80 cm, 85 cm, 90 cm, and 95 cm, leading to an 80% survival rate at each of these heights. Sample set 12B exhibited an average fracture height of 76 cm. Additionally, three out of five samples withstood drop heights of each 75 cm, 80 cm, and 85 cm, leading to a 60% survival rate at each of these heights.

Sample sets 12A and 12B were also subject to Knoop Scratch Threshold testing as described above. The Samples of set 12A had a Knoop Scratch Threshold of greater than 7 N and less than 14 N. On the other hand, the Samples of set 12B had a Knoop Scratch Threshold of greater than 10 N and less than 16 N.

It will be apparent to those skilled in the art that various modifications and variations can be made without departing from the spirit or scope of the invention. For example, the various features can be combined according to the following exemplary embodiments.

Embodiment 1. A glass-based article comprising:
a first surface and a second surface defining an area (square inches) opposing the first surface defining a thickness (t);
a concentration of a metal oxide that is both non-zero and varies along a thickness range from about $0 \cdot t$ to about $0.3 \cdot t$; and
a central tension (CT) region comprising a maximum CT from $71.5/\sqrt{(t)}$ to $100/\sqrt{(t)}$,
wherein, when the glass-based article is fractured, the glass-based article fractures into more than 2 fragments/inch of the glass-based article, wherein the sample size is a 5.08 cm by 5.08 cm (2 inch by 2 inch) square.

Embodiment 2. The glass-based article of embodiment 1, wherein the concentration of the metal oxide is non-zero and varies along the entire thickness.

Embodiment 3. The glass-based article of embodiment 1 or embodiment 2, wherein a monovalent ion of the metal oxide generates a stress along the thickness range.

Embodiment 4. The glass-based article of any one of the preceding embodiments, wherein the concentration of the metal oxide decreases from the first surface to a value at a point between the first surface and the second surface and increases from the value to the second surface.

Embodiment 5. The glass-based article of any one of the preceding embodiments, further comprising a surface compressive stress (CS) of about 300 MPa or greater.

Embodiment 6. The glass-based article of embodiment 5, wherein the surface CS is about 400 MPa or greater.

Embodiment 7. The glass-based article of any one of the preceding embodiments, wherein the concentration of the metal oxide is about 0.05 mol % or greater throughout the thickness.

Embodiment 8. The glass-based article of any one of the preceding embodiments, wherein the concentration of the metal oxide at the first surface is about 1.5 times greater than the concentration of the metal oxides at a depth equal to about $0.5 \cdot t$.

Embodiment 9. The glass-based article of any one of the preceding embodiments, wherein the glass-based article comprises a total concentration of the metal oxide in the range from about 1 mol % to about 15 mol %.

Embodiment 10. The glass-based article of any one of the preceding embodiments, wherein the metal oxide comprises any one or more of $Li_2O$, $Na_2O$, $K_2O$, $Rb_2O$, and $Cs_2O$.

Embodiment 11. The glass-based article of any one of the preceding embodiments, further comprising a surface CS of about 200 MPa or greater and a chemical depth of layer of about $0.4 \cdot t$ or greater.

Embodiment 12. The glass-based article of any one of the preceding embodiments, further comprising a CS extending from the first surface to a DOC, wherein the DOC is about $0.1 \cdot t$ or greater.

Embodiment 13. The glass-based article of any one of the preceding embodiments, wherein the CT region comprises the metal oxide.

Embodiment 14. The glass-based article of embodiment 11, wherein the ratio of maximum CT to absolute value of surface CS is in the range from about 0.1 to about 0.8.

Embodiment 15. The glass-based article of any one of the preceding embodiments, wherein t comprises about 3 millimeters or less.

Embodiment 16. The glass-based article of any one of the preceding embodiments, further comprising an amorphous structure.

Embodiment 17. The glass-based article of embodiments 1-15, further comprising a crystalline structure.

Embodiment 18. The glass-based article of any one of the preceding embodiments, further exhibiting a transmittance of about 88% or greater over a wavelength in the range from about 380 nm to about 780 nm.

Embodiment 19. The glass-based article of any one of the preceding embodiments, further exhibiting CIELAB color space coordinates, under a CIE illuminant F02, of L* values of about 88 and greater, a* values in the range from about −3 to about +3, and b* values in the range from about −6 to about +6.

Embodiment 20. A glass-based article of any one of the preceding embodiments, further comprising:
a first metal oxide concentration and a second metal oxide concentration,
wherein the first metal oxide concentration is in the range from about 0 mol % to about 15 mol % from a first thickness range from about $0 \cdot t$ to about $0.5 \cdot t$, and
wherein the second metal oxide concentration is in the range from about 0 mol % to about 10 mol % from a second thickness range from about 0 micrometers to about 25 micrometers.

Embodiment 21. The glass-based article of embodiment 20, further comprising a third metal oxide.

Embodiment 22. The glass-based article of any one of the preceding embodiments, further comprising a Young's modulus of about 70 GPa or greater.

Embodiment 23. The glass-based article of any one of the preceding embodiments, further comprising a liquidus viscosity of less than about 100 kilopoise (kP).

Embodiment 24. The glass-based article of any one of the preceding embodiments, further comprising any one or more of:
a composition comprising a combined amount of $Al_2O_3$ and $Na_2O$ of about 17 mol % or less,
a composition comprising about 4 mol % or less $Na_2O$,
a composition comprising any one or more of $B_2O_3$ and ZnO, and
a composition substantially free of $P_2O_5$.

Embodiment 25. A device comprising:
a housing having front, back, and side surfaces;
electrical components that are at least partially inside the housing;
a display at or adjacent to the front surface of the housing; and
a cover substrate disposed over the display, wherein the cover substrate comprises the glass-based article of any one of embodiments 1-24.

Embodiment 26. A glass-based article comprising:
a first surface and a second surface opposing the first surface defining a thickness (t) of about 3 millimeters or less; and
a stress profile extending along the thickness,
wherein all points of the stress profile between a thickness range from about 0·t up to 0.3·t and from greater than 0.7·t, comprise a tangent with a slope having an absolute value that is greater than about 0.1 MPa/micrometers,
wherein the stress profile comprises a maximum CS, a DOC and a maximum CT in the range from about $71.5/\sqrt{(t)}$ to about $100/\sqrt{(t)}$, wherein the ratio of maximum CT to absolute value of maximum CS is in the range from about 0.01 to about 0.2 and wherein the DOC is about 0.1·t or greater, and
wherein, when the glass-based article is fractured, the glass-based article fractures into at least 2 fragments/inch, wherein the sample size is a 5.08 cm by 5.08 cm (2 inch by 2 inch) square.

Embodiment 27. The glass-based article of embodiment 26, further comprising a surface CS of about 300 MPa or greater.

Embodiment 28. The glass-based article of embodiment 26 or embodiment 27, further comprising a surface CS of about 200 MPa or greater and a chemical depth of layer of about 0.4·t or greater.

Embodiment 29. The glass-based article of any one of embodiments 26-28, further comprising a CS layer extending from the first surface to a DOC, wherein the DOC is about 0.1·t or greater.

Embodiment 30. The glass-based article of any one of embodiments 26-29, further comprising a CT region, wherein the CT region comprises a metal oxide concentration that is both non-zero and varies.

Embodiment 31. The glass-based article of any one of embodiments 26-30, further comprising ratio of maximum CT to absolute value of surface CS in the range from about 0.1 to about 0.8.

Embodiment 32. The glass-based article of any one of embodiments 26-31, further comprising a Young's modulus of about 70 GPa or greater.

Embodiment 33. The glass-based article of any one of embodiments 26-32, further comprising a liquidus viscosity of less than about 100 kP.

Embodiment 34. The glass-based article of any one of embodiments 26-33, further comprising any one or more of:
a composition comprising a combined amount of $Al_2O_3$ and $Na_2O$ of about 17 mol % or less,
a composition comprising about 4 mol % or less $Na_2O$,
a composition comprising any one or more of $B_2O_3$ and ZnO, and
a composition substantially free of $P_2O_5$.

Embodiment 35. A device comprising:
a housing having front, back, and side surfaces;
electrical components that are at least partially inside the housing;
a display at or adjacent to the front surface of the housing; and
a cover substrate disposed over the display, wherein the cover substrate comprises the glass-based article of any one of embodiments 26-34.

Embodiment 36. A glass-based article comprising:
a first surface and a second surface opposing the first surface defining a thickness (t); and
a concentration of a metal oxide that is both non-zero and varies along a thickness range from about 0·t to about 0.3·t;
a surface compressive stress of greater than about 200 MPa or greater; and
a CT region having a maximum CT in the range from about $71.5/\sqrt{(t)}$ to about $100/\sqrt{(t)}$.

Embodiment 37. The glass-based article of embodiment 36, wherein the thickness range of the metal oxide concentration is from about 0·t to about 0.4·t.

Embodiment 38. The glass-based article of embodiment 36 or embodiment 37, wherein the thickness range of the metal oxide concentration is from about 0·t to about 0.45·t.

Embodiment 39. The glass-based article of any one of embodiments 36-38, wherein a monovalent ion of the metal oxide generates a stress along the thickness range.

Embodiment 40. The glass-based article of embodiment 39, wherein the monovalent ion of the metal oxide has a largest ionic diameter of all of the monovalent ions of the metal oxides in the glass-based substrate.

Embodiment 41. The glass-based article of any one of embodiments 36-40, wherein the concentration of the metal oxide decreases from the first surface to a value at a point between the first surface and the second surface and increases from the value to the second surface.

Embodiment 42. The glass-based article of any one of embodiments 36-41, wherein, when the glass-based article is fractured, the glass-based article fractures into at least 1 fragment/inch$^2$ up to 40 fragments/inch, wherein the sample size is a 5.08 cm by 5.08 cm (2 inch by 2 inch) square.

Embodiment 43. The glass-based article of any one of embodiments 36-42, wherein the glass-based article comprises a sodium or potassium ion diffusivity of about 450 μm$^2$/hour or greater at about 460° C. and a DOC greater than about 0.15·t, and wherein the surface CS is 1.5 times the maximum CT or greater.

Embodiment 44. The glass-based article of any one of embodiments 36-43, wherein the glass-based article comprises a fracture toughness ($K_{1C}$) of about 0.65 MPa·m$^{1/2}$ or greater.

Embodiment 45. The glass-based article of any one of embodiments 36-44, wherein the surface CS is greater than the maximum CT.

Embodiment 46. The glass-based article of any one of embodiments 36-45, wherein the surface CS of about 300 MPa or greater and a thickness of about 2 millimeters or less.

Embodiment 47. The glass-based article of any one of embodiments 36-46, wherein the concentration of the metal oxide is about 0.05 mol % or greater throughout the thickness.

Embodiment 48. The glass-based article of any one of embodiments 36-47, wherein the concentration of the metal oxide at the first surface is about 1.5 times greater than the concentration of the metal oxides at a depth equal to about 0.5·t.

Embodiment 49. The glass-based article of any one of embodiments 36-48, wherein the total concentration of the metal oxide is in the range from about 1 mol % to about 15 mol %.

Embodiment 50. The glass-based article of any one of embodiments 36-49, further comprising a chemical depth of layer of about 0.4·t or greater.

Embodiment 51. The glass-based article of any one of embodiments 36-50, further comprising a CS layer extending from the first surface to a DOC, wherein the DOC is about 0.1·t or greater.

Embodiment 52. The glass-based article of any one of embodiments 36-51, wherein the CT region comprises the metal oxide.

Embodiment 53. The glass-based article of any one of embodiments 36-52, wherein the ratio of maximum CT to absolute value of surface CS is in the range from about 0.1 to about 0.8.

Embodiment 54. The glass-based article of any one of embodiments 36-53, wherein t comprises about 3 millimeters or less.

Embodiment 55. The glass-based article of any one of embodiments 36-54, further comprising a Young's modulus of about 70 GPa or greater.

Embodiment 56. The glass-based article of any one of embodiments 36-55, further comprising a liquidus viscosity of less than about 100 kP.

Embodiment 57. The glass-based article of any one of embodiments 36-56, further comprising any one or more of:
a composition comprising a combined amount of $Al_2O_3$ and $Na_2O$ of about 17 mol % or less,
a composition comprising about 4 mol % or less $Na_2O$,
a composition comprising any one or more of $B_2O_3$ and ZnO, and
a composition substantially free of $P_2O_5$.

Embodiment 58. A device comprising:
a housing having front, back, and side surfaces;
electrical components that are at least partially inside the housing;
a display at or adjacent to the front surface of the housing; and
a cover substrate disposed over the display, wherein the cover substrate comprises the glass-based article of any one of embodiments 36-57.

Embodiment 59. A glass-based article comprising:
a first surface and a second surface opposing the first surface defining a thickness (t); and
a metal oxide that forms a concentration gradient,
wherein the concentration of the metal oxide decreases from the first surface to a value at a point between the first surface and the second surface and increases from the value to the second surface,
wherein the concentration of the metal oxide at the point is non-zero, and
wherein the glass-based article comprises a stored tensile energy of about greater than 0 J/m² to less than 20 J/m² and a Young's modulus of about 70 GPa or greater.

Embodiment 60. The glass-based article of embodiment 59, further comprising a surface CS of about 300 MPa or greater.

Embodiment 61. The glass-based article of embodiment 59 or embodiment 60, wherein the concentration of the metal oxide is about 0.05 mol % or greater throughout the thickness.

Embodiment 62. The glass-based article of any one of embodiments 59-61, wherein the concentration of the metal oxide at the first surface is about 1.5 times greater than the concentration of the metal oxides at a depth equal to about 0.5·t.

Embodiment 63. The glass-based article of any one of embodiments 59-62, wherein the total concentration of the metal oxide is in the range from about 1 mol % to about 15 mol %.

Embodiment 64. The glass-based article of any one of embodiments 59-63, wherein the metal oxide comprises any one or more of $Li_2O$, $Na_2O$, $K_2O$, $Rb_2O$, and $Cs_2O$.

Embodiment 65. The glass-based article of any one of embodiments 59-64, further comprising a CS layer extending from the first surface to a DOC, wherein the DOC is about 0.1·t or greater.

Embodiment 66. The glass-based article of any one of embodiments 59-65, further comprising a CT region, wherein the CT region comprises the metal oxide concentration gradient.

Embodiment 67. The glass-based article of embodiment 66, wherein the CT region comprises a maximum CT and the ratio of maximum CT to absolute values of surface CS is in the range from about 0.1 to about 0.8.

Embodiment 68. The glass-based article of any one of embodiments 59-67, wherein t comprises about 3 millimeters or less.

Embodiment 69. The glass-based article of embodiment 67, wherein the maximum CT is in the range from about $71.5/\sqrt{(t)}$ to about $100/\sqrt{(t)}$.

Embodiment 70. The glass-based article of any one of embodiments 59-69, further comprising a liquidus viscosity of less than about 100 kP.

Embodiment 71. The glass-based article of any one of embodiments 59-70, further comprising any one or more of:
a composition comprising a combined amount of $Al_2O_3$ and $Na_2O$ of about 17 mol % or less,
a composition comprising about 4 mol % or less $Na_2O$,
a composition comprising any one or more of $B_2O_3$ and ZnO, and
a composition substantially free of $P_2O_5$.

Embodiment 72. A device comprising:
a housing having front, back, and side surfaces;
electrical components that are at least partially inside the housing;
a display at or adjacent to the front surface of the housing; and
a cover substrate disposed over the display, wherein the cover substrate comprises the glass-based article of any one of embodiments 59-71.

Embodiment 73. A glass-based article comprising:
a first surface and a second surface opposing the first surface defining a thickness (t) of about 3 millimeters or less; and
a stress profile extending along the thickness,
wherein the stress profile at all points between a thickness range from about 0t up to 0.3t and from greater than 0.7t, comprise a tangent with a slope having an absolute value of greater than about 0.1 MPa/micrometer, wherein the stress profile comprises a maximum CS, a DOC and a maximum CT, wherein the ratio of maximum CT to absolute value of maximum CS is in the range from about 0.01 to about 0.2 and wherein the DOC is about 0.1·t or greater, and wherein the glass-based article comprises a stored tensile energy of about greater than 0 J/m$^2$ to less than 20 J/m$^2$ and a Young's modulus of about 70 GPa or greater.

Embodiment 74. The glass-based article of embodiment 73, further comprising a non-zero concentration of a metal oxide that continuously varies along the entire thickness.

Embodiment 75. The glass-based article of embodiment 73 or embodiment 74, further comprising a non-zero concentration of a metal oxide that continuously varies along thickness segments of less than about 10 micrometers.

Embodiment 76. The glass-based article of any one of embodiments 73-75, wherein the maximum CS comprises about 300 MPa or greater.

Embodiment 77. The glass-based article of any one of embodiments 73-76, further comprising a chemical depth of layer of about 0.4·t or greater.

Embodiment 78. The glass-based article of any one of embodiments 73-77, further comprising a CT region, wherein the CT region comprises a metal oxide concentration gradient.

Embodiment 79. The glass-based article of any one of embodiments 73-78, wherein t comprises about 3 millimeters or less.

Embodiment 80. The glass-based article of any one of embodiments 73-79, wherein the maximum CT is greater than or equal to 71.5/√(t).

Embodiment 81. The glass-based article of any one of embodiments 73-80 further comprising a liquidus viscosity of less than about 100 kP.

Embodiment 82. The glass-based article of any one of embodiments 73-81, further comprising any one or more of:
a composition comprising a combined amount of $Al_2O_3$ and $Na_2O$ of about 17 mol % or less,
a composition comprising about 4 mol % or less $Na_2O$,
a composition comprising any one or more of $B_2O_3$ and ZnO, and
a composition substantially free of $P_2O_5$.

Embodiment 83. A device comprising:
a housing having front, back, and side surfaces;
electrical components that are at least partially inside the housing;
a display at or adjacent to the front surface of the housing; and
a cover substrate disposed over the display, wherein the cover substrate comprises the glass-based article of any one of embodiments 73-82.

Embodiment 84. A glass-based article comprising:
a stress profile including a CS region and a CT region, wherein the CT region is approximated by the equation Stress(x)=MaxT−(((CT$_n$−(n+1))/0.5")·|(x/t)−0.5|$^n$),
wherein MaxT is a maximum tension value, CT$_n$ is less than or equal to MaxT and provided as a positive value in units of MPa, x is position along the thickness (t) in micrometers, and n is between 1.5 and 5.

Embodiment 85. The glass-based article of embodiment 84, wherein the CT region comprises a maximum CT value in the range from about 50 MPa to about 250 MPa and the maximum CT value is at a depth in the range from about 0.4t to about 0.6t.

Embodiment 86. The glass-based article of embodiment 84 or embodiment 85, wherein, from a thickness in the range from about 0t to about 0.1t microns, the stress profile comprises a slope in the range from about 20 MPa/microns to about 200 MPa/microns.

Embodiment 87. The glass-based article of any one of embodiments 84-86, wherein the stress profile is approximated by a plurality of error functions as measured from 0.5t to the surface.

Embodiment 88. A use of a glass substrate in a strengthened glass-based article, the glass substrate comprising (in mol %):
$SiO_2$ in an amount in the range from about 68 to about 75;
$Al_2O_3$ in an amount in the range from about 10 to about 15;
$B_2O_3$ in an amount in the range from about 0.5 to about 5;
$Li_2O$ in an amount in the range from about 2 to about 10;
$Na_2O$ in an amount in the range from about 0 to about 6;
MgO in an amount in the range from about 1 to about 4;
ZnO in an amount in the range from about 0 to about 3; and
CaO in an amount in the range from about 0 to about 5,
wherein the glass substrate is ion-exchangeable and is amorphous,
wherein the glass substrate exhibits any one or more of:
a ratio of $Li_2O$ to $R_2O$ in the range from about 0.45 to about 1;
a difference between a total amount of $R_2O$ to the amount of $Al_2O_3$ in the range from about −5 to about 0;
a difference between a total amount of $R_xO$ (in mol %) and the amount of $Al_2O_3$ in the range from about 0 to about 3; and
a ratio of the amount of MgO (in mol %) to a total amount of RO (in mol %) in the range from about 0 to about 1, and
wherein the glass substrate is substantially free of nucleating agents.

Embodiment 89. A glass substrate comprising a composition including, in mol %,
$SiO_2$ in an amount in the range from about 68 to about 75;
$Al_2O_3$ in an amount in the range from about 10 to about 15;
$B_2O_3$ in an amount in the range from about 0.5 to about 5;
$Li_2O$ in an amount in the range from about 2 to about 10;
$Na_2O$ in an amount in the range from about 0 to about 6;
MgO in an amount in the range from about 1 to about 4;
ZnO in an amount in the range from about 0 to about 3; and
CaO in an amount in the range from about 0 to about 5,
wherein the glass substrate is ion-exchangeable and is amorphous,
wherein the glass substrate exhibits any one or more of:
a ratio of $Li_2O$ to $R_2O$ in the range from about 0.45 to about 1;
a difference between a total amount of $R_2O$ to the amount of $Al_2O_3$ in the range from about −5 to about 0;
a difference between a total amount of $R_xO$ (in mol %) and the amount of $Al_2O_3$ in the range from about 0 to about 3; and
a ratio of the amount of MgO (in mol %) to a total amount of RO (in mol %) in the range from about 0 to about 1, and
wherein the glass substrate is substantially free of nucleating agents.

Embodiment 90. A glass substrate comprising a composition including, in mol %,
$SiO_2$ in an amount in the range from about 68 to about 75;
$Al_2O_3$ in an amount in the range from about 10 to about 15;
$B_2O_3$ in an amount in the range from about 0.5 to about 5;
$Li_2O$ in an amount in the range from about 2 to about 10;
$Na_2O$ in an amount in the range from about 0 to about 6;
MgO in an amount in the range from about 1 to about 4;
ZnO in an amount in the range from about 0 to about 3; and
CaO in an amount in the range from about 0 to about 5,
wherein the glass substrate is amorphous and is strengthened,
wherein the $Na_2O$ concentration varies, and the glass substrate is substantially free of nucleating agents.

Embodiment 91. The glass substrate of embodiment 90, further exhibiting any one or more of
a ratio of $Li_2O$ to $R_2O$ in the range from about 0.45 to about 1;
a difference between a total amount of $R_2O$ to the amount of $Al_2O_3$ in the range from about −5 to about 0;
a difference between a total amount of $R_xO$ (in mol %) and the amount of $Al_2O_3$ in the range from about 0 to about 3; and
a ratio of the amount of MgO (in mol %) to a total amount of RO (in mol %) in the range from about 0 to about 1.

Embodiment 92. The glass-based article of any one of embodiments 1-88, the Knoop Scratch Threshold of at least one of the first surface and second surface is greater than 7N.

Embodiment 93. The glass-based article of any one of embodiments 1-88, and 92, the Knoop Scratch Threshold of the at least one of the first surface and second surface is less than 14N.

Embodiment 94. The glass-based article of any one of embodiments 1-88, and 92-93, wherein the strengthened glass-based substrate has one of: (i) at least a 60% survival rate; (ii) at least an 80% survival rate; when subjected to an inverted ball drop test with a 4.2 g stainless steel ball having a diameter of 10 mm from a height of one of: (i) about 80 cm; (ii) about 88 cm; (iii) about 90 cm; and (iv) about 95 cm, onto a 30 grit sandpaper positioned above the surface of the glass so there is a 100 μm air gap between the sandpaper and the surface of the glass, wherein the survival rate is based on testing at least 5 samples.

Embodiment 95. The glass-based article of any one of embodiments 1-88, and 92-94, wherein the strengthened glass-based substrate has an average fracture height of one of: (i) more than 70 cm; (ii) more than 75 cm; (iii) more than 80 cm; and (iv) more than 85 cm, when subjected to an inverted ball drop test with a 4.2 g stainless steel ball having a diameter of 10 mm onto a 30 grit sandpaper positioned above the surface of the glass so there is a 100 μm air gap between the sandpaper and the surface of the glass, wherein the survival rate is based on testing at least 5 samples.

What is claimed is:
1. A glass-based article comprising:
greater than or equal to 40 mol % and less than or equal to 80 mol % $SiO_2$;
greater than or equal to 0 mol % and less than or equal to 6 mol % $Na_2O$;
less than 2 mol % $K_2O$;
a first surface and a second surface opposing the first surface thereby defining a thickness (t) of the glass-based article;
a ratio of $Li_2O$ (mol %) to $R_2O$ (mol %) in the glass-based article is greater than or equal to 0.7 and less than or equal to 1.0, wherein $R_2O$ is the sum of $Li_2O$, $Na_2O$, and $K_2O$ in the glass-based article;
a stress profile comprises a surface compressive stress (CS) and a maximum central tension (CT), wherein:
the maximum CT is greater than or equal to 80 MPa and less than or equal to 95 MPa;
the maximum CT is positioned within the glass-based article at a range from greater than or equal to 0.4·t and less than or equal to 0.6·t;
the surface CS is greater than or equal to 200 MPa; and
a depth of compression (DOC) is from greater than or equal to 0.14·t and less than or equal to 0.25·t, and
the glass-based article is a glass-ceramic comprising an amorphous phase and a crystalline phase.

2. The glass-based article of claim 1, wherein the glass-based article is strengthened by an ion exchange process resulting in the stress profile.

3. The glass-based article of claim 1, wherein the glass-based article comprises less than or equal to 4 mol % $Na_2O$.

4. The glass-based article of claim 1, wherein the glass-based article comprises less than 1 mol % $K_2O$.

5. The glass-based article of claim 1, wherein the glass-based article comprises a ratio of CT to CS in a range from 0.1 to 0.8.

6. The glass-based article of claim 1, wherein the glass-based article comprises a thickness of about 1 mm or less.

7. The glass-based article of claim 1, wherein the glass-based article comprises a surface CS of greater than or equal to 200 MPa and less than or equal to 400 MPa.

8. The glass-based article of claim 1, wherein the glass-based article comprises a surface CS of greater than or equal to 200 MPa and less than or equal to 300 MPa.

9. The glass-based article of claim 1, wherein the glass-based article comprises greater than or equal to 0 mol % and less than or equal to 5 mol % $ZrO_2$.

10. The glass-based article of claim 1, where the glass-based article comprises greater than or equal to 67 mol % and less than or equal to 75 mol % $SiO_2$.

11. A glass-based article comprising:
an amorphous phase and a crystalline phase;
a first surface and a second surface opposing the first surface thereby defining a thickness (t) of the glass-based article;
a stress profile comprising a surface compressive stress (CS) and a maximum central tension (CT), wherein:
the maximum CT is greater than or equal to 80 MPa and less than or equal to 95 MPa;
the maximum CT is positioned within the glass-based article at a range from greater than or equal to 0.4·t and less than or equal to 0.6·t;
the surface CS is greater than or equal to 200 MPa; and
a depth of compression (DOC) is from greater than or equal to 0.14·t and less than or equal to 0.25·t.

12. The glass-based article of claim 11, wherein the glass-based article comprises less than or equal to 1 mol % $Na_2O$.

13. The glass-based article of claim 11, wherein the glass-based article comprises less than 1 mol % $K_2O$.

14. The glass-based article of claim 11, wherein the glass based article comprises a ratio of $Li_2O$ (mol %) to $R_2O$ (mol %) in the glass-based article is greater than or equal to 0.7 and less than or equal to 1.0, wherein $R_2O$ is the sum of $Li_2O$, $Na_2O$, and $K_2O$ in the glass-based article.

15. The glass-based article of claim 11, wherein the glass-based article is strengthened by an ion exchange process resulting in the stress profile.

16. The glass-based article of claim 11, wherein the glass-based article comprises a ratio of CT to CS in a range from 0.11 to 0.8.

17. The glass-based article of claim 11, wherein the glass-based article comprises a thickness of about 1 mm or less.

18. The glass-based article of claim 11, wherein the glass-based article comprises a surface CS of greater than or equal to 200 MPa and less than or equal to 400 MPa.

19. The glass-based article of claim 11, wherein the glass-based article comprises a surface CS of greater than or equal to 200 MPa and less than or equal to 300 MPa.

20. The glass-based article of claim 11, where the glass-based article comprises greater than or equal to 40 mol % and less than or equal to 80 mol % $SiO_2$.

* * * * *

UNITED STATES PATENT AND TRADEMARK OFFICE
CERTIFICATE OF CORRECTION

PATENT NO. : 11,174,197 B2
APPLICATION NO. : 17/025592
DATED : November 16, 2021
INVENTOR(S) : Matthew John Dejneka et al.

It is certified that error appears in the above-identified patent and that said Letters Patent is hereby corrected as shown below:

In the Specification

In Column 7, Line 13, delete "Ser. No. 10/570,059" and insert -- No. 10,570,059 --, therefor.

In Column 9, Line 16, delete "Ser. No. 10/017,417" and insert -- No. 10,017,417 --, therefor.

Signed and Sealed this
Tenth Day of May, 2022

Katherine Kelly Vidal
Director of the United States Patent and Trademark Office